(12) United States Patent
Harjee et al.

(10) Patent No.: US 11,489,146 B2
(45) Date of Patent: Nov. 1, 2022

(54) TECHNIQUES FOR PRINT INK DROPLET MEASUREMENT AND CONTROL TO DEPOSIT FLUIDS WITHIN PRECISE TOLERANCES

(71) Applicant: Kateeva, Inc., Newark, CA (US)

(72) Inventors: Nahid Harjee, Sunnyvale, CA (US); Lucas D. Barkley, Lexington, KY (US); Christopher R. Hauf, Belmont, CA (US); Eliyahu Vronsky, Los Altos, CA (US); Conor F. Madigan, San Francisco, CA (US); Gregory Lewis, Menlo Park, CA (US); Alexander Sou-Kang Ko, Santa Clara, CA (US); Valerie Gassend, East Palo Alto, CA (US)

(73) Assignee: Kateeva, Inc., Newark, CA (US)

( * ) Notice: Subject to any disclaimer, the term of this patent is extended or adjusted under 35 U.S.C. 154(b) by 96 days.

(21) Appl. No.: 17/248,858

(22) Filed: Feb. 10, 2021

(65) Prior Publication Data

US 2021/0167339 A1 Jun. 3, 2021

Related U.S. Application Data

(63) Continuation of application No. 16/536,654, filed on Aug. 9, 2019, now Pat. No. 10,950,826, which is a (Continued)

(30) Foreign Application Priority Data

Dec. 26, 2013 (TW) .................................. 102148330

(51) Int. Cl.
*B41J 2/045* (2006.01)
*H01L 51/56* (2006.01)
(Continued)

(52) U.S. Cl.
CPC ................ *H01L 51/56* (2013.01); *B41J 2/01* (2013.01); *B41J 2/0456* (2013.01);
(Continued)

(58) Field of Classification Search
CPC ........ B41J 2/01; B41J 2/0456; B41J 2/04581; B41J 2/04586; B41J 2/04588;
(Continued)

(56) References Cited

U.S. PATENT DOCUMENTS 4,922,270 A 5/1990 Cobbs et al.
4,963,882 A 10/1990 Hickman
(Continued)

FOREIGN PATENT DOCUMENTS

CN 1258250 A 6/2000
CN 1311100 A 9/2001
(Continued)

OTHER PUBLICATIONS

Notice of Allowance dated Sep. 15, 2021 in U.S. Appl. No. 16/947,880.
(Continued)

*Primary Examiner* — Sharon Polk
(74) *Attorney, Agent, or Firm* — Hauptman Ham, LLP

(57) ABSTRACT

An ink printing process employs per-nozzle droplet volume measurement and processing software that plans droplet combinations to reach specific aggregate ink fills per target region, guaranteeing compliance with minimum and maximum ink fills set by specification. In various embodiments, different droplet combinations are produced through different printhead/substrate scan offsets, offsets between printheads, the use of different nozzle drive waveforms, and/or other techniques. These combinations can be based on repeated, rapid droplet measurements that develop understandings for each nozzle of means and spreads for expected (Continued)

droplet volume, velocity and trajectory, with combinations of droplets being planned based on these statistical parameters. Optionally, random fill variation can be introduced so as to mitigate Mura effects in a finished display device. The disclosed techniques have many possible applications.

20 Claims, 26 Drawing Sheets

Related U.S. Application Data continuation of application No. 15/716,753, filed on Sep. 27, 2017, now Pat. No. 10,784,470, which is a continuation of application No. 15/135,380, filed on Apr. 21, 2016, now Pat. No. 9,802,403, which is a continuation of application No. 14/340,403, filed on Jul. 24, 2014, now Pat. No. 9,352,561, which is a continuation-in-part of application No. PCT/US2014/035193, filed on Apr. 23, 2014, and a continuation-in-part of application No. 14/162,525, filed on Jan. 23, 2014, now Pat. No. 9,010,899, which is a continuation of application No. PCT/US2013/077720, filed on Dec. 24, 2013.

(60) Provisional application No. 61/950,820, filed on Mar. 10, 2014, provisional application No. 61/920,715, filed on Dec. 24, 2013, provisional application No. 61/898,769, filed on Nov. 1, 2013, provisional application No. 61/866,031, filed on Aug. 14, 2013, provisional application No. 61/857,298, filed on Jul. 23, 2013, provisional application No. 61/842,351, filed on Jul. 2, 2013, provisional application No. 61/822,855, filed on May 13, 2013, provisional application No. 61/816,696, filed on Apr. 26, 2013, provisional application No. 61/746,545, filed on Dec. 27, 2012.

(51) Int. Cl.
  *B41J 2/205* (2006.01)
  *B41J 2/01* (2006.01)
  *H01L 51/00* (2006.01)

(52) U.S. Cl.
  CPC ....... *B41J 2/04581* (2013.01); *B41J 2/04586* (2013.01); *B41J 2/04588* (2013.01); *B41J 2/04593* (2013.01); *B41J 2/2054* (2013.01); *H01L 51/0005* (2013.01); *H01L 51/0012* (2013.01); *H01L 51/0029* (2013.01)

(58) Field of Classification Search
  CPC ..... B41J 2/04593; B41J 2/2054; H01L 51/56; H01L 51/0005; H01L 51/0012; H01L 51/0029
  See application file for complete search history.

(56) References Cited

U.S. PATENT DOCUMENTS

| | | |
|---|---|---|
| 5,317,169 A | 5/1994 | Nakano et al. |
| 5,345,673 A | 9/1994 | Saitoh |
| 5,434,430 A | 7/1995 | Stewart |
| 5,469,276 A | 11/1995 | Shu |
| 5,555,006 A | 9/1996 | Cleveland et al. |
| 5,561,449 A | 10/1996 | Raskin et al. |
| 5,681,757 A | 10/1997 | Hayes |
| 5,707,684 A | 1/1998 | Hayes et al. |
| 5,711,989 A | 1/1998 | Ciardella et al. |
| 5,779,971 A | 7/1998 | Pan et al. |
| 5,847,720 A | 12/1998 | Dunand |
| 5,895,692 A | 4/1999 | Shirasaki et al. |
| 5,906,682 A | 5/1999 | Bouras et al. |
| 5,932,012 A | 8/1999 | Ishida et al. |
| 6,013,982 A | 1/2000 | Thompson et al. |
| 6,019,454 A | 2/2000 | Serra et al. |
| 6,066,357 A | 5/2000 | Tang et al. |
| 6,149,263 A | 11/2000 | Nakano |
| 6,164,746 A | 12/2000 | Akahira et al. |
| 6,228,228 B1 | 5/2001 | Singh et al. |
| 6,247,787 B1 | 6/2001 | Giere et al. |
| 6,283,572 B1 | 9/2001 | Kumar et al. |
| 6,328,395 B1 | 12/2001 | Kitahara et al. |
| 6,329,108 B1 | 12/2001 | Fujiike et al. |
| 6,347,857 B1 | 2/2002 | Purcell et al. |
| 6,352,331 B1 | 3/2002 | Armijo et al. |
| 6,354,686 B1 | 3/2002 | Tanaka et al. |
| 6,401,001 B1 | 6/2002 | Jang et al. |
| 6,406,114 B1 | 6/2002 | Shioya |
| 6,481,816 B1 | 11/2002 | Oyen |
| 6,495,917 B1 | 12/2002 | Ellis-Monaghan et al. |
| 6,517,176 B1 | 2/2003 | Chaug |
| 6,565,177 B1 | 5/2003 | Corrigan |
| 6,629,741 B1 | 10/2003 | Okuda et al. |
| 6,736,484 B2 | 5/2004 | Nakamura |
| 6,739,686 B2 | 5/2004 | Imai |
| 6,754,551 B1 | 6/2004 | Zohar et al. |
| 6,783,210 B2 | 8/2004 | Takahashi et al. |
| 6,793,324 B2 | 9/2004 | Hosono et al. |
| 6,824,238 B2 | 11/2004 | Chang |
| 6,837,568 B2 | 1/2005 | Nakamura |
| 6,863,961 B2 | 3/2005 | Miyashita et al. |
| 6,910,762 B2 | 6/2005 | Nakamura |
| 6,960,036 B1 | 11/2005 | Fujita et al. |
| 6,972,261 B2 | 12/2005 | Wong et al. |
| 7,072,522 B2 | 7/2006 | Miyake et al. |
| 7,073,727 B2 | 7/2006 | Usuda |
| 7,093,924 B2 | 8/2006 | Nakamura |
| 7,101,013 B2 | 9/2006 | Nakamura |
| 7,111,755 B2 | 9/2006 | Koyama et al. |
| 7,121,642 B2 | 10/2006 | Stoessel et al. |
| 7,138,304 B2 | 11/2006 | Hirai |
| 7,188,919 B2 | 3/2007 | Satomura |
| 7,204,573 B2 | 4/2007 | Koyama |
| 7,207,647 B2 | 4/2007 | Silverbrook |
| 7,216,950 B2 | 5/2007 | Eguchi et al. |
| 7,217,438 B2 | 5/2007 | Newsome et al. |
| 7,223,309 B2 | 5/2007 | Takahashi et al. |
| 7,249,829 B2 | 7/2007 | Hawkins et al. |
| 7,258,408 B2 | 8/2007 | Usuda |
| 7,270,712 B2 | 9/2007 | Edwards et al. |
| 7,278,847 B2 | 10/2007 | Silverbrook |
| 7,281,778 B2 | 10/2007 | Hasenbein et al. |
| 7,381,449 B2 | 6/2008 | Miyasaka |
| 7,449,070 B2 | 11/2008 | Edwards et al. |
| 7,461,912 B2 | 12/2008 | Kamiyama et al. |
| 7,503,637 B2 | 3/2009 | Komatsu et al. |
| 7,513,595 B2 | 4/2009 | Nakamura |
| 7,517,549 B2 | 4/2009 | Hayashi |
| 7,554,697 B2 | 6/2009 | Mizutani et al. |
| 7,569,129 B2 | 8/2009 | Pamula et al. |
| 7,600,840 B2 | 10/2009 | Kim et al. |
| 7,611,754 B2 | 11/2009 | Edwards et al. |
| 7,612,917 B2 | 11/2009 | Nagaishi et al. |
| 7,616,340 B2 | 11/2009 | Yamazaki |
| 7,658,465 B2 | 2/2010 | Newsome et al. |
| 7,677,689 B2 | 3/2010 | Kim et al. |
| 7,699,428 B2 | 4/2010 | Kato |
| 7,757,632 B2 | 7/2010 | Edwards et al. |
| 7,775,179 B2 | 8/2010 | Kim et al. |
| 7,815,965 B2 | 10/2010 | Edwards et al. |
| 7,839,080 B2 | 11/2010 | Kim et al. |
| 7,850,267 B2 | 12/2010 | Usuda |
| 7,857,242 B2 | 12/2010 | Huang |
| 7,857,424 B2 | 12/2010 | Murayama et al. |
| 7,887,156 B2 | 2/2011 | Middleton et al. |
| 7,891,752 B2 | 2/2011 | Liu et al. |
| 7,901,026 B2 | 3/2011 | Albertalli et al. |
| 7,909,427 B2 | 3/2011 | Kim et al. |
| 7,914,104 B2 | 3/2011 | Silverbrook |

(56) References Cited

U.S. PATENT DOCUMENTS

| | | |
|---|---|---|
| 7,920,934 B2 | 4/2011 | Aruga |
| 7,972,875 B2 | 7/2011 | Rogers et al. |
| 8,025,353 B2 | 9/2011 | Hasenbein |
| 8,025,917 B2 | 9/2011 | Kinoshita |
| 8,033,634 B2 | 10/2011 | Komatsu et al. |
| 8,066,345 B2 | 11/2011 | Komori et al. |
| 8,119,186 B2 | 2/2012 | Sakai |
| 8,123,324 B2 | 2/2012 | Komori et al. |
| 8,124,190 B2 | 2/2012 | Miyasaka |
| 8,186,791 B2 | 5/2012 | Yamashita |
| 8,235,487 B2 | 8/2012 | Madigan et al. |
| 8,248,656 B2 | 8/2012 | Lin et al. |
| 8,310,721 B2 | 11/2012 | Saita et al. |
| 8,323,724 B2 | 12/2012 | Shinohara |
| 8,342,623 B2 | 1/2013 | Hong et al. |
| 8,342,636 B2 | 1/2013 | Nakano et al. |
| 8,343,869 B2 | 1/2013 | Gothait et al. |
| 8,382,232 B2 | 2/2013 | Silverbrook |
| 8,383,202 B2 | 2/2013 | Somekh et al. |
| 8,413,602 B2 | 4/2013 | Nakamura |
| 8,435,093 B2 | 5/2013 | Takeuchi |
| 8,449,058 B2 | 5/2013 | Hasenbein |
| 8,459,768 B2 | 6/2013 | Hasenbein et al. |
| 8,466,484 B2 | 6/2013 | Slyke et al. |
| 8,579,408 B2 | 11/2013 | Kelly et al. |
| 8,668,307 B2 | 3/2014 | Lewartowski et al. |
| 8,784,938 B2 | 7/2014 | Suzuki et al. |
| 8,995,022 B1 | 3/2015 | Vronsky et al. |
| 9,010,899 B2 | 4/2015 | Harjee et al. |
| 9,139,747 B2 | 9/2015 | Kamada |
| 9,174,433 B2 | 11/2015 | Somekh et al. |
| 9,224,952 B2 | 12/2015 | Harjee et al. |
| 9,352,561 B2 | 5/2016 | Harjee et al. |
| 9,496,519 B2 | 11/2016 | Vronsky et al. |
| 9,527,276 B2 | 12/2016 | Mala et al. |
| 9,537,119 B2 | 1/2017 | Harjee et al. |
| 9,700,908 B2 | 7/2017 | Baker et al. |
| 9,755,186 B2 | 9/2017 | Vronsky et al. |
| 9,802,403 B2 | 10/2017 | Harjee et al. |
| 9,832,428 B2 | 11/2017 | Hauf et al. |
| 9,873,273 B2 | 1/2018 | Mauck et al. |
| 2001/0017703 A1 | 8/2001 | Szumla |
| 2001/0022596 A1 | 9/2001 | Korol |
| 2002/0109862 A1 | 8/2002 | Hayama |
| 2002/0180816 A1 | 12/2002 | Haflinger |
| 2003/0008429 A1 | 1/2003 | Yamazaki et al. |
| 2003/0040061 A1 | 2/2003 | Baker et al. |
| 2003/0087026 A1 | 5/2003 | Dijksman et al. |
| 2003/0101421 A1 | 5/2003 | Satoh |
| 2003/0184613 A1 | 10/2003 | Nakamura et al. |
| 2003/0197747 A1 | 10/2003 | Hattori |
| 2004/0004643 A1 | 1/2004 | Satomura |
| 2004/0009309 A1 | 1/2004 | Raksha et al. |
| 2004/0027405 A1 | 2/2004 | Stoessel et al. |
| 2004/0169691 A1 | 9/2004 | Newsome et al. |
| 2004/0170762 A1 | 9/2004 | Newsome et al. |
| 2004/0223014 A1 | 11/2004 | Barr et al. |
| 2005/0009213 A1 | 1/2005 | Wang et al. |
| 2005/0030612 A1 | 2/2005 | Yamazaki et al. |
| 2005/0053719 A1 | 3/2005 | Ishida |
| 2005/0078133 A1 | 4/2005 | Molinet et al. |
| 2005/0140709 A1 | 6/2005 | Sekiya |
| 2005/0156176 A1 | 7/2005 | Gupta et al. |
| 2005/0200684 A1 | 9/2005 | Sakurada et al. |
| 2005/0247340 A1 | 11/2005 | Zeira |
| 2006/0029247 A1 | 2/2006 | Chan |
| 2006/0046347 A1 | 3/2006 | Wood et al. |
| 2006/0093751 A1 | 5/2006 | White et al. |
| 2006/0126121 A1 | 6/2006 | Chung |
| 2006/0132529 A1 | 6/2006 | Verhoest et al. |
| 2006/0209347 A1 | 9/2006 | Nagaishi et al. |
| 2006/0214976 A1 | 9/2006 | Iwao et al. |
| 2007/0070099 A1 | 3/2007 | Beer et al. |
| 2007/0109342 A1 | 5/2007 | Kato |
| 2007/0109606 A1 | 5/2007 | Nagae |
| 2007/0110893 A1 | 5/2007 | Lennon et al. |
| 2007/0176173 A1 | 8/2007 | Ramakrishnan et al. |
| 2008/0024532 A1 | 1/2008 | Kim |
| 2008/0049231 A1 | 2/2008 | Bachalo et al. |
| 2008/0057260 A1 | 3/2008 | Buchhauser et al. |
| 2008/0117247 A1 | 5/2008 | Miller et al. |
| 2008/0150419 A1 | 6/2008 | Kang |
| 2008/0158278 A1 | 7/2008 | Inoue |
| 2008/0180473 A1 | 7/2008 | Gardner et al. |
| 2008/0227663 A1 | 9/2008 | Tisone et al. |
| 2008/0278534 A1 | 11/2008 | Kim et al. |
| 2008/0308037 A1 | 12/2008 | Bulovic et al. |
| 2008/0309698 A1 | 12/2008 | Nakano et al. |
| 2008/0317941 A1 | 12/2008 | Hanaoka |
| 2009/0096823 A1 | 4/2009 | Watt et al. |
| 2009/0096825 A1 | 4/2009 | Takahashi et al. |
| 2009/0117261 A1 | 5/2009 | Sakai |
| 2009/0184990 A1 | 7/2009 | Shang et al. |
| 2009/0191342 A1 | 7/2009 | Chu et al. |
| 2009/0274833 A1 | 11/2009 | Li et al. |
| 2009/0322828 A1 | 12/2009 | Kim et al. |
| 2010/0020118 A1 | 1/2010 | Xie |
| 2010/0024725 A1 | 2/2010 | Lennon et al. |
| 2010/0066779 A1 | 3/2010 | Gothait et al. |
| 2010/0090582 A1 | 4/2010 | Okishiro et al. |
| 2010/0166950 A1 | 7/2010 | Nieminen |
| 2010/0184244 A1 | 7/2010 | Hunt |
| 2010/0231672 A1 | 9/2010 | Joyce et al. |
| 2010/0311298 A1 | 12/2010 | Suzuki et al. |
| 2011/0032297 A1 | 2/2011 | Mitsuzawa |
| 2011/0084290 A1 | 4/2011 | Nakamura et al. |
| 2011/0087718 A1 | 4/2011 | Srinivasan et al. |
| 2011/0121021 A1 | 5/2011 | Dudenhoefer et al. |
| 2011/0222126 A1 | 9/2011 | Asai et al. |
| 2011/0267390 A1 | 11/2011 | Bulovic et al. |
| 2011/0279544 A1 | 11/2011 | Dovrat et al. |
| 2012/0056923 A1 | 3/2012 | Vronsky et al. |
| 2012/0058251 A1 | 3/2012 | Yamazaki |
| 2012/0069076 A1 | 3/2012 | Higuchi |
| 2012/0139984 A1 | 6/2012 | Lang |
| 2012/0220497 A1 | 8/2012 | Jacobson et al. |
| 2012/0256981 A1 | 10/2012 | Matsuo |
| 2012/0274648 A1 | 11/2012 | Hwang et al. |
| 2012/0306951 A1 | 12/2012 | Somekh et al. |
| 2012/0308252 A1 | 12/2012 | Shimura |
| 2012/0309252 A1 | 12/2012 | Takeuchi |
| 2013/0026533 A1 | 1/2013 | Lee |
| 2013/0040061 A1 | 2/2013 | Lowrance et al. |
| 2013/0057879 A1 | 3/2013 | Takagi et al. |
| 2013/0120485 A1 | 5/2013 | Kodama et al. |
| 2013/0127030 A1 | 5/2013 | Gong et al. |
| 2013/0168664 A1 | 7/2013 | Crankshaw |
| 2013/0206058 A1 | 8/2013 | Mauck et al. |
| 2013/0252533 A1 | 9/2013 | Mauck et al. |
| 2013/0286073 A1 | 10/2013 | Blessing et al. |
| 2013/0307898 A1 | 11/2013 | Somekh et al. |
| 2014/0055513 A1 | 2/2014 | Usui |
| 2014/0117316 A1 | 5/2014 | Choi |
| 2014/0165864 A1 | 6/2014 | Oppenheim |
| 2014/0184683 A1 | 7/2014 | Harjee et al. |
| 2014/0210886 A1 | 7/2014 | Driggers et al. |
| 2015/0099059 A1 | 4/2015 | Harjee et al. |
| 2015/0171368 A1 | 6/2015 | Vronsky et al. |
| 2015/0221869 A1 | 8/2015 | Harjee et al. |
| 2015/0273869 A1 | 10/2015 | Ide et al. |
| 2015/0298153 A1 | 10/2015 | Baker et al. |
| 2015/0373305 A1 | 12/2015 | Hauf et al. |
| 2016/0133881 A1 | 5/2016 | Harjee et al. |
| 2016/0311219 A1 | 10/2016 | Harjee et al. |
| 2017/0054078 A1 | 2/2017 | Vronsky et al. |
| 2017/0084882 A1 | 3/2017 | Vronsky et al. |
| 2017/0140999 A1 | 5/2017 | Vronsky et al. |
| 2017/0141353 A1 | 5/2017 | Vronsky et al. |
| 2017/0141357 A1 | 5/2017 | Vronsky et al. |
| 2017/0170435 A1 | 6/2017 | Harjee et al. |
| 2017/0210886 A1 | 7/2017 | Ikeda et al. |
| 2017/0259560 A1 | 9/2017 | Sreenivasan et al. |
| 2018/0008995 A1 | 1/2018 | Baker et al. |
| 2018/0061719 A1 | 3/2018 | Vronsky et al. |

(56) References Cited

U.S. PATENT DOCUMENTS

| | | | |
|---|---|---|---|
| 2018/0061720 A1 | 3/2018 | Vronsky et al. | |
| 2018/0083230 A1 | 3/2018 | Harjee et al. | |
| 2018/0146162 A1 | 5/2018 | Hauf et al. | |
| 2019/0074484 A1 | 3/2019 | Harjee et al. | |

FOREIGN PATENT DOCUMENTS

| | | |
|---|---|---|
| CN | 1366007 A | 8/2002 |
| CN | 1430554 A | 7/2003 |
| CN | 1473707 A | 2/2004 |
| CN | 1476973 A | 2/2004 |
| CN | 1503338 A | 6/2004 |
| CN | 1513214 A | 7/2004 |
| CN | 1572497 A | 2/2005 |
| CN | 1607378 A | 4/2005 |
| CN | 1985366 A | 6/2007 |
| CN | 101020386 A | 8/2007 |
| CN | 101024334 A | 8/2007 |
| CN | 101202328 A | 6/2008 |
| CN | 101222026 A | 7/2008 |
| CN | 101326060 A | 12/2008 |
| CN | 101498856 A | 8/2009 |
| CN | 101533894 A | 9/2009 |
| CN | 101544107 A | 9/2009 |
| CN | 101027186 B | 12/2010 |
| CN | 101950771 A | 1/2011 |
| CN | 101256092 B | 2/2011 |
| CN | 102107555 A | 6/2011 |
| CN | 1753600 B | 8/2011 |
| CN | 102189790 A | 9/2011 |
| CN | 101648458 B | 2/2012 |
| CN | 102343712 A | 2/2012 |
| CN | 102555467 A | 7/2012 |
| CN | 101301814 B | 2/2013 |
| CN | 101743125 B | 7/2013 |
| CN | 103241025 A | 8/2013 |
| CN | 103026789 A | 1/2016 |
| CN | 102597133 B | 10/2018 |
| EP | 0976567 A2 | 2/2000 |
| EP | 0902315 B1 | 4/2003 |
| EP | 0880303 B1 | 1/2004 |
| EP | 0887199 B1 | 3/2004 |
| EP | 1211916 B1 | 8/2006 |
| EP | 0863478 B1 | 9/2006 |
| EP | 0863004 B2 | 7/2011 |
| EP | 1874551 B1 | 11/2012 |
| EP | 1376716 B1 | 8/2013 |
| JP | H0578655 A | 3/1993 |
| JP | H06308312 A1 | 11/1994 |
| JP | H07169567 A | 7/1995 |
| JP | H07235378 A | 9/1995 |
| JP | H07294916 A | 11/1995 |
| JP | H10012377 A1 | 6/1998 |
| JP | H10193587 A | 7/1998 |
| JP | 2991270 B2 | 12/1999 |
| JP | 2000062158 A | 2/2000 |
| JP | 3036436 B2 | 4/2000 |
| JP | 2000207543 A | 7/2000 |
| JP | 2000309123 A | 11/2000 |
| JP | 2001038892 A | 2/2001 |
| JP | 2001071476 A | 3/2001 |
| JP | 2001121722 A1 | 5/2001 |
| JP | 2001162840 A1 | 9/2001 |
| JP | 2002205429 A | 7/2002 |
| JP | 2002323615 A1 | 11/2002 |
| JP | 2003014442 A | 1/2003 |
| JP | 2003509256 A | 3/2003 |
| JP | 2003127430 A | 5/2003 |
| JP | 2003161824 A | 6/2003 |
| JP | 2003217840 A | 7/2003 |
| JP | 2003249355 A1 | 9/2003 |
| JP | 2003272847 A | 9/2003 |
| JP | 2003311943 A | 11/2003 |
| JP | 2003338370 A | 11/2003 |
| JP | 2004058627 A | 2/2004 |
| JP | 2004106511 A | 4/2004 |
| JP | 2004148750 A | 5/2004 |
| JP | 2004209412 A | 7/2004 |
| JP | 2004267874 A | 9/2004 |
| JP | 2004295092 A | 10/2004 |
| JP | 2004337709 A | 12/2004 |
| JP | 2005014216 A | 1/2005 |
| JP | 2005502987 A | 1/2005 |
| JP | 2005044613 A | 2/2005 |
| JP | 2005100894 A | 4/2005 |
| JP | 2005131606 A | 5/2005 |
| JP | 2005183184 A | 7/2005 |
| JP | 2005193104 A1 | 7/2005 |
| JP | 3679987 B2 | 8/2005 |
| JP | 2005246248 A | 9/2005 |
| JP | 2005296904 A | 10/2005 |
| JP | 2006021146 A | 1/2006 |
| JP | 2006047803 A | 2/2006 |
| JP | 2006170910 A | 6/2006 |
| JP | 2006212501 A | 8/2006 |
| JP | 2007111914 A | 5/2007 |
| JP | 2007117833 A | 5/2007 |
| JP | 2007207762 A | 8/2007 |
| JP | 2007299725 A | 11/2007 |
| JP | 4027552 B2 | 12/2007 |
| JP | 2008004817 A | 1/2008 |
| JP | 2008233833 A | 10/2008 |
| JP | 2008540118 A | 11/2008 |
| JP | 2008296547 A | 12/2008 |
| JP | 2009093189 A | 4/2009 |
| JP | 2009117141 A | 5/2009 |
| JP | 4273819 B2 | 6/2009 |
| JP | 2002225259 A1 | 8/2009 |
| JP | 2009189954 A | 8/2009 |
| JP | 2009291710 A | 12/2009 |
| JP | 2010005593 A | 1/2010 |
| JP | 2010046944 A | 3/2010 |
| JP | 2010115650 A | 5/2010 |
| JP | 2010204189 A | 9/2010 |
| JP | 2011005453 A | 1/2011 |
| JP | 2011508062 A | 3/2011 |
| JP | 2011255366 A | 12/2011 |
| JP | 2012025983 A | 2/2012 |
| JP | 2012116188 A | 6/2012 |
| JP | 2012160858 A | 8/2012 |
| JP | 2012173504 A | 9/2012 |
| JP | 2012213951 A | 11/2012 |
| JP | 2012218233 A | 11/2012 |
| JP | 2012245671 A | 12/2012 |
| JP | 2013030571 A | 2/2013 |
| JP | 2013052614 A | 3/2013 |
| JP | 2013225671 A | 10/2013 |
| JP | 2014502931 A | 2/2014 |
| JP | H10138475 A1 | 5/2015 |
| JP | 2016510764 A | 4/2016 |
| JP | 2017511904 A | 4/2017 |
| JP | 2017525600 A | 9/2017 |
| JP | 2018160163 A | 10/2018 |
| JP | 6659532 B2 | 3/2020 |
| KR | 1020040067140 A | 7/2004 |
| KR | 20040072383 A | 8/2004 |
| KR | 1020040072811 A | 8/2004 |
| KR | 1020060038439 A | 5/2006 |
| KR | 20070057808 A | 6/2007 |
| KR | 1020080031666 A | 4/2008 |
| KR | 20080102829 A | 11/2008 |
| KR | 20110110275 A | 10/2011 |
| KR | 1020120099401 A | 9/2012 |
| KR | 20120132360 A | 12/2012 |
| TW | 200426036 A | 12/2004 |
| TW | 200727994 A | 8/2007 |
| TW | 200950975 A | 12/2009 |
| TW | 201426566 A | 7/2014 |
| TW | 1548530 B | 9/2016 |
| WO | 1993026116 A2 | 12/1993 |
| WO | 2007138818 A1 | 12/2007 |
| WO | 2008059276 A2 | 5/2008 |
| WO | 2008131383 A1 | 10/2008 |
| WO | 2010014061 A1 | 2/2010 |

(56) References Cited

FOREIGN PATENT DOCUMENTS

| WO | 2010090080 A1 | 8/2010 |
|---|---|---|
| WO | 2012093086 A1 | 7/2012 |
| WO | 2012164628 A1 | 12/2012 |
| WO | 2013088430 A1 | 6/2013 |
| WO | 2013099276 A1 | 7/2013 |

OTHER PUBLICATIONS

Notice of Final Rejection dated Jul. 21, 2021 in KR Patent Application No. 10-2019-7036003.
Notice of Allowance dated Oct. 13, 2021 for U.S. Appl. No. 16/356,430.
Official Letter dated Aug. 25, 2021 to TW Patent Application No. 110106747.
Office Action dated Apr. 6, 2016 to CN Patent Application No. 201380073929.0.
Office Action dated Apr. 8, 2019 for CN Patent Application No. 201711129362.0.
Office Action dated Aug. 21, 2017 to CN Patent Application No. 20150046502.0.
Office Action dated Dec. 17, 2015 to Japanese Patent Application No. 2015-550755.
Office Action dated Dec. 17, 2018 to CN Patent Application No. 201711129340.4.
Office Action dated Dec. 17, 2018, to CN Patent Application No. 201711129386.6.
Office Action dated Dec. 18, 2018 to CN Patent Application No. 201711129387.0.
Office Action dated Dec. 27, 2018 to CN Patent Application No. 201711129372.4.
Office Action dated Dec. 3, 2018 to CN Patent Application No. 201711129373.9.
Office Action dated Dec. 3, 2018 to CN Patent Application No. 201711259332.1.
Office Action dated Feb. 2, 2019 to CN Patent Application No. 201711129371.X.
Office Action dated Feb. 27, 2019 to JP Patent Application No. 2018-92037.
Office Action dated Feb. 27, 2019 to JP Patent Application No. 2018-92039.
Office Action dated Jan. 11, 2018 to JP Patent Application No. 2016-526020.
Office Action dated Jan. 16, 2019 to CN Patent Application No. 201711258756.6.
Office Action dated Jan. 31, 2019 to CN Patent Application No. 201711259406.1.
Office Action dated Jun. 14, 2017 to JP Patent Application No. 2016-5260200
Office Action dated Jun. 2, 2017 to JP Patent Application No. 2016-96406.
Office Action dated Jun. 21, 2018 to CN Patent Application No. 20150046878.1.
Office Action dated Jun. 22, 2016 to CN Patent Application No. 201480023530.6.
Office Action dated Mar. 28, 2019 to JP Patent Application No. 2018-92038.
Office Action dated Nov. 30, 2018 to CN Patent Application No. 201711129365.4.
Office Action dated Oct. 23, 2015 to TW Patent Application No. 102148330.
Office Action dated Sep. 3, 2018 to JP Patent Application No. 2017-160095.
Office Action dated Sep. 6, 2019 for CN Patent Application No. 201711129362.0.
Office Action dated Sep. 25, 2020 to TW Patent Application No. 109101918.
Office Action dated Apr. 25, 2019 for JP Patent Application No. 2018-089271.
Official Action dated Dec. 3, 2019 to JP Patent Application No. 2017-521030.
Official Action dated Jan. 6, 2020 to JP Patent Application No. 2018-89271.
Official Action dated Nov. 29, 2019 to JP Patent Application No. 2018-92037.
Official Action dated Oct. 30, 2019 to JP Patent Application No. 2018-92039.
Official Action dated Aug. 2, 2019 to JP Patent Application No. 2018-106102.
Official Action dated Aug. 30, 2019 to JP Patent Application No. 2017-511904.
Official Action dated Aug. 5, 2019 for JP Patent Application No. 2018-160163.
Official Letter dated Jul. 8, 2019 to TW Patent Application No. 106140977.
Official Letter dated May 30, 2019 to TW Patent Application No. 107144110.
Penultimate Office Action dated Feb. 4, 2020 to JP Patent Application No. 2018-107021.
Penultimate Office Action dated Oct. 21, 2019 to JP Patent Application No. 2018-107021.
Penultimate Office action dated Nov. 2, 2018 for JP Patent Application No. 2016-510764.
Provisional Rejection dated Jan. 4, 2021 to KR Patent Application No. 10-2019-7036003.
Provisional Rejection dated Oct. 18, 2019 to KR Patent Application No. 10-2019-7024989.
Provisional Rejection dated Oct. 21, 2019 to KR Patent Application No. 10-2019-7029829.
Provisional Rejection dated Feb. 13, 2019 to KR Patent Application No. 10-2017-7011557.
Provisional Rejection dated Feb. 28, 2018 to KR Patent Application No. 10-2016-7018761.
Provisional Rejection dated Jan. 20, 2020 to KR Patent Application No. 10-2019-7031616.
Provisional Rejection dated Mar. 28, 2019 KR Patent Application No. 10-2018-7034202.
Provisional Rejection dated Nov. 30, 2018 to KR Patent Application No. 10-2018-7033028.
Provisional Rejection dated Oct. 26, 2018 to KR Patent Application No. 10-2017-7008701.
JP Non-final Office Action dated Feb. 18, 2022 for JP Patent Application No. 2021-006031.
KR Office Action dated Mar. 30, 2022 for KR Patent Application No. 10-2021-7040761.
KR Office Action dated Mar. 31, 2022 for KR Patent Application No. 10-2021-7042624.
Notice of Reason for Refusal dated Jan. 28, 2022 for JP Patent Application No. 2021-013579.
Notice of Rejection dated Dec. 17, 2021 to JP Patent Application No. 2020-148805.
Notification of Reason for Refusal dated Feb. 17, 2022 for KR Patent Application No. 10-2020-7034039.
Notification of Reason for Refusal dated Feb. 22, 2022 for KR Patent Application No. 10-2021-7018547.
Sang-Ho Lee et al., "Fabrication of organic light emitting display using inkjet printing technology", Optomechatronic Technologies, 2009. ISOT 2009 International Symposium, Sep. 21-23, 2009, pp. 71-76.
Schiaffino, Stefano, "The Fundamentals of Molten Microdrop Deposition and Solidification," Aug. 7, 1996, Massachusetts Institute of Technology, 215 pages.
Second Examination Report dated Feb. 17, 2021 to EP Patent Application No. 18188398.4.
Second Examination Report dated May 4, 2020 to EP Patent Application No. 14787652.8.
Second Examination Report dated Apr. 12, 2018 to TW Patent Application No. 103114950.
Second Office Action dated Nov. 25, 2019 to CN Patent Application No. 201810315491.7.
Second Office Action dated Aug. 28, 2019 to CN Patent Application No. 201711129386.6.

(56) References Cited

OTHER PUBLICATIONS

Second Office Action dated Aug. 30, 2019 to CN Patent Application No. 201711258756.6.
Second Office Action dated Nov. 18, 2019 to CN Patent Application No. 201711258771.0 .
Second Office Actiond dated Nov. 25, 2019 to CN Patent Application No. 201810315491.7.
Second Office Action dated Oct. 9, 2019 to CN Patent Application No. 201711259406.1.
Second Office Action dated Aug. 22, 2019 to CN Patent Application No. 201711129365.4.
Second Office Action dated Aug. 6, 2019 to CN Patent Application No. 201711129373.9.
Second Office action dated Feb. 2, 2019 to CN Patent Application No. 20150046878.1.
Second Office action dated Feb. 24, 2017 to CN Patent Application No. 201480023530.6.
Second Office Action dated Jul. 15, 2019 to CN Patent Application No. 201711129387.0.
Second Office Action dated Jul. 17, 2019 for CN Patent Application No. 201711259332.1.
Second Office Action dated Sep. 26, 2016 to CN Patent Application No. 201380073929.0.
Second Office Action dated Sep. 6, 2019 to CN Patent Application No. 201711129340.4.
Seelig, et al., Webpage "Go with the Flow: Paste viscosity can inform why solder performs one way in high-volume production and another under high-mix conditions," 2017.
Third Office Action dated Jan. 16, 2020 to CN Patent Application No. 201711258756.6.
Third Office Action dated Nov. 27, 2019 to CN Patent Application No. 201711129387.0.
Third Office Action dated Feb. 13, 2017 to CN Patent Application No. 201380073929.0.
TW Examination Report dated Apr. 13, 2017 for TW Patent Application No. 105115723.
TW Office Action Rejection dated Aug. 3, 2018 for TW Patent Application No. 106140977.
TW Official Letter dated Dec. 9, 2016 for TW Patent Application No. 103141158.
TW Second Official Action dated Aug. 15, 2017, to TW Patent Application No. 103141158.
Ulichney, Robert, "A Review of Halftoning Techniques," 2000, Society of Photographic Instrementation Engineers (SPIE), vol. 3963, pp. 379-391.
Zhou et al., "Three Dimensional Digital Halftoning for Layered Manufacturing Based on Droplets," Transactions of NAMRI/SME, vol. 36, 2009, pp. 175-182.
Notice of Allowance dated Mar. 13, 2020 to U.S. Appl. No. 15/795,664.
Notice of Allowance dated Jul. 11, 2019 to U.S. Appl. No. 15/361,845.
Notice of Allowance dated Mar. 16, 2016 to U.S. Appl. No. 14/340,403.
Notice of Allowance dated Jan. 16, 2015 to U.S. Appl. No. 14/458,005.
Non-Final Office Action dated Nov. 17, 2020 for U.S. Appl. No. 16/546,006.
Notice of Allowance dated Apr. 8, 2021 to U.S. Appl. No. 16/546,006.
Notice of Allowance dated Jun. 9, 2021 for U.S. Appl. No. 15/607,137.
Supplemental Notice of Allowability dated May 4, 2021 to U.S. Appl. No. 16/546,006.
Non Final Office Action dated May 28, 2020 to U.S. Appl. No. 16/356,430.
Non Final Office Action dated Jul. 11, 2019 to U.S. Appl. No. 15/607,137.
Non Final Office Action dated Jul. 23, 2019 for U.S. Appl. No. 15/795,664.
Non-Final Office Action dated Dec. 29, 2017 to U.S. Appl. No. 15/361,845.
Non-Final Office Action dated Nov. 17, 2020 to U.S. Appl. No. 16/546,006.
Non-Final Office Action dated Oct. 18, 2019 to U.S. Appl. No. 16/174,063.
Non-Final Office Action dated Oct. 9, 2015, to U.S. Appl. No. 14/680,960.
Non-Final Office Action dated Apr. 3, 2014 to U.S. Appl. No. 14/162,525.
Non-Final Office Action dated Apr. 4, 2017 to U.S. Appl. No. 14/840,343.
Non-Final Office Action dated Dec. 17, 2014 to U.S. Appl. No. 14/340,403.
Non-Final Office Action dated Mar. 18, 2016 to U.S. Appl. No. 14/937,739.
Non-Final Office Action dated May 12, 2017 to U.S. Appl. No. 15/416,931.
Non-Final Office Action dated Nov. 28, 2018 to U.S. Appl. No. 15/607,137.
Non-Final Office Action dated Nov. 28, 2018 to U.S. Appl. No. 15/802,325.
Non-Final Office Action dated Nov. 3, 2016 for U.S. Appl. No. 14/788,609.
Non-Final Office Action dated Oct. 27, 2015 to U.S. Appl. No. 14/340,403.
Non-Final Office Action dated Sep. 14, 2017 to U.S. Appl. No. 15/416,872.
Non-Final Office Action dated Sep. 28, 2018 to U.S. Appl. No. 15/716,753.
Notice of Allowance dated Nov. 13, 2020 to U.S. Appl. No. 16/536,654.
Notice of Allowance dated Oct. 4, 2017 to U.S. Appl. No. 14/840,343.
Notice of Allowance dated Aug. 29, 2017 to U.S. Appl. No. 15/279,261.
Notice of Allowance dated Jan. 28, 2020 to U.S. Appl. No. 16/174,063.
Notice of Allowance dated Aug. 25, 2020 to U.S. Appl. No. 15/802,325.
Notice of Allowance dated Jan. 31, 2019 to U.S. Appl. No. 15/607,137.
Notice of Allowance dated Jan. 6, 2020 to U.S. Appl. No. 15/804,015.
Notice of Allowance dated Jan. 8, 2020 to U.S. Appl. No. 15/416,931.
Notice of Allowance dated Jul. 26, 2017 to U.S. Appl. No. 15/417,020.
Notice of Allowance dated Mar. 17, 2015 to U.S. Appl. No. 14/462,525.
Notice of Allowance dated May 24, 2017 to U.S. Appl. No. 14/788,609.
Notice of Allowance dated Nov. 6, 2015 to U.S. Appl. No. 14/680,960.
Notice of Allowance dated Oct. 13, 2016 to U.S. Appl. No. 14/627,186.
Notice of Allowance dated Sep. 19, 2019 to U.S. Appl. No. 15/416,872.
Notice of Allowance dated Feb. 12, 2020 to U.S. Appl. No. 15/716,753.
Notice of Allowance dated Sep. 5, 2017 to U.S. Appl. No. 15/367,064.
Notice of Final Refusal dated Nov. 12, 2019 to KR Patent Application No. 10-2018-7034202.
Notice of Final Refusal dated Oct. 18, 2018 to KR Patent Application No. 10-2016-7018761.
Notice of First Refusal dated May 26, 2020 to KR Patent Application No. 10-2019-7031616.
Notice of First Refusal dated Apr. 24, 2019 to KR Patent Application No. 10-2017-7008701.
Notice of Final Refusal dated Jul. 12, 2019 to KR Patent Application No. 10-2008-7034202.
Notice of Reasons for Refusal dated Jul. 31, 2019 in JP Patent Application No. 2018-160163.
Notification of a Second Provisional Rejection to KR Patent Application No. 10-2015-7020356 dated May 31, 2016.
Notification of First Refusal dated Jun. 22, 2018 to KR Patent Application No. 10-2016-7018761.
Notification of Provisional Rejection to KR Patent Application No. 10-2015-7020356 dated Dec. 14, 2015.
Office Action dated Dec. 4, 2017 to JP Patent Application No. 2016-510764.
Office Action dated Apr. 11, 2019 to CN Patent Application No. 201711258771.0.

(56) References Cited

OTHER PUBLICATIONS

Office Action dated Apr. 15, 2019 to JP Patent Application No. 2018-107021.
Office Action dated Apr. 2, 2019 to JP Patent Application No. 2017-521030.
Notice of Allowance dated Jun. 1, 2020 to U.S. Appl. No. 15/361,845.
Notice of Reason for Refusal dated Jun. 4, 2021 in JP Application No. 2020148805.
BASF Group, "PEG200DMA Brochure" Sep. 2016.
CN First Office Action dated Oct. 24, 2016 for CN Patent Application No. 201480067970.1.
CN First Office Action with Search Report dated Aug. 1, 2018 for CN Patent Application No. 201710770926.2.
EP Extended Search Report dated Mar. 9, 2018 to EP Patent Application No. 15838945.2.
EP Extended Search Report dated May 7, 2018 to EP Patent Application No. 15815375.9.
EP Search Report dated Apr. 3, 2017 to EP Patent Application No. 14787652.8.
Examination Report dated Feb. 10, 2020 to Patent TW Application No. 108109190.
Examination Report dated Oct. 16, 2019 to TW Patent Application No. 108109190.
Examination Report dated Apr. 17, 2017 to TW Patent Application No. 105123219.
Examination Report dated Jan. 11, 2018 to TW Patent Application No. 103114950.
Examination report dated Jan. 22, 2019 to TW Patent Application No. 107141748.
Examination Report dated Jul. 17, 2019 to EP Patent Application No. 14870074.3.
Examination Report dated Mar. 20, 2018 to TW Patent Application No. 106140977.
Extended European Search Report dated Jan. 3, 2018 to EP Patent Application No. 14870074.3.
Extended Search Report dated Feb. 29, 2016 to EP Patent Application No. 13866979.1.
Extended Search Report dated Mar. 17, 2017 to EP Patent Application No. 13866979.1.
Final Office Action dated Aug. 28, 2020 to JP Patent Application No. 2018-160163.
Final Office Action dated Feb. 27, 2015 to U.S. Appl. No. 14/340,403.
Final Office Action dated May 18, 2020 to U.S. Appl. No. 15/804,015.
Final Office Action dated Nov. 12, 2020 to U.S. Appl. No. 16/356,430.
Final Office Action dated Nov. 25, 2019 to U.S. Appl. No. 15/607,137.
Final Office Action dated Apr. 11, 2018, to U.S. Appl. No. 15/416,872.
Final Office Action dated Feb. 20, 2015, to U.S. Appl. No. 14/162,525.
Final Office Action dated Jul. 1, 2019 for JP Patent Application No. 2016-510764.
Final Official Action dated Feb. 2, 2018 for JP Patent Application No. 2016-096406.
First Examination Report dated Sep. 20, 2019 to EP Patent Application No. 14787652.8.
First Office Action dated Jul. 2, 2019 for CN Patent Application No. 201810315491.7.
Fourth Office Action dated May 5, 2017 to CN Patent Application No. 201380073929.0.
Gao et al., "The Physics of Digital Microfabrication with Molten Microdrops," 1993, Solid Freeform Fabrication—Conference, 4.sup.th Symposium, Solid freeform fabrication, University of Texas, pp. 237-244.
General Guidelines on Drop Size measurement Techniques and Terminology (1997).
International Search Report and Written Opinion dated Apr. 30, 2014 for PCT Application No. PCT/US2013/077720.
International Search Report and Written Opinion dated Dec. 11, 2015 for PCT Application No. PCT/US15/47687.
International Search Report and Written Opinion dated Nov. 14, 2014 for PCT Application No. PCT/JS2014/035193.
International Search Report and Written Opinion dated Nov. 14, 2014 for PCT Application No. PCT/US2014/050749.
International Search Report and Written Opinion dated Oct. 6, 2015 to PCT Application PCT/US15/38693.
Jabbour, Ghassan E., "Printing Techniques in Organic Based Optoelectronics," Semiconductor Device Research Symposium, 2001 International, Dec. 5-7, 2001.
Lee et al., "Fabrication of Organic Light Emitting Display Using Inkjet Printing Technology," Optomechatronic Technologies, 2009. ISOT 2009 International Symposium, Sep. 21-23, 2009, pp. 71-76.
Moon et al., "Fabrication of Functionality Graded Reaction infiltrated SIC-Si Composite by Three-Dimensional Printing (3DTM) process" Materials Science and Engineering, vol. 298, 2001, p. 110-119.
Non Final Office Action dated Apr. 3, 2020 to U.S. Appl. No. 15/716,753.
Non Final Office Action dated Feb. 12, 2020 to U.S. Appl. No. 15/804,015.

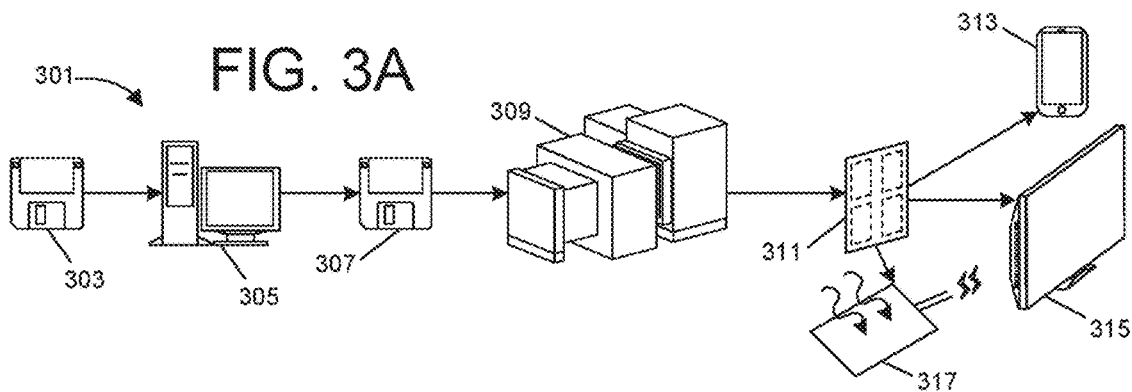
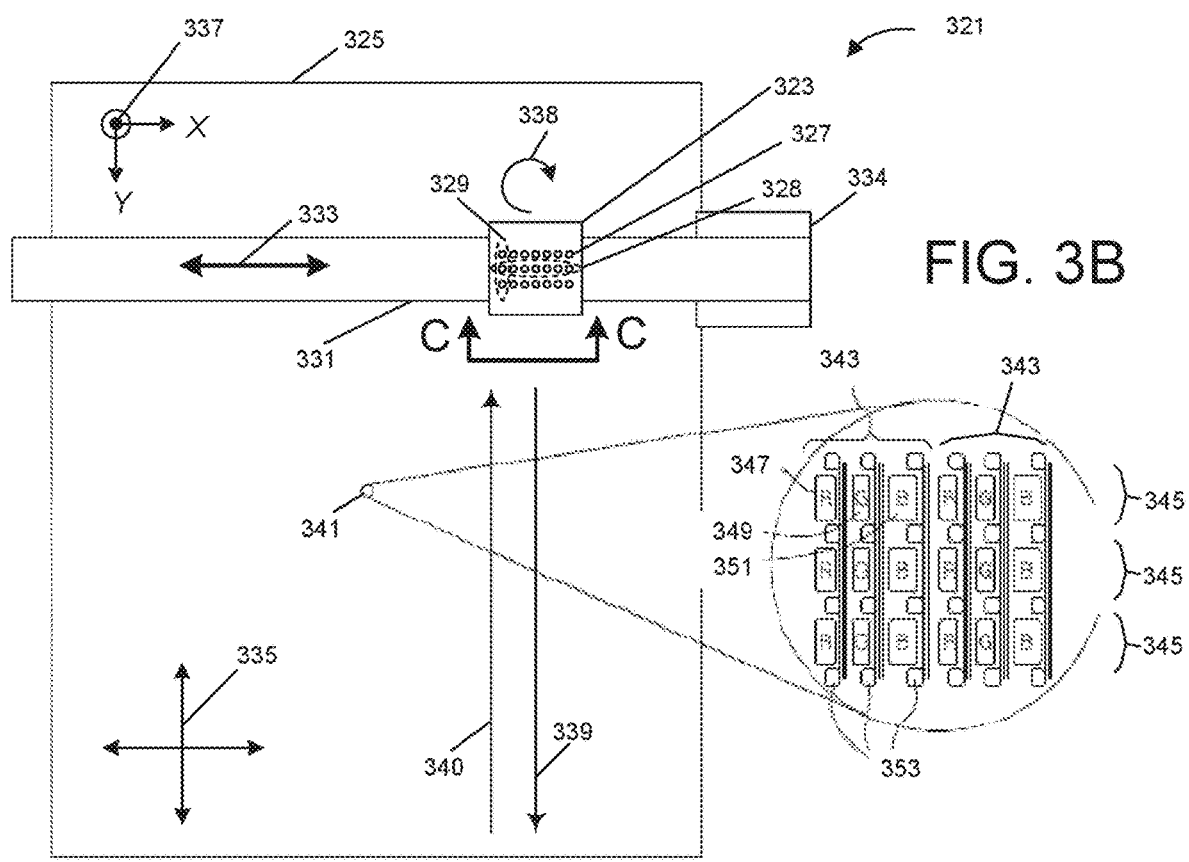

TECHNIQUES FOR PRINT INK DROPLET MEASUREMENT AND CONTROL TO DEPOSIT FLUIDS WITHIN PRECISE TOLERANCES

CROSS-REFERENCE TO RELATED APPLICATIONS

This application is a continuation of U.S. patent application Ser. No. 16/536,654, filed on Aug. 9, 2019, which is a continuation of U.S. patent application Ser. No. 15/716,753, filed on Sep. 27, 2017 (now U.S. Pat. No. 10,784,470, issued on Sep. 22, 2020), which is a continuation of U.S. patent application Ser. No. 15/135,380, filed on Apr. 21, 2016 (now U.S. Pat. No. 9,802,403, issued on Oct. 31, 2017); which is a continuation of U.S. patent application Ser. No. 14/340,403, filed on Jul. 24, 2014 (now U.S. Pat. No. 9,352,561, issued on May 31, 2016); which claims the benefit of U.S. Provisional Patent Application No. 61/950,820, filed on Mar. 10, 2014. U.S. patent application Ser. No. 14/340,403 is also a continuation-in-part of International Patent Application No. PCT/US14/35193, filed on Apr. 23, 2014, which claims the benefit of U.S. Provisional Patent Application Nos. 61/816,696, filed on Apr. 26, 2013; 61/822,855, filed on May 13, 2013; 61/842,351, filed on Jul. 2, 2013, 61/857,298, filed Jul. 23, 2013; 61/866,031, filed on Aug. 14, 2013; 61/898,769, filed on Nov. 1, 2013; and 61/920,715, filed on Dec. 24, 2013. U.S. patent application Ser, No. 14/340,403, is a continuation-in-part of U.S. patent application Ser. No. 14/162,525, filed on Jan. 23, 2014 (now U.S. Pat. No. 9,010,899, issued on Apr. 21, 2015), which claims priority from TW Patent Application No. 102148330, filed on Dec. 26, 2013. U.S. patent application Ser. No. 14/162,525, is a continuation of International Patent Application No. PCT/US13/77720, filed on Dec. 24, 2013, which claims the benefit of U.S. Provisional Patent Application Nos. 61/746,545, filed on Dec. 27, 2012; 61/822,855, filed on May 13, 2013; 61/842,351, filed on Jul. 2, 2013; 61/857,298, filed on Jul. 23, 2013; 61/898,769, filed on Nov. 1, 2013. Each of the aforementioned patent applications is hereby incorporated by reference.

This disclosure relates to techniques for measuring ink jet droplet volumes used for organic light-emitting diode ("OLED") device fabrication with a high degree of statistical accuracy, to use of a printing process to transfer droplets of a fluid ink to target regions of a substrate in precise aggregate quantities, and to related methods, devices, improvements and systems. In one non-limiting application, techniques provided by this disclosure can be applied to a manufacturing process for OLED display panels.

BACKGROUND

In a printing process where a printhead has multiple nozzles, not every nozzle reacts to a standard drive waveform the same way, i.e., each nozzle can produce a droplet of slightly different volume. In situation where the nozzles are relied upon to deposit fluid droplets into respective fluid deposition areas ("target regions"), lack of consistency can lead to problems. This is particularly the case for manufacturing applications, where the ink transports a material that will become a permanent thin-film structure within an electronic device. One example application where this issue arises is in a manufacturing process applied to the fabrication of displays, such as organic light-emitting diode ("OLED") displays, as used for small and large electronic devices (e.g., for portable devices, large scale high-definition television panels and other devices). Where a printing process is used to deposit an ink carrying light-generating materials of such displays, the volume discrepancy across rows or columns of pixels contributes to visible lighting or color defects in a displayed image. Note that "ink" as used herein refers to any fluid applied to a substrate by nozzles of a printhead irrespective of color characteristics; for example, in the mentioned OLED display fabrication application, ink is typically deposited in place and then processed, dried or cured in order to directly form a permanent material layer, and this process might be repeated with the same ink or a different ink to form several such layers.

FIG. 1A is used to introduce this nozzle-droplet inconsistency issue, with an illustrative diagram generally referenced using numeral 101. In FIG. 1A, a printhead 103 is seen to have five ink nozzles, which are each depicted using small triangles at the bottom of the printhead, each respectively numbered (1)-(5). Note that in a typical manufacturing application, there can be many more than five nozzles, e.g., 24-10,000, depending on application; in the case of FIG. 1A, five nozzles are referenced simply for ease of understanding. It should be assumed that in an example application it is desired to deposit fifty picoliters (50.00 pL) of a fluid into each of five specific target regions of an array of such regions, and further, that each of five nozzles of a printhead is supposed to eject ten picoliters (10.00 pL) of fluid with each relative movement ("pass" or "scan") between the printhead and a substrate into each of the various target regions. The target regions can be any surface areas of the substrate, including adjoining unseparated areas (e.g., such that deposited fluid ink partially spreads to blend together between regions), or respective, fluidically-isolated regions. These regions are generally represented in FIG. 1A using ovals 104-108, respectively. Thus, it might be assumed that exactly five passes of the printhead are necessary as depicted to fill each of the five specific target regions. However, printhead nozzles will in practice have some minor variations in structure or actuation, such that a given drive waveform applied to respective nozzle transducers yields slightly different droplet volumes for each nozzle. As depicted in FIG. 1A, for example, the firing of nozzle (1) yields a droplet volume of 9.80 picoliters (pL) with each pass, with five 9.80 pL droplets being depicted within oval 104. Note that each of the droplets is represented in the figure by a distinct location within the target region 104, but in practice, the location of each of the droplets may be the same or may overlap. Nozzles (2)-(5), by contrast, yield different, respective droplet volumes of 10.01 pL, 9.89 pL, 9.96 pL and 10.03 pL. With five passes between printhead and substrate where each nozzle deposits fluid on a mutually-exclusive basis into the target regions 104-108, this deposition would result in a total deposited ink volume variation of 1.15p1 across the five target regions; this can be unacceptable for many applications. For example, in some applications, discrepancy of as little as one percent (or even much less) in deposited fluid can cause issues; in the case of OLEO display fabrication, such variation can potentially result in image artifacts observable in a finished display.

Manufacturers of televisions and other forms of displays will therefore effectively specify precise volume ranges that must be observed with a high-degree of precision, e.g., 50.00 pL, ±0.25 pl in order for a resultant product to be considered acceptable; note that in this exemplary case, the specified tolerance must be within one-half percent of the target of 50.00 pL. In an application where each nozzle represented by FIG. 1A was to deposit into pixels in respective horizontal lines of a high-definition television ("HDTV") screen, the depicted variation of 49.02 pL-50.17 pL might therefore yield unacceptable quantity, because this would represent about a ±1.2% variation (e.g., instead of the desired maximum tolerance of ±0.5% variation). While display technologies have been cited as an example, it should be understood that the nozzle-droplet inconsistency problem can arise in other contexts.

In FIG. 1A, nozzles are specifically aligned with target regions (e.g., wells) such that specific nozzles print into specific target regions. In FIG. 1B, an alternate case 151 is shown in which the nozzles are not specially aligned, but in which nozzle density is high relative to target region density; in such a case, whichever nozzles happen to traverse specific target regions during a scan or pass are used to print into those target regions, with potentially several nozzles traversing each target region in each pass. In the example shown, the printhead 153 is seen to have five ink nozzles and the substrate is seen to have two target regions 154-155, each located such that nozzles (1) and (2) will traverse target region 154, nozzles (4) and (5) will traverse target region 155, and nozzle (3) will not traverse either target region. As shown, in each pass, one or two droplets are deposited into each well, as depicted. Note that once again, the droplets can be deposited in a manner that is overlapping or at discrete points within each target region, and that the particular illustration in FIG. 1B is illustrative only; as with the example presented in FIG. 1A, it is once again assumed that it is desired to deposit fifty picoliters (50.00 pL) of a fluid into each of target regions 154-155, and that each nozzle has a nominal droplet volume of approximately 10.00 pL. Utilizing the same per nozzle droplet volume variation as observed in connection with the example of FIG. 1A, and assuming that each nozzle that overlaps with a target region on a given pass will deliver a droplet into that target region up until a total of five droplets have been delivered, it is observed that the target regions are filled in three passes and there is a total deposited ink volume variation from the target of 50.00 pL of 0.58 pL across the two target regions, and further a discrepancy outside of specified tolerance; again, this can be unacceptable for many applications.

It is noted that in connection with the examples above, the droplet consistency issue is further exacerbated by the issue that droplet volumes can statistically vary, even for a given nozzle and given drive waveform. Thus, in the examples discussed above, it was assumed that nozzle (1) of the printhead from FIGS. 1A and 1B would produce a droplet volume of 9.80 pL in response to a given drive waveform but, in practice, in a real world case, droplet volume can be assumed to vary somewhat depending on various factors, for example, process, voltage, temperature, printhead age and many other factors, such that actual droplet volume may not be precisely known.

While techniques have been proposed to address the droplet consistency problem, generally speaking, these techniques either still do not reliably provide fill volumes that stay within the desired tolerance range or they dramatically increase manufacturing time and cost, i.e., they are inconsistent with a goal of having high quality with a low consumer price-point; such quality and low price-point can be key for applications where commodity products, such as HDTVs, are concerned.

What is therefore needed are techniques useful in depositing fluid into target regions of a substrate using a printhead with nozzles. More specifically, what is needed are techniques for precisely controlling deposited fluid volumes in respective target regions of a substrate notwithstanding variations in nozzle-droplet ejection volumes, ideally on a cost-effective basis that permits fast fluid deposition operations and thus improves the speed of device fabrication. The techniques described below satisfy these needs and provide further, related advantages.

BRIEF DESCRIPTION OF THE DRAWINGS

FIG. 3A provides an illustrative view showing a series of optional tiers, products or services that can each independently embody the techniques introduced earlier.

FIG. 3B is an illustrative diagram showing a hypothetical arrangement of a printer and substrate, in an application where the substrate is ultimately to form a display panel having pixels.

Figure 1A:
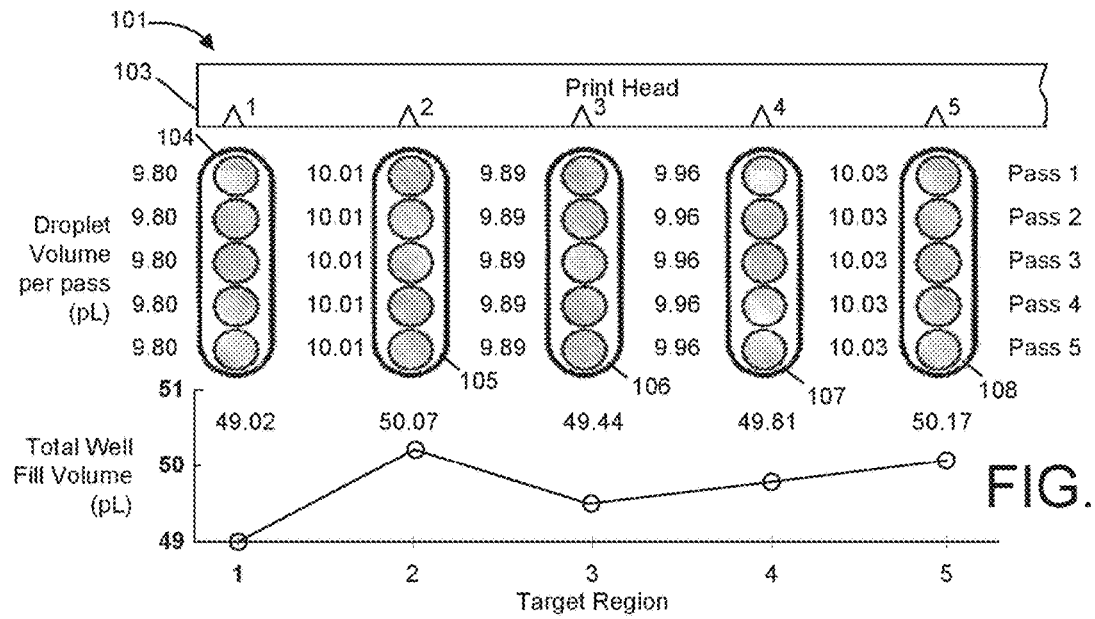
FIG. 1A is a diagram that presents a hypothetical problem of depositing ink in target regions of a substrate where a printhead with five nozzles is used to deposit a target fill of 50.00 pL in each of five specific target regions.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application. Without limiting the foregoing, this disclosure provides several different examples of techniques used to fabricate a materials layer by planning printhead movement so as to maintain deposited ink volume within predetermined allowances while not excessively increasing the number of printhead passes (and thus the time needed to complete a deposited layer). In connection with these techniques, accurate droplet measurement can be performed so as to accurately plan composite ink fills in any target region, with measurement highly integrated with production printing. The various techniques can be embodied as software for performing these techniques, in the form of a computer, printer or other device running such software, in the form of control data (e.g., a print image) for forming a materials layer, as a deposition mechanism, or in the form of an electronic or other device (e.g., a flat panel device or other consumer end product) fabricated as a result of these techniques. While specific

DETAILED DESCRIPTION

This disclosure relates to use of a printing process to transfer layer material to a substrate, techniques for droplet measurement with a high degree of accuracy, and related methods, improvements, devices and systems.

The nozzle consistency issue introduced above can be addressed by measuring droplet volume per nozzle (or variation in droplet volume across nozzles) of a printhead for a given nozzle firing waveform. This permits planning of printhead firing patterns and/or motion to deposit precise aggregate fill volumes of ink in each target region. With an understanding of how droplet volume varies across nozzles, printhead/substrate positional offsets and/or droplet firing patterns can be planned in a manner that accommodates differences in droplet volumes but that still optimizes concurrent printing in adjacent target regions with each pass or scan. Viewed from a different perspective, rather than normalizing or averaging out nozzle-to-nozzle variation in droplet volumes, the specific droplet volume characteristics of each nozzle are measured and used in a planned manner to concurrently achieve specific in-range aggregate volumes for each of multiple target regions of the substrate; in many embodiments, this planning is performed using a process that reduces the number of scans or printhead passes in dependence on one or more optimization criteria.

A number of different embodiments will be presented below that contribute to achieving these results. Each embodiment can be used in isolation and it is also expressly contemplated that features of any embodiment can be optionally mixed and matched with features of a different embodiment.

One embodiment presents systems and techniques that provide for individualized droplet measurement over a very large printhead assembly (e.g., having hundreds to thousands of nozzles, or more). Logistical difficulties associated with positioning of optics are resolved using below-deposition-plane-measurement techniques (i.e., by redirecting light to away from the vicinity of the printhead, beyond the relative distance at which a substrate would normally be positioned for deposition), for example, using an optics assembly that can be actuated in up to three dimensions, such that a large printhead assembly (e.g., within a confined space) can optionally be parked (e.g., at a printer service station) and a droplet measurement device precisely articulated relative to the large printhead assembly. Precise placement of a below-deposition-plane optics assembly enables drop volume measurement of a packed nozzle array at the required distance from the nozzle plate (the printhead assembly typically operates on the order of one millimeter from a substrate surface), notwithstanding the confined space. In one optional embodiment, the optics system employs shadowgraphy and repeated measurement of droplets emanating from specific nozzles (and optionally, varied nozzle drive waveforms) to increase statistical confidence of expected droplet volume. In another optional embodiment, the optics system employs interferometry and repeated measurement of droplets emanating from specific nozzles (and optionally, varied nozzle drive waveforms) to increase statistical confidence of expected droplet volume.

Note that in a production line, it is typically desired to have as little downtime in production as possible, in order to maximize productivity and to minimize manufacturing cost. In another optional embodiment, droplet measurement times are therefore "hidden" or "stacked" behind other line processes. For example, in an optional flat panel display fabrication production line, as each new substrate is being loaded or otherwise handled, processed or transferred, a printhead assembly of the printer is analyzed using droplet measurement processes to facilitate an accurate statistical understanding of per-nozzle (and/or per-nozzle, per-drive waveform) droplet volumes. For a printhead assembly having tens of thousands of nozzles, repeated droplet measurement (e.g., dozens of droplet measurements per nozzle, per drive waveform if multiple drive waveforms are used) can take substantial time; optional system control processes and related software can therefore optionally perform droplet measurement on a dynamic, incremental basis. For example, if a hypothetical load/unload process requires, e.g., 30 seconds, with each print process taking 90 seconds, the printhead assembly could be measured during the load/unload process in two minute cycles, updating droplet measurements to obtain per-nozzle droplet volume means and confidence intervals using a sliding window of nozzles/droplets analyzed during the load/unload process associated with each two minute cycle. Note that many other processes are possible and that a continuous, dynamic process is not required for all embodiments. However, it is believed in practice that not only will droplet volume for a given nozzle and drive waveform vary relative to other nozzles and drive waveforms but, further, that typical values will change over time, owing to factors such as subtle variation in ink properties, nozzle age and degradation, and other factors; a process which therefore periodically updates measurements, e.g., every few hours to days, can therefore advantageously further improve reliability.

In yet another optional embodiment, a droplet measurement system uses interferometry and non-imaging techniques to obtain very fast droplet measurements, for example, performing per droplet measurement in microseconds and repeated droplet measurement across a printhead assembly with thousands of nozzles in less than thirty minutes. As contrasted with imaging techniques (which use a camera and captured image pixel processing techniques to derive volume measurement), interferometry techniques can provide accurate droplet volume measurement by detecting interference pattern spacing using multiple light sensors, representative of droplet shape, and by correlating this spacing with droplet volume. In one implementation, a laser source and/or related optics and/or sensors are mechanically mounted for below deposition plane measurement and effective articulation relative to a large printhead assembly. Owing to the very rapid measurements obtainable with such a system, interferometry techniques are especially useful in an embodiment that performs dynamic, incremental measurement, as just described, and with such techniques, with each printing cycle, dozens to hundreds of nozzles can be subjected to repeated droplet measurements (e.g., measurement of thirty droplets per nozzle) to achieve high statistical confidence around each expected droplet volume.

In yet another optional embodiment, many droplet measurements are taken per nozzle and per nozzle drive waveform (for embodiments that use varied nozzle drive waveforms). As the number of measurements increases, the mean and standard deviation (assuming normal random distribution) for each nozzle-waveform combination becomes more resolute. Using mathematical processes implemented by software, statistical models for each droplet can be created and accurately combined to develop a statistical model for composite ink fill per target region. To provide an example, many measurements are taken for each nozzle for each drive waveform. If a given single measurement of droplet volume is expected to be accurate with a standard deviation of two percent, then by taking many measurements, a statistically accurate mean is obtained with a reduced variance or standard deviation; that is, again assuming a normal random distribution, the standard deviation is decreased by the number of measurements n according to $\sigma/(n)^{1/2}$ such that four measurements of a droplet volume would reduce standard deviation by half, and so forth. Thus, in one embodiment, software is used to achieve a much higher confidence interval around expected droplet volume through specifically planned, repeated measurements that help substantially reduce measurement error. Many different statistical measures can be used, but for example, for an embodiment where composite fills are expected to fall within a range of ±x % (e.g., ±0.5% of a target fill), then droplet measurements can be taken to ensure that for each nozzle, and for each different drive waveform, a $3\sigma$ (99.73%) confidence interval is obtained around expected droplet volume within the same range (e.g., ±0.5%) of a mean droplet volume. Perhaps otherwise stated, with an accurate statistical model built for each different droplet, known techniques can be used to plan droplet combinations based on mathematical combinations of associated statistical models to develop a higher degree of accuracy around aggregate per-target region ink fills (notwithstanding nozzle-to-nozzle or waveform-to-waveform droplet volume variation). Note that while a normal random distribution is used for select embodiments, any statistical model can be used (e.g., Poisson, Student's-T, etc.), where individual distributions can be combined (e.g., by software) to obtain an aggregate distribution representing combination of different droplets. Also note that while in some embodiments, a $3\sigma$ (99.73%) measure is used, in other contemplated embodiments, other types of statistical measures are used, such as $4\sigma$, $5\sigma$ or $6\sigma$; or a measure not specifically associated with random distributions.

Note that similar techniques can be applied to develop models of droplet velocity and flight trajectory for each nozzle-waveform combination. These variables can be further applied in other optional embodiments.

Any permutation or subset of the techniques and embodiments described above can be applied to accurately plan for aggregate ink fills in a target region, that is, in a manner that plans for specific composite volumes based on per-nozzle droplet volume variations. That is, rather than trying to average out volume differences across nozzles, these differences are understood and specifically used in print control processes to combine different droplets (e.g., from different nozzles or using different drive waveforms) and obtain very precise ink fills.

In one optional embodiment, the printhead and/or the substrate are "stepped" in variable amounts so as to change, as appropriate, the nozzle or nozzles used for each target region in various passes to eject specifically desired droplet volumes. For example, a droplet from one nozzle (e.g., with a mean droplet volume of 9.95 pl) can be combined with a droplet from a second nozzle (e.g., with a mean droplet volume of 10.0 SpL, to obtain an aggregate composite of 20.00 pL) by selectively offsetting a printhead or printhead assembly relative to a substrate. Multiple passes are planned so that each target region receives a specific aggregate fill matching a desired target fill. That is, each target region (for example, each well in a row of wells that will form pixelated components of a display) receives a planned combination of one or more droplet volumes to achieve an aggregate volume within a specified tolerance range using different geometric steps of printhead relative to substrate. In more detailed features of this embodiment, given the nozzles' positional relationships to one another, a pareto optimal solution can be computed and applied, such that a tolerable amount of volume variation in each target region is permitted, within specification, but at the same time, the printhead/substrate movement is planned to maximize average concurrent use of nozzles for respective target deposition regions. The statistical techniques discussed above can be used to ensure that a statistical model of composite (i.e., multi-droplet) ink fills falls within any desired tolerance range. In one optional refinement, a function is applied to reduce and even minimize the number of printhead/substrate passes needed for printing to achieve these ends. Reflecting briefly upon these various features, fabrication cost is substantially reduced as the printing of layers of material on a substrate can be performed quickly and efficiently.

Note that in a typical application, the target regions that receive ink are arrayed, that is, laid out in rows and columns, where a swath described by relative printhead/substrate motion will deposit ink in a subset of all of the rows (of target regions of the array), but in a manner that covers all columns of the array in a single pass; also, the number of rows, columns and printhead nozzles can be quite large, e.g., involving hundreds or thousands of rows, columns and/or printhead nozzles.

Another optional embodiment addresses the nozzle consistency issue in a slightly different manner. A set of multiple, prearranged, alternate nozzle firing waveforms with known (and different) droplet volume characteristics is made available to each nozzle; for example, a set of four, eight or another number of alternate waveforms can be hard-wired or otherwise predefined to provide a corresponding set of selectable, slightly-different droplet volumes. Per-nozzle volume data (or difference data) and any associated statistical models are then used to plan for concurrent deposition of multiple target regions by determining sets of nozzle-waveform combinations for each target region of the substrate. Once again, the specific volume characteristics of each nozzle (and in this case, each nozzle-waveform combination) and associated distributions, confidence intervals and so forth are relied upon to achieve specific fill volumes with high confidence; that is, rather than attempting to correct per-nozzle volume variation, the variation is specifically used in combinations to obtain specific fill volumes within a well understood statistical range. Note that there will typically be a large number of alternate combinations that could be used to deposit droplets in reach a desired range in each target region of the substrate in order to meet these ends. In a more detailed embodiment, a "common set" of nozzle waveforms can be shared across some (or even all) nozzles of a printhead, with per-nozzle droplet volumes stored and available for mixing and matching different droplet volumes to achieve specific fills. As a further option, a calibration phase can be used to select different waveforms in an off-line process (e.g., the dynamic, incremental measurement process introduced above), with a set of specific nozzle firing waveforms being selected based on calibration to achieve a set of respective, specifically-desired volume characteristics. Once again, in further detailed embodiments, optimization can be performed to plan printing in a way that improves printing time, for example, by minimizing the number of scans or printhead passes, by maximizing concurrent nozzle use, or by optimizing some other criteria.

Yet another embodiment relies on the use of multiple printheads in a printhead assembly, where each printhead and its nozzles can be offset relative to one another (or equivalently, a print structure having multiple rows of nozzles that can each be offset relative to one another). Using such deliberate offset, per-nozzle volume variations can be intelligently combined across printheads (or rows of nozzles) with each pass or scan. Again, there will typically be a large number of alternate combinations that could be used to deposit droplets to reach a desired range in each target region of the substrate and, in detailed embodiments, optimization is performed to plan the use of offsets in a way that improves printing time, for example, by minimizing the number of scans or printhead passes, or by maximizing concurrent nozzle use, and so forth.

Note that one benefit of the techniques described above is that by living with droplet volume variations but combining them to achieve specific, predetermined target region fill volumes, one can achieve a high degree of control over not only the ability to satisfy a desired fill tolerance range, but also over precise volume amounts and deliberately controlled (or injected) variation in such amounts. Mura, or the presence of geometric patterns from the deposition process that could give rise to observable patterns, can be mitigated through a number of the techniques presented herein. That is, even a slight discrepancy in target fill volumes at low spatial frequency can introduce unintended geometric artifacts which are visible to the human eye and which are therefore undesirable. It is therefore desired in some embodiments to deliberately but randomly vary the composite fill volume of each target region, or the specific combination of droplets used to achieve a composite fill, in a manner still within specification. Using an exemplary tolerance of 49.75 pL-50.25 pL, rather than simply arbitrarily ensuring that all target region fills are at a value within this tolerance range, it can for example be desired for such applications to introduce intentional variation within this range, such that any pattern of variation or difference is not observable to the human eye as a pattern in a finished, operating display. Applied to a color display, one exemplary embodiment deliberately adds such fill volume variation in a manner statistically independent for at least one of (a) an x dimension (e.g., along the direction of a row of target regions), (b) a y dimension (e.g., along the direction of a column of target regions), and/or (c) across one or more color dimensions (e.g., independently for red versus blue, blue versus green, red versus green target regions). In one embodiment, variation is statistically independent across each of these dimensions. Such variation is believed to render any fill volume variations imperceptible to the human eye and thus to contribute to high image quality of such displays. Note that for embodiments which use planned combinations of droplets from different nozzles, produced through a repeatable set of "geometric steps" or offsets in scan path, the use of subtle but deliberate droplet volume variation for each nozzle (i.e., produced through the use of multiple, alternate firing waveforms for each nozzle) provides a powerful technique for suppressing the potential for Mura without having to vary scan path. In one contemplated embodiment, for example, each nozzle is assigned a set of alternate waveforms that produce respective mean volumes within ±10.0% of an ideal volume; droplet combinations from different nozzles can then be planned according to precise means (i.e., to achieve precise intended fills) with Mura suppressed through the use of injected variation of droplet patterns (either through planned combinations of droplet volumes from different nozzle-waveform pairings, or through waveform variation injected after selection/planning of nozzle-droplet combinations to achieve specific fills). In other embodiments, deliberately-different composite droplet volumes can be prearranged for each target region to produce an aggregate fill, or different nozzle-droplet combinations can be applied along scan path, or non-linear scan paths can be used, all to the same effect. Other variations are also possible.

Also, whereas conventional droplet measurement techniques might take many hours or days, and thus lead to errors in a printing process due to possible variation in drop characteristics during the long measurement cycle, the use of fast techniques such as the interferometry techniques and associated structures (introduced above) facilitates a more up-to-date, and therefore more accurate, dynamic understanding of nozzle-to-nozzle and droplet-to-droplet volume variations, permitting the use of planned combinations as described previously with high confidence. For example, while conventional droplet measurement techniques might take many hours to perform, through the use of non-imaging techniques (such as interferometry), droplet measurement can be kept continuously up-to-date and thus made to accurately track process, voltage and temperature (PVT variations), printhead nozzle degradation, ink changes, and other dynamic processes that can affect the accuracy of measurement. Through the use of a rolling measurement process, for example that hides incremental droplet measurement in substrate loading and unloading times as mentioned previously, it is expected that droplet measurements can be retaken and updated almost continuously (e.g., for each nozzle less than every 3-4 hours) and thus made to present accurate models enabling composite fill planning as described previously. In one embodiment, droplets produced by every nozzle or nozzle-waveform pairing are re-measured (e.g., ab initio) on a periodic basis, e.g., once every 2 hours to 24 hour period, and preferably at a shorter time interval such as two hours. Note that a rolling process is not required for all embodiments, i.e., in one embodiment, measurements can be taken (or retaken) for all nozzles during a dedicated calibration process, during which printing is interrupted. To provide one example, in one possible embodiment, a printhead assembly having 6,000 nozzles and 24,000 nozzle-waveform combinations could be measured for 15 seconds during a substrate loading and unloading phase for each 90 second print cycle, as a continual matter that with each iteration examines a different, rolling subset of the 24,000 nozzle-waveform combinations. The iterations proceed until all nozzle-waveform combinations have been processed, and then the process is then repeated on a circular basis. In an embodiment that uses a dedicated "offline" calibration process (e.g., every three hours), such a printhead assembly could be parked for a period (e.g., 30 minutes) to develop statistical models for all nozzle-waveform combinations before returning to active printing. Note also that these techniques can also be used for other print head processes including without limitation any type of nozzle maintenance process, e.g., with a large print head assembly having thousands of nozzles, a rolling process can be used to perform "online" maintenance in between print operations (such as during loading and/or unloading of successive substrates in a manufacturing line).

Note again that each of the optional techniques and embodiments introduced above are to be considered optional to one another, and conversely, it is contemplated that such techniques can optionally be combined in any possible permutation or combination in various embodiments. As an example, measurements of per-nozzle/drive waveform droplet velocity and/or flight angle can be used to disqualify "erroneous" droplets for a given nozzle-waveform combination based on a determination that the particular nozzle-waveform combination produces an aberrant droplet "mean," or based on a determination that the particular nozzle-waveform combination produces a droplet statistical spread exceeding a threshold. To provide another non-limiting example, interferometry or other non-imaging techniques can be used to dynamically update velocity and/or flight angle behavior by incrementally and dynamically performing such measurements on various windows of nozzle-waveform combinations at intermittent intervals, i.e., as a printhead assembly is "parked" during loading and/or unloading of a substrate. Clearly, many combinations and permutations are possible based on the permutations introduced above.

An example will help introduce some concepts relating to intelligent planning of fill volumes per target region. Per-nozzle volume data (or difference data) for a given nozzle firing waveform can be used to plan for concurrent deposition of multiple target regions by determining possible nozzle-droplet volume sets for each target region of the substrate. There will typically be a large number of possible combinations of nozzles and/or drive waveforms that can be used deposit ink droplets in multiple passes to fill each target region to a desired fill volume within a narrow tolerance range that meets specification. Returning briefly to the hypothetical introduced using FIG. 1A, if acceptable fill volumes according to specification were between 49.75 pL and 50.25 pL (i.e., within a range of 0.5% of target), acceptable fill volumes could also be achieved using many different sets of nozzles/passes, including without limitation: (a) five passes of nozzle 2 (10.01 pL) for a total of 50.05 pL; (b) a single pass of nozzle 1 (9.80 pL) and four passes of nozzle 5 (10.03 pL), for a total of 49.92 pL; (c) a single pass of nozzle 3 (9.89 pL) and four passes of nozzle 5 (10.03 pL), for a total of 50.01 pL; (d) a single pass of nozzle 3 (9.89 pL), three passes of nozzle 4 (9.96 pL), and a single pass of nozzle 5 (10.03 pL) for a total of 49.80 pL; and (e) a single pass of nozzle 2 (10.01 pL), two passes of nozzle 4 (9.96 pL) and two passes of nozzle 5 (10.03 pL) for a total of 49.99 pL. Other combinations are clearly also possible. Droplet measurement techniques introduced above can be used to obtain these expected (e.g., mean) droplet volumes notwithstanding relatively larger statistical error associated with a single droplet measurement (e.g., ±2% of volume). Thus, even if only one choice of nozzle drive waveform was available for each nozzle (or all nozzles), the first embodiment introduced above could be used to offset the printhead relative to the substrate in a series of planned offsets or "geometric steps" that apply as many nozzles as possible during each scan to deposit droplets (e.g., in different target regions), but that combine deposited droplets for each target region in a specifically-intended manner. That is, many combinations of nozzle-droplet volumes in this hypothetical could be used to achieve desired fill volumes within a well understood range of statistical variance that conforms to specification tolerance; a specific embodiment effectively selects a particular one of the acceptable droplet combinations for each target region (i.e., a particular set for each region) through its selection of scanning motion and/or nozzle drive waveforms, so as to facilitate concurrent fills of different rows and/or columns of target regions using respective nozzles. By choosing the pattern of relative printhead/substrate motion in a way that minimizes the time over which printing occurs, this first embodiment provides for substantially-enhanced manufacturing throughput. Note that this enhancement can optionally be embodied in the form of minimizing the number of printhead/substrate scans or "passes," in a manner that minimizes the raw distance of relative printhead/substrate movement or in a manner that otherwise minimizes overall printing time. That is to say, the printhead/substrate movement (e.g., scans) can be preplanned and used to fill target regions in a manner that meets predefined criteria, such as minimal printhead/substrate passes or scans, minimal printhead and/or substrate movement in a defined dimension or dimension(s), printing in a minimal amount of time, or other criteria.

Figure 1B:
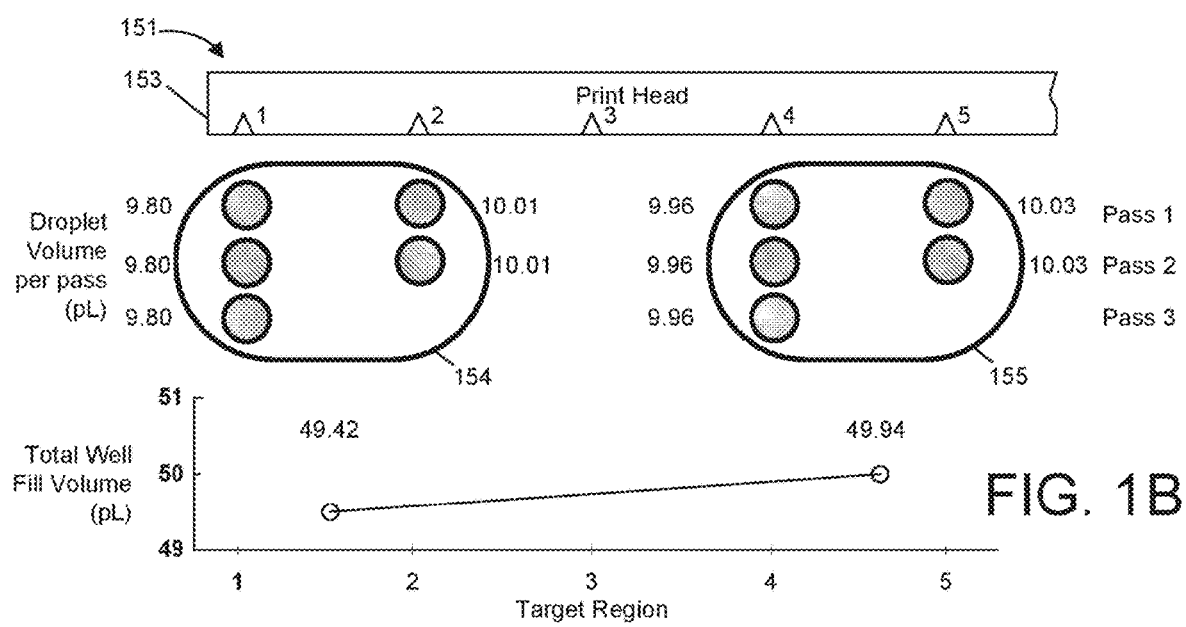
FIG. 1B is another diagram that presents a hypothetical problem of depositing ink in target regions of a substrate where a printhead with five nozzles is used to deposit a target fill of 50.00 pL in each of two specific target regions.

The same approaches all apply equally to the hypothetical of FIG. 1B in which the nozzles are not specially aligned to respective target regions. Again, if acceptable fill volumes according to specification were between 49.75 pL and 50.25 pL (i.e., within a range of 0.5% of either side of target), acceptable fill volumes could also be achieved many different sets of nozzles/passes, including without limitation, all of the examples listed above for FIG. 1A as well as additional examples particular to the hypothetical of FIG. 1B in which two adjacent nozzles are used in a single pass to fill a particular target region, for example, two passes of nozzle (4) (9.96 pL) and of nozzle (5) (10.03 pL), and one pass of nozzle (2) (10.01 pL) for a total of 49.99 pL. Once again, each such volume can be equated with a statistical mean based on many droplet measurements. For example, if nozzles (4), (5) and (2) in this example were associated with statistical models featuring the recited mean and a 3σ value equal to or less than 0.5% of the recited mean, the aggregate fill would also have a 3σ value equal to or less than ±0.5% of 49.99 pL, generally meeting specified tolerance with a high degree of statistical accuracy. Note that for a high definition OLED display (i.e., with millions of pixels), a 3σ (99.73%) value which closely matches fill tolerance may be insufficient, e.g., this statistically indicates that potentially thousands of pixels can still be outside desired tolerance; for this reason, in many embodiments, a larger spread measure (e.g., 6σ) is matched to composite fill tolerance, effectively guaranteeing that virtually every pixel of a high definition display conforms to manufacturer specification.

These same principles also apply to a multiple-per-nozzle-drive-waveform embodiment. For example, in the hypothetical presented by FIG. 1A, each of the nozzles could be driven by five different firing waveforms, identified as firing waveforms A through E, such that the resulting volume characteristics of the different nozzles for the different firing waveforms are described by Table 1A, below. Considering only target region 104 and only nozzle (1), it would be possible to deposit the 50.00 pL target in five passes, for example, with a first printhead pass using predefined firing waveform D (to generate from nozzle (1) a 9.96 pL droplet), and with four subsequent passes using predefined firing waveform E (to generate from nozzle (1) a 10.01 pL droplet), all without any offset in scan path. Similarly, different combinations of firing waveforms can be used concurrently in each pass for each nozzle to generate volumes in each of the target regions that is close to the target values without any offset in scan path.

TABLE 1A

| Waveform | Nozzle | | | | |
| --- | --- | --- | --- | --- | --- |
| | (1) | (2) | (3) | (4) | (5) |
| A | 9.80 | 10.01 | 9.89 | 9.96 | 10.03 |
| B | 9.70 | 9.90 | 9.81 | 9.82 | 9.94 |
| C | 9.89 | 10.10 | 9.99 | 10.06 | 10.13 |

TABLE 1A-continued

| Waveform | Nozzle | | | | |
|---|---|---|---|---|---|
| | (1) | (2) | (3) | (4) | (5) |
| D | 9.96 | 10.18 | 10.07 | 10.15 | 10.25 |
| E | 10.01 | 10.23 | 10.12 | 10.21 | 10.31 |

These same approaches all apply equally to the hypothetical of FIG. 1B. For example, considering only target region 154 and nozzles (1) and (2) (i.e., the two nozzles that overlap target region 154 during a scan), it is possible to achieve 50.00 pL in three passes, for example, with a first printhead pass using nozzle (1) and predefined waveform B (for a droplet volume of 9.70 pL) and nozzle (2) and predefined waveform C (for a droplet volume of 10.10 pL), a second printhead pass using nozzle (1) and predefined waveform E (for a droplet volume of 10.01 pL) and nozzle and predefined waveform D (for a droplet volume of 10.18 pL), and a third printhead pass using nozzle (1) and predefined waveform E (for a droplet volume of 10.01 pL).

Note that in both the hypothetical of FIG. 1A and the hypothetical of FIG. 1B, it is possible to deposit each target volume in a single row of target regions in a single pass; for example, it would be possible to rotate the printhead by ninety degrees and deposit exactly 50.00 pL with a single droplet from each nozzle for each target region in a row, for example, using waveform (E) for nozzle (1), waveform (A) for nozzles (2), (4) and (5) and waveform (C) for nozzle (3) (10.01 pL+10.01 pL+9.99 pL+9.96 pL+10.03 pL=50.00 pL). It might also be possible to deposit all of the drops necessary to achieve the target volume in one pass even without rotating the print head. For example, nozzle (1) may be able to dispense a drop with waveform D and 4 drops from waveform E into region 104 in a single pass.

These same principles also apply to the printhead offset embodiment introduced above. For example, for the hypothetical presented by FIG. 1A, the volume characteristics can reflect the nozzles for a first printhead (e.g., "printhead A"), with this first printhead being integrated together with four additional printheads (e.g., printheads "B" through "E"), each being driven by a single firing waveform and having respective per-nozzle droplet volume characteristics. The printheads are collectively organized such that in executing a scan pass each of the nozzles identified as nozzle (1) for a printhead is aligned to print into a target region (e.g., target region 104 from FIG. 1A), each of the nozzles identified as nozzle (2) from the various printheads are aligned to print into a second target region (e.g., target region 105 from FIG. 1A), and so on, with the volume characteristics of the different nozzles for the different printheads described by Table 1B, below. Optionally, the respective printheads can be offset from one another using a motor that adjusts spacing, e.g., in between scans. Considering only target region 104 and the nozzle (1) on each printhead, it would be possible to deposit the 50.00 pL in a four passes, for example, with a first printhead pass in which printhead D and printhead E both fire a droplet into the target region, and three subsequent passes in which only printhead E fires a droplet into the target region. Other combinations are possible using even fewer passes that can still generate volumes in the target region close to the 50.00 pL target, for example, within a range of 49.75 pL and 50.25 pL. Considering again only target region 104 and the nozzle (1) on each printhead, it would be possible to deposit 49.83 pL in two passes, for example, with a first printhead pass in which printheads C, D, and E all fire a droplet into the target region, and a second printhead pass in which printheads D and E both fire a droplet into the target region. Similarly, different combinations of nozzles from different printheads can be used concurrently in each pass to generate volumes in each of the target regions that is close to the target values without any offset in scan path. Therefore, using multiple passes in this manner would be advantageous for embodiments where it is desired to concurrently deposit droplets in different target regions (i.e., in different rows of pixels for example). Once again, statistical accuracy can be ensured by planning droplet measurement in a manner calculated to obtain desired statistical characteristics associated with per-nozzle and/or per-drive waveform droplet volumes and associated means.

TABLE 1B

| Printhead | Nozzle | | | | |
|---|---|---|---|---|---|
| | (1) | (2) | (3) | (4) | (5) |
| A | 9.80 | 10.01 | 9.89 | 9.96 | 10.03 |
| B | 9.70 | 9.90 | 9.81 | 9.82 | 9.94 |
| C | 9.89 | 10.10 | 9.99 | 10.06 | 10.13 |
| D | 9.96 | 10.18 | 10.07 | 10.15 | 10.25 |
| E | 10.01 | 10.23 | 10.12 | 10.21 | 10.31 |

All of the same approaches apply equally to the hypothetical of FIG. 1B. Again considering only target region 154 and the nozzles (1) and (2) on each printhead (i.e. the nozzles that overlap with target region 154 during a scan), it is possible to deposit 50.00 pL in two passes, for example, with a first printhead pass in which printheads C and E fire nozzle (1) and printheads B and C fire nozzle (2), and a second printhead pass in which printhead C fires nozzle (2). It is also possible to deposit 49.99 pL (clearly within an example target range of 49.75 pL and 50.25 pL with high statistical accuracy) in a single pass, for example, with a printhead pass in which printheads C, D, and E fire nozzle (1) and printheads B and E fire nozzle (2).

It should also be apparent that, optionally combined with scan path offsets, the use of alternate nozzle firing waveforms dramatically increases the number of droplet volume combinations that can be achieved for a given printhead, and these options are yet further increased by the use of multiple printheads (or equivalently, multiple rows of nozzles) as described above. For example, in the hypothetical example conveyed by the discussion of FIG. 1 above, a combination of five nozzles with respective inherent ejection characteristics (e.g., droplet volumes) and eight alternate waveforms could provide literally many thousands of different sets of possible droplet volume combinations. Optimizing sets of nozzle-waveform combinations, and selecting a particular set of nozzle-waveform combinations for each target region (or for each row of print wells in an array) enables further optimization of printing according to the desired criteria. In embodiments that use multiple printheads (or rows of printhead nozzles), the ability to selectively offset those printheads/rows also further enhances the number of combinations that can be applied per printhead/substrate scan. Once again, for these embodiments, given that multiple sets (of one or more) nozzle-waveform combinations can alternatively be used to achieve specified fill volumes, this embodiment selects a particular one of the "acceptable" sets for each target region, with this selection of the particular one across target regions generally corresponding to the concurrent printing of multiple target regions using multiple nozzles. That is, by varying parameters to minimize the time over which printing occurs, these embodiments each enhance manufacturing throughput, and facilitate minimizing the number of required printhead/substrate scans or "passes," the raw distance of relative printhead/substrate movement along a particular dimension(s), or that help satisfy some other criteria.

Many other processes can be used or combined with the various techniques introduced above. For example, it is possible to "tune" the nozzle drive waveform on a per-nozzle basis to reduce variation in per-nozzle droplet volumes (e.g., shaping of the drive pulse, by changing drive voltage, rise or fall slopes, pulse width, decay time, number and respective levels of pulses used per droplet, and so forth).

While certain applications discussed in this document refer to fill volumes in discrete fluid receptacles or "wells," it is also possible to use the mentioned techniques to deposit a "blanket coating" having large geographies relative to other structures of the substrate (e.g., such as relative to transistors, pathways, diodes and other electronic components). In such a context, fluidic ink carrying layer materials (e.g., that will be cured, dried or hardened in situ to form a permanent device layer) will spread to a certain extent, but will (given ink viscosity and other factors) still retain specific characteristics relative to other target deposition regions of the substrate. It is possible to use the techniques herein in this context, for example, to deposit blanket layers such as encapsulation or other layers with specific, localized control over ink fill volumes for each target region. The techniques discussed herein are not limited by the specifically-presented applications or embodiments.

Other variations, advantages and applications from the techniques introduced above will be readily apparent to those skilled in the art. This is to say, these techniques can be applied to many different areas and are not limited to the fabrication of display devices or pixelated devices. A print "well" as used herein refers to any receptacle of a substrate that is to receive deposited ink, and thus has chemical or structural characteristics adapted to constrain the flow of that ink. As will be exemplified for OLED printing below, this can include situations were respective fluid receptacles are to each receive a respective volume of ink and/or a respective type of ink; for example, in a display application where the mentioned techniques are used to deposit light emitting materials of different colors, successive printing processes can be performed for each color, using respective printheads and respective inks—in this case, each process could deposit "every third well" in an array (e.g., for every "blue" color component), or equivalently, every well in a third array (which intersperses wells with overlapping arrays for other color components). Each print well is an example of one possible type of target region. Other variations are also possible. Note also that "rows" and "columns" are used in this disclosure without implying any absolute direction. For example, a "row" of print wells could extend the length of or width of a substrate, or in another manner (linear or non-linear); generally speaking, "rows" and "columns" will be used herein to refer to directions that each represent at least one independent dimension, but this need not be the case for all embodiments. Also, note that because modern printers can use relative substrate/printhead motion that involves multiple dimensions, relative movement does not have to be linear in path or speed, which is to say, printhead/substrate relative motion does not have to follow a straight or even a continuous path or constant velocity. Thus, a "pass" or "scan" of a printhead relative to a substrate simply refers to an iteration of depositing droplets using multiple nozzles over multiple target regions that involves relative printhead/substrate motion. In many embodiments described below for a OLED printing process, however, each pass or scan can be a substantially continuous, linear motion, with each ensuing pass or scan being parallel to the next, offset by a geometric step relative to one another. This offset, or geometric step, can be a difference in pass or scan starting position, average position, finishing position, or some other type of positional offset, and does not imply necessarily parallel scan paths. It is also noted that various embodiments discussed herein speak of "concurrent" use of different nozzles to deposit in different target regions (e.g., different rows of target regions); this term "concurrent" does not require simultaneous droplet ejection, but rather, merely refers to the notion that during any scan or pass, different nozzles or groups of nozzles can be used to fire ink into respective target regions on a mutually-exclusive basis. For example, a first group of one or more nozzles can be fired during a given scan to deposit first droplets in a first row of fluid wells, while a second group of one or more nozzles can be fired during this same given scan to deposit second droplets into a second row of fluid wells. The term "printhead" refers to a unitary or modular device having one or more nozzles that are used to print (eject) ink toward a substrate. A "printhead assembly" by contrast refers to an assembly or modular element that supports one or more printheads as a group for common positioning relative to a substrate; thus, a printhead assembly in some embodiments can include only a single printhead, whereas in other embodiments, such an assembly includes six or more printheads. In some implementations, individual printheads can be offset relative to one another within such an assembly. Note that in a typical embodiment used for large scale manufacturing processes (e.g., television flat panel displays), the printhead assembly can be quite large, encompassing many thousands of print nozzles; depending on implementation, such an assembly can be large, with droplet measurement mechanisms discussed herein designed to articulate around such an assembly to obtain per droplet measurements. For example, with a printhead assembly having six printheads and approximately 10,000 or more print nozzles, the printhead assembly can be "parked" within the printer, within an off-(printing)axis service station, for various support operations including droplet measurement.

Figure 7:
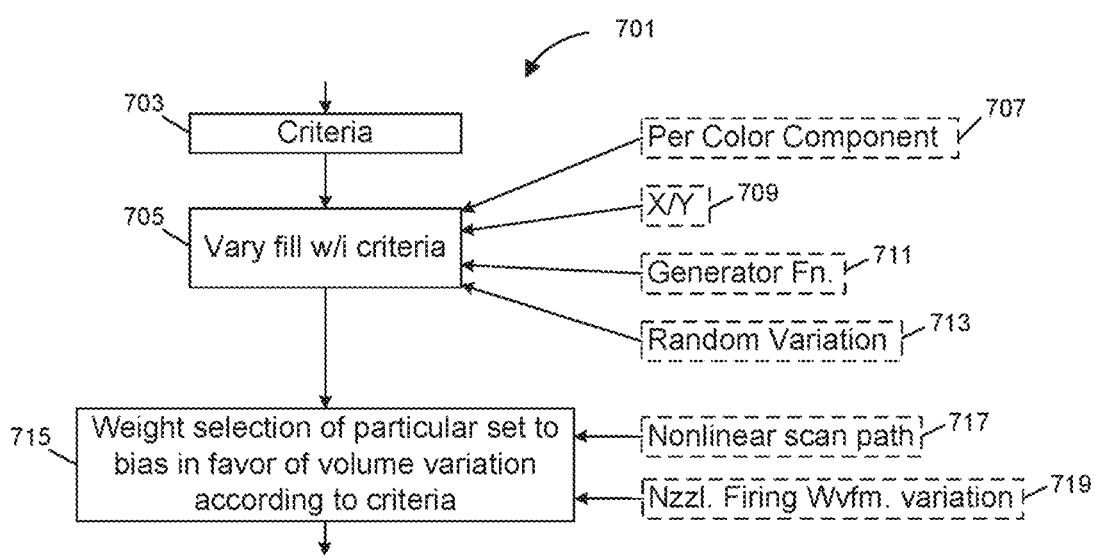
FIG. 7 provides a block diagram for deliberately varying fill volumes within acceptable tolerances in order to reduce visual artifacts in a display device.
Figure 8A:
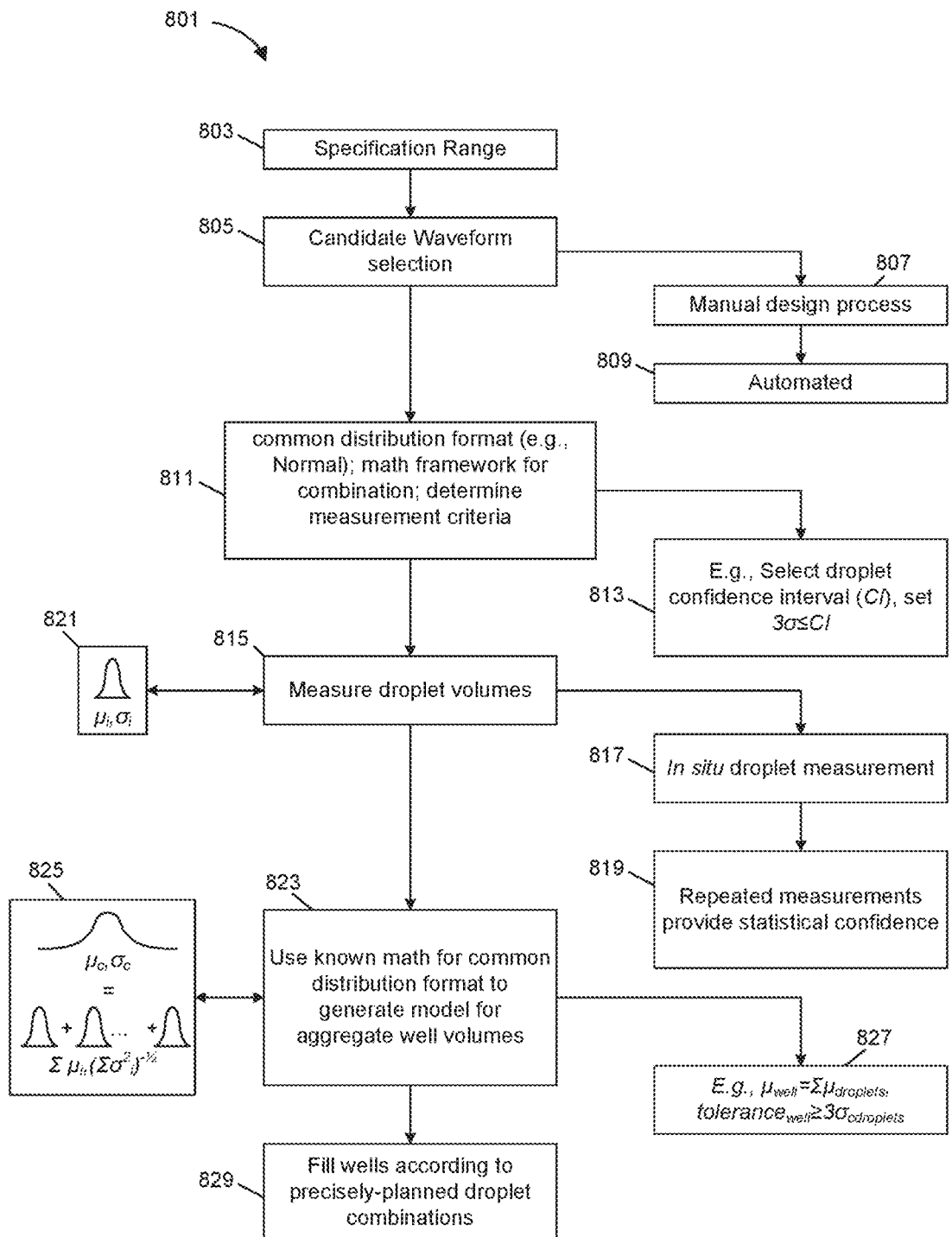
FIG. 8A provides a block diagram showing how a droplet measurement can be used to accommodate statistical variation of droplet volume per nozzle and per drive waveform, and yet permit precise aggregate ink fills within a given target region.
Figure 8B:
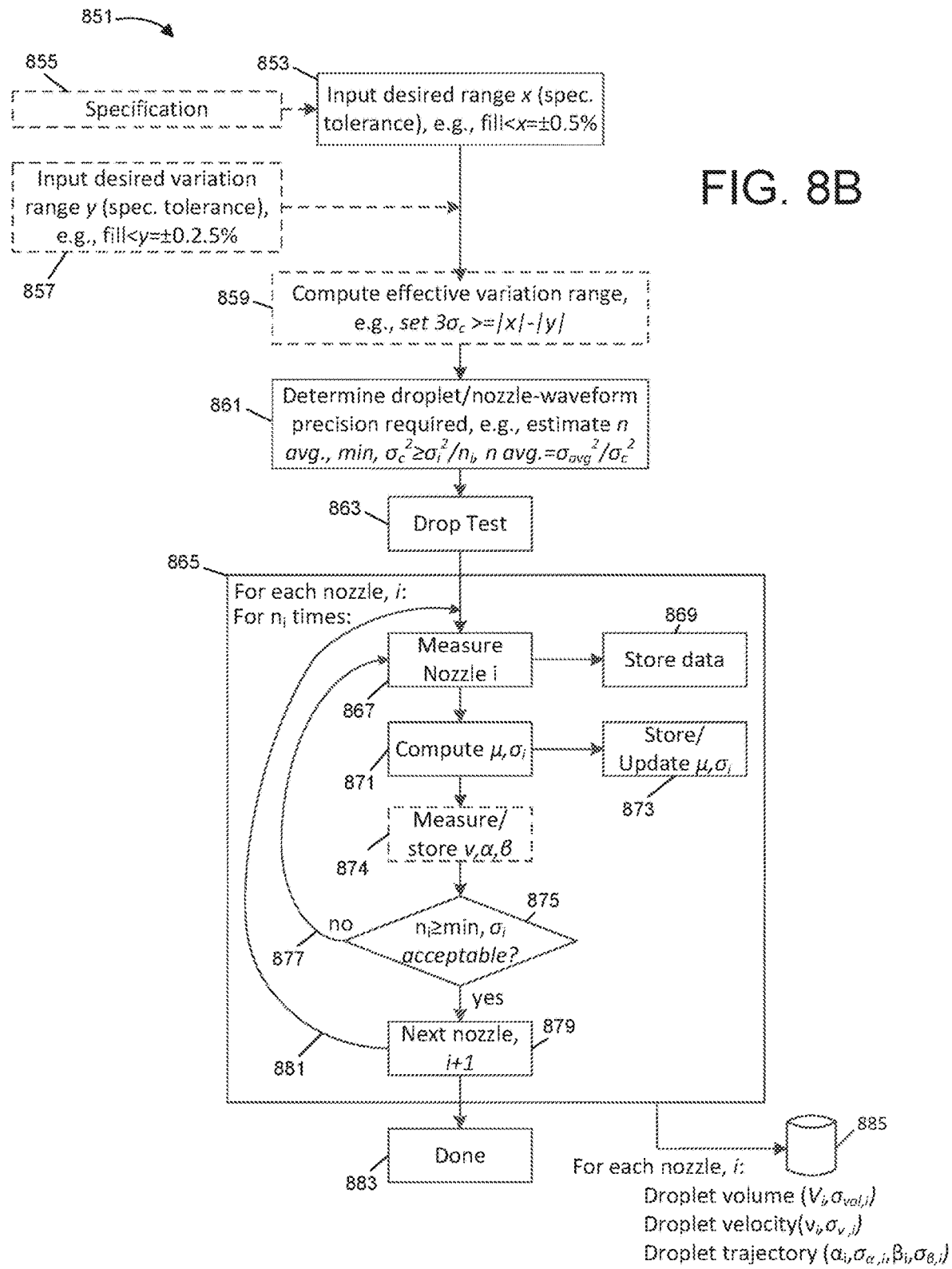
FIG. 8B provides a block diagram showing how droplet measurement can be planned so as to accommodate statistical variation of droplet volume per nozzle and per drive waveform, and yet permit precise aggregate ink fills within a given target region.
Figure 11:
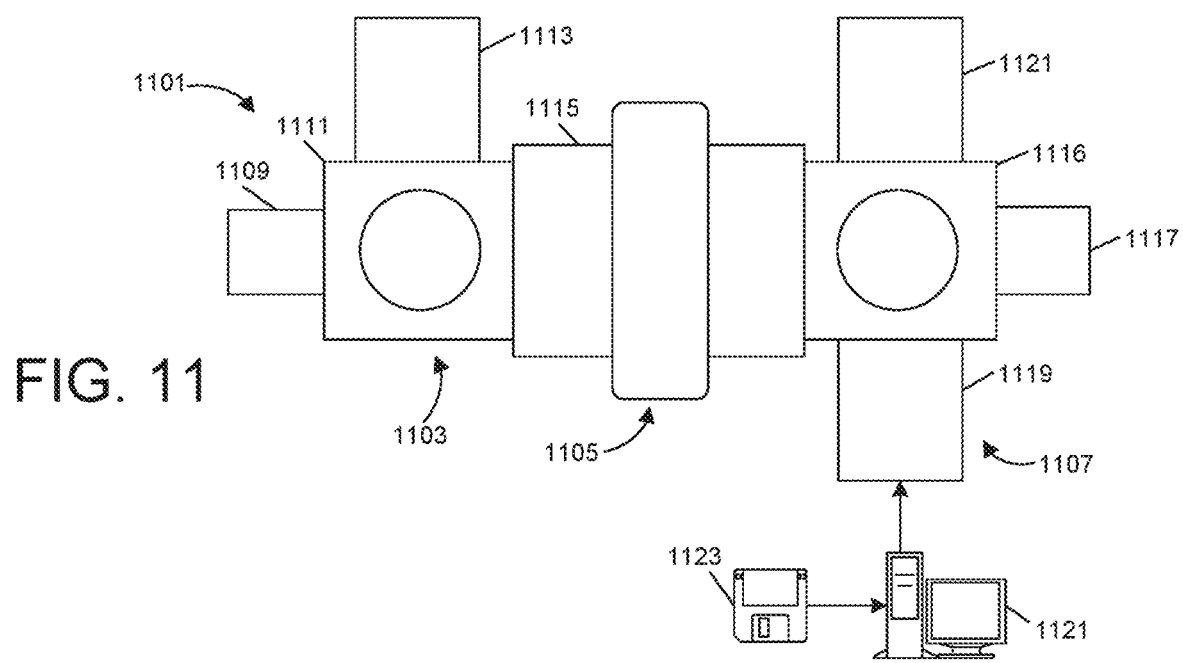
FIG. 11 shows a plan view of a printer used as part of a fabrication apparatus; the printer can be within a gas enclosure that permits printing to occur in a controlled atmosphere.
Figure 12:
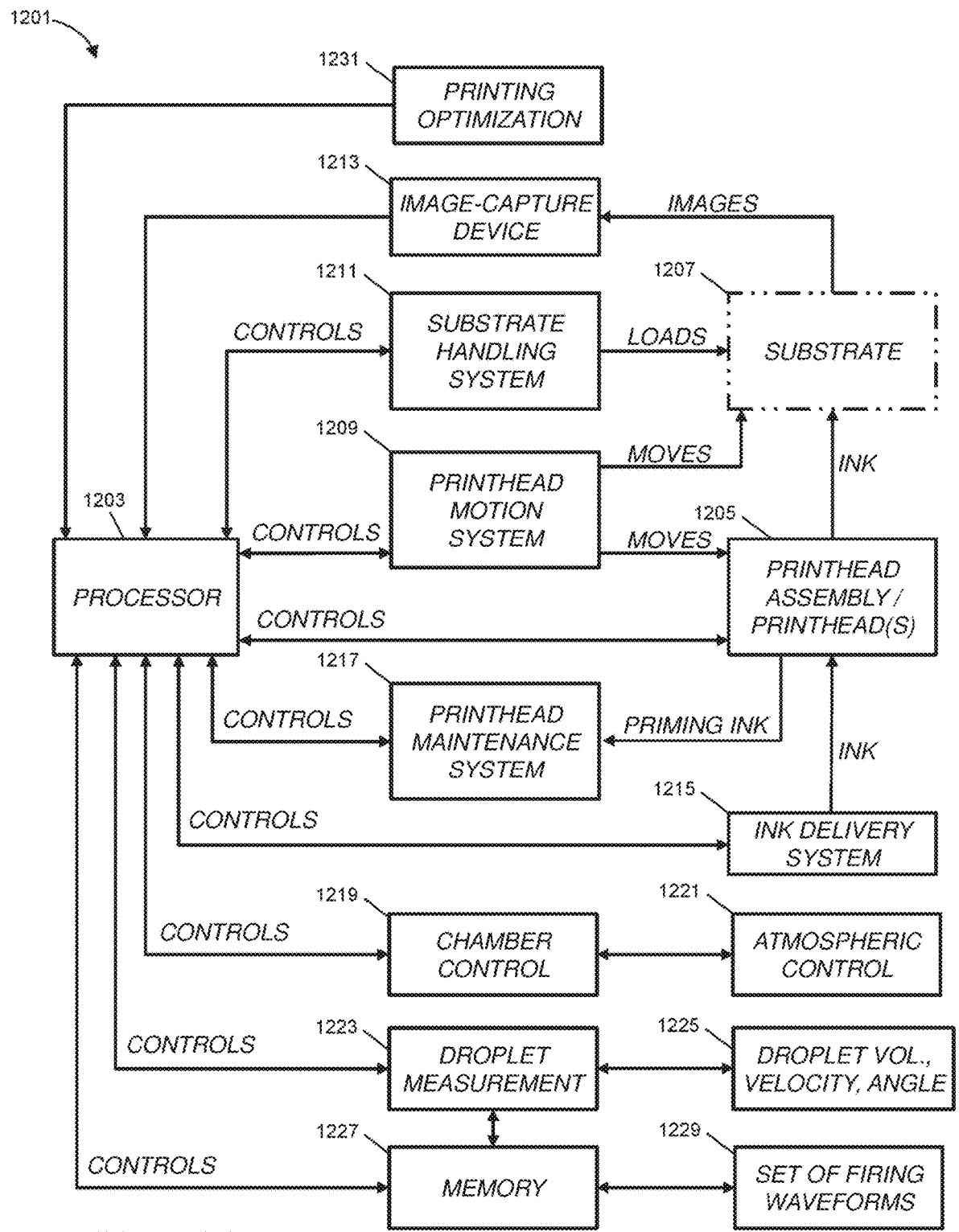
FIG. 12 provides a block diagram of a printer; such a printer can be optionally employed for example in the fabrication apparatus depicted in FIG. 11.
Figure 13A:
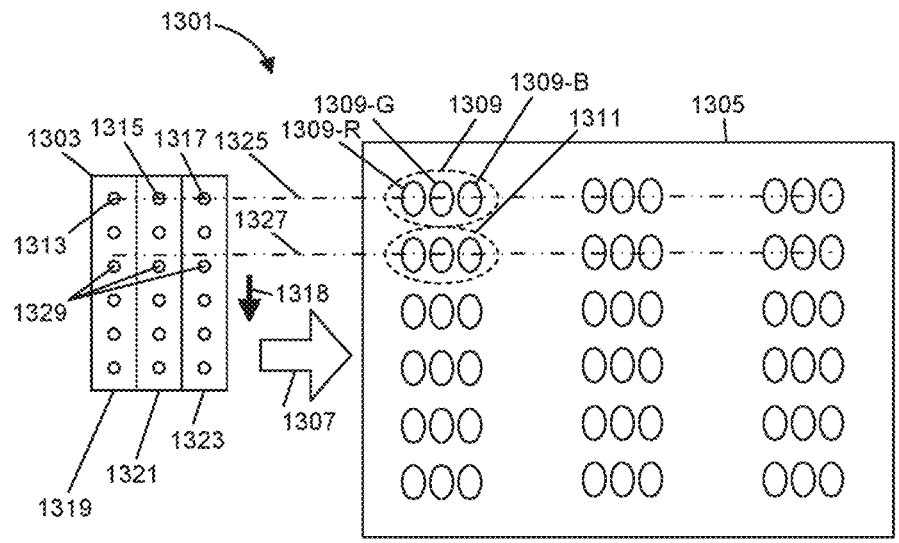
FIG. 13A shows an embodiment where multiple printheads (each with nozzles) are used to deposit ink on a substrate.
Figure 13B:
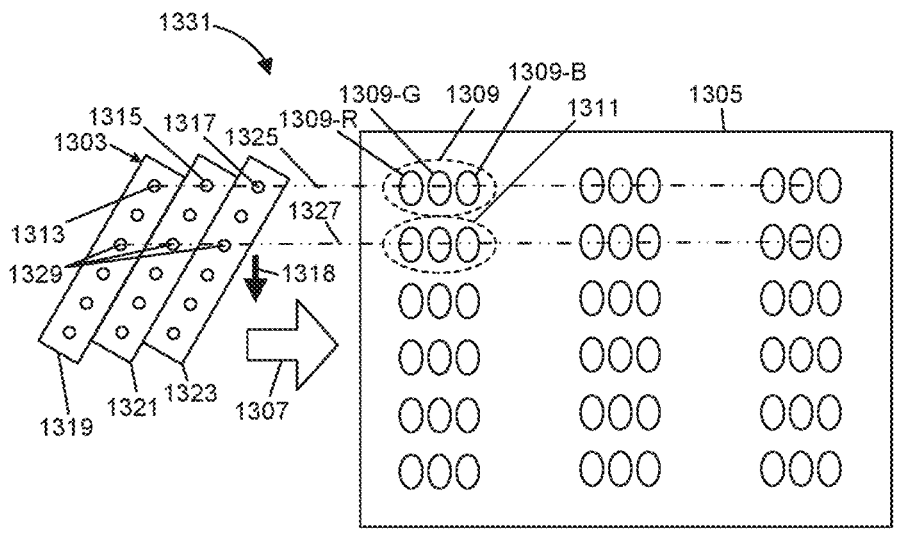
FIG. 13B shows rotation of the multiple printheads to better align nozzles of the respective printheads with the substrate.
Figure 16:
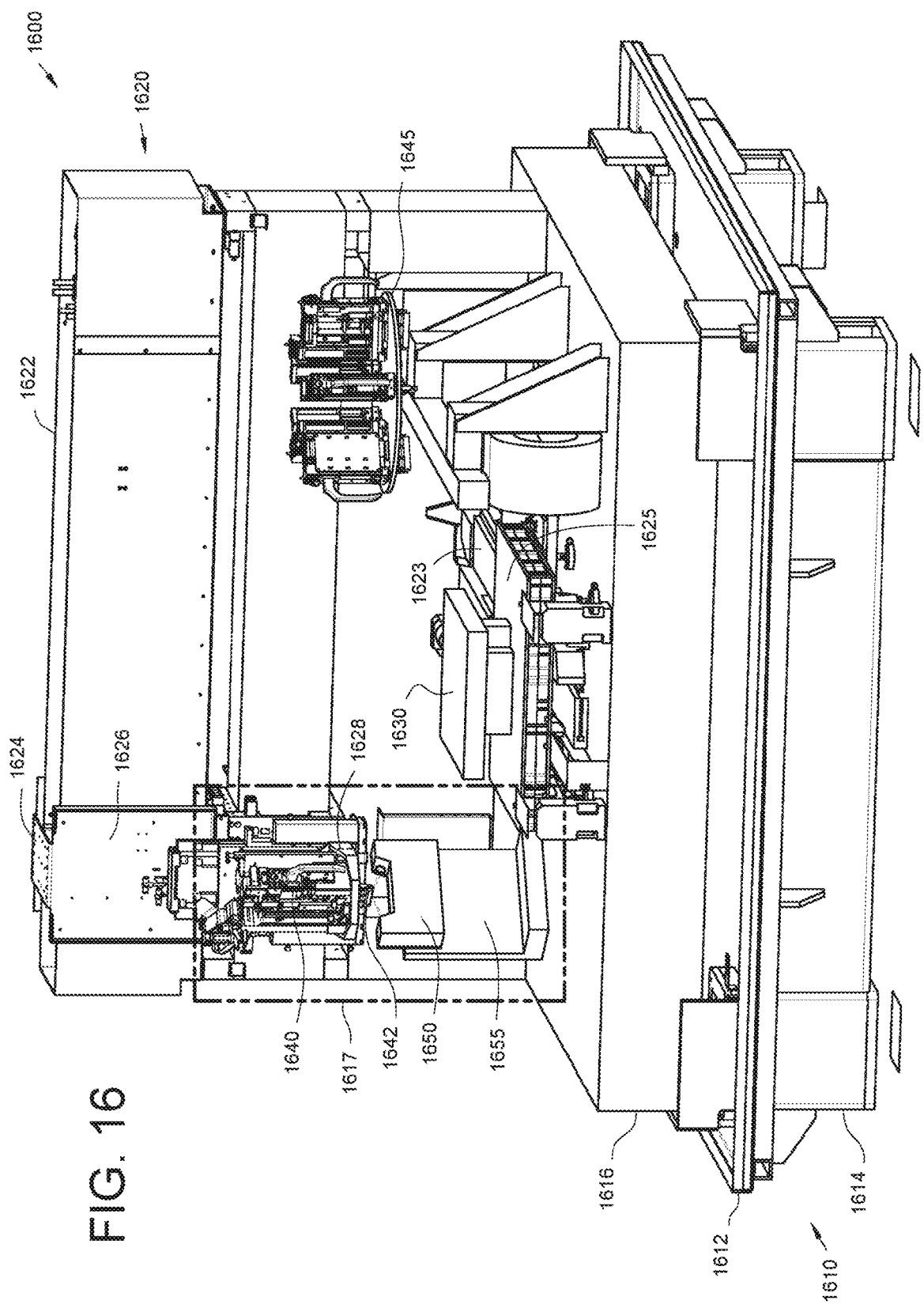
FIG. 16 shows a perspective view of an industrial printer.
Figure 17:
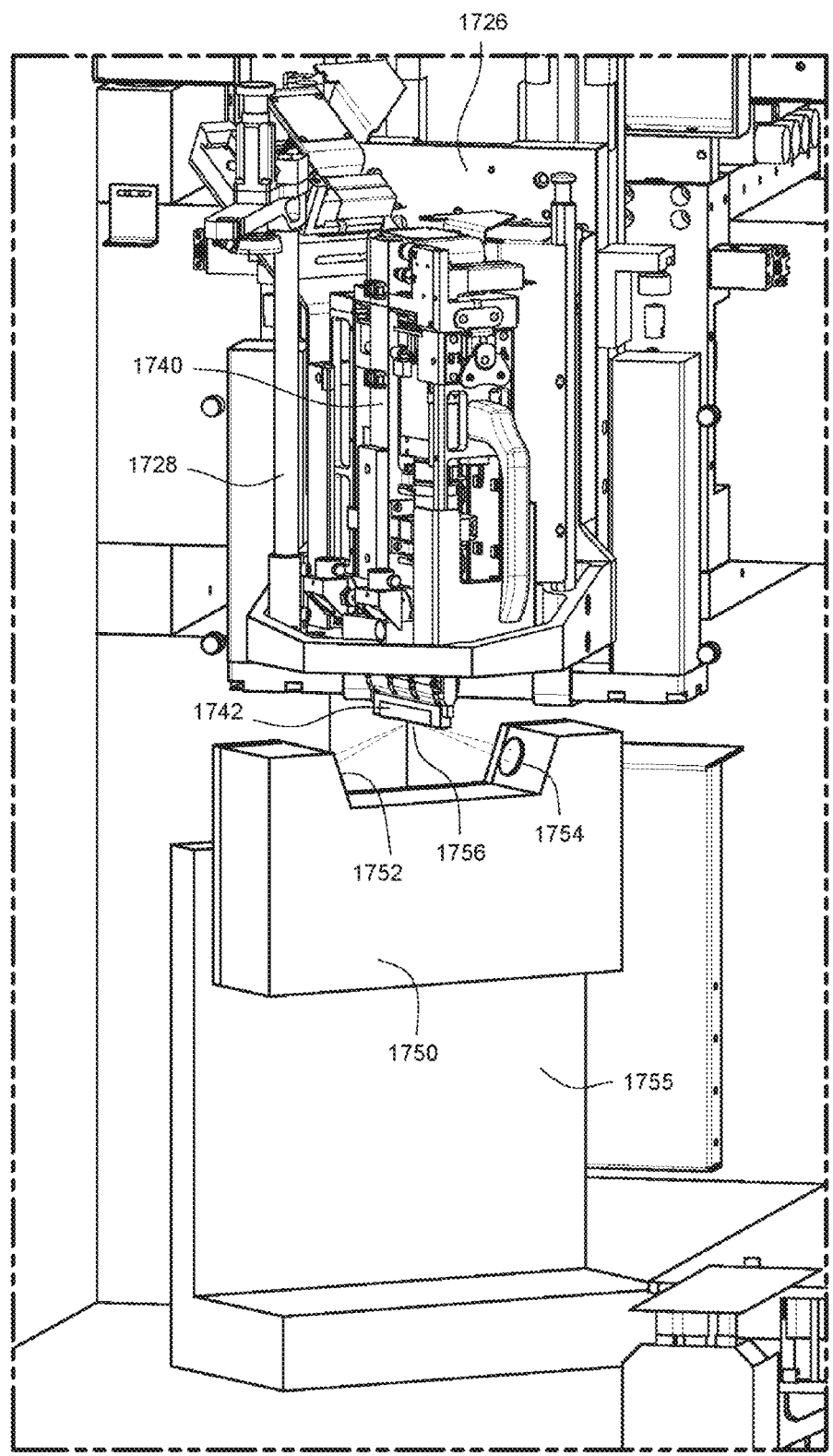
FIG. 17 shows another perspective view of an industrial printer.
Figure 18A:
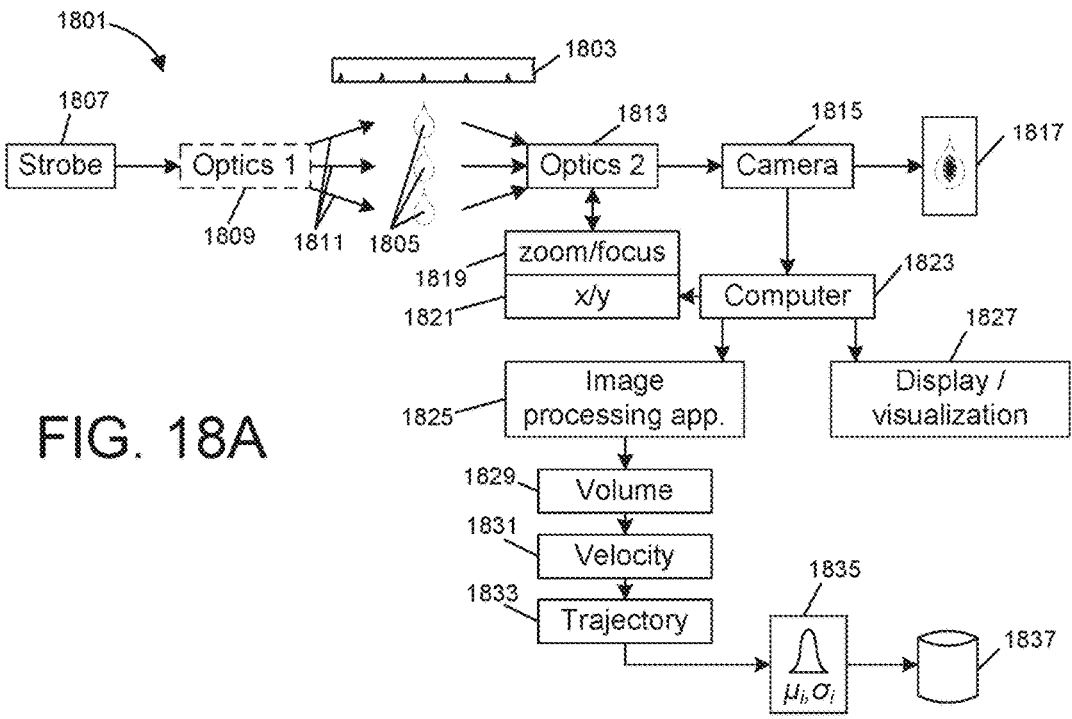
FIG. 18A presents a schematic diagram which shows the layout of components in an embodiment of a shadowgraphy-based droplet measurement system.
Figure 18B:
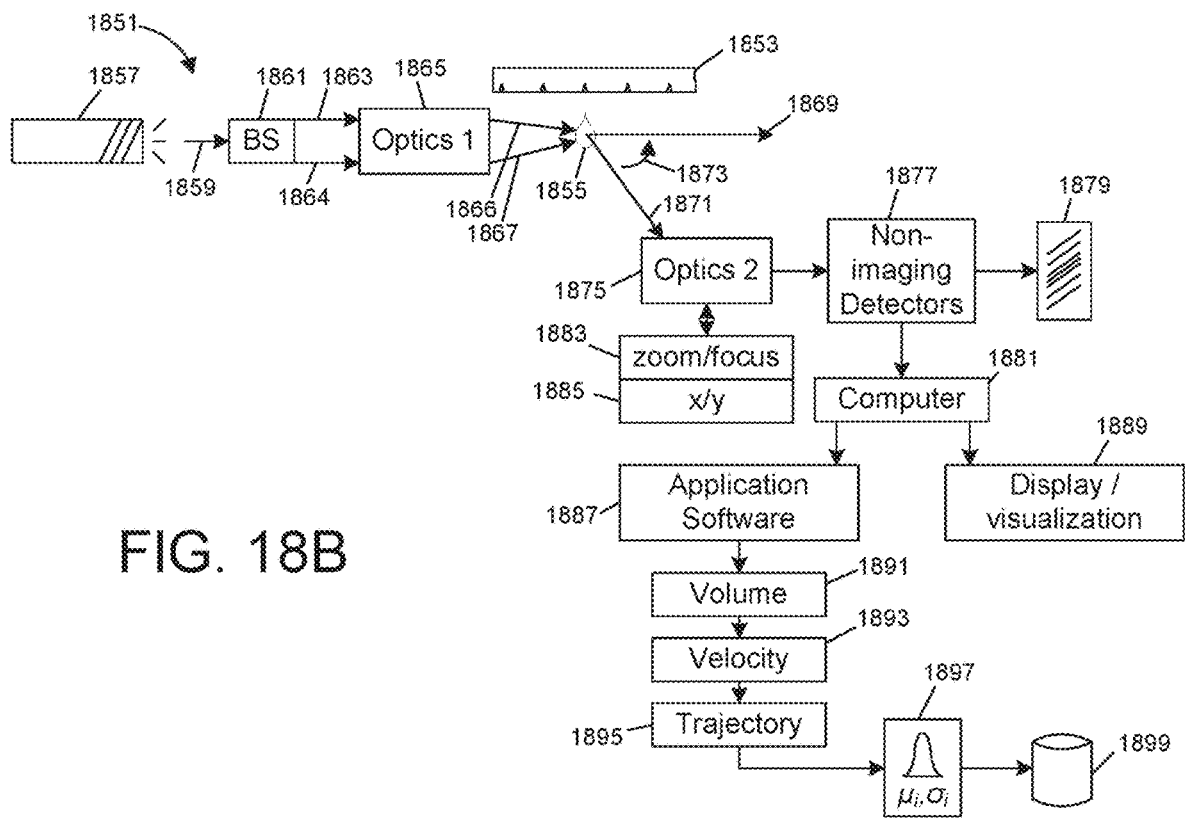
FIG. 18B presents a schematic diagram which shows the layout of components in an embodiment of an interferometry-based droplet measurement system.
Figure 19:
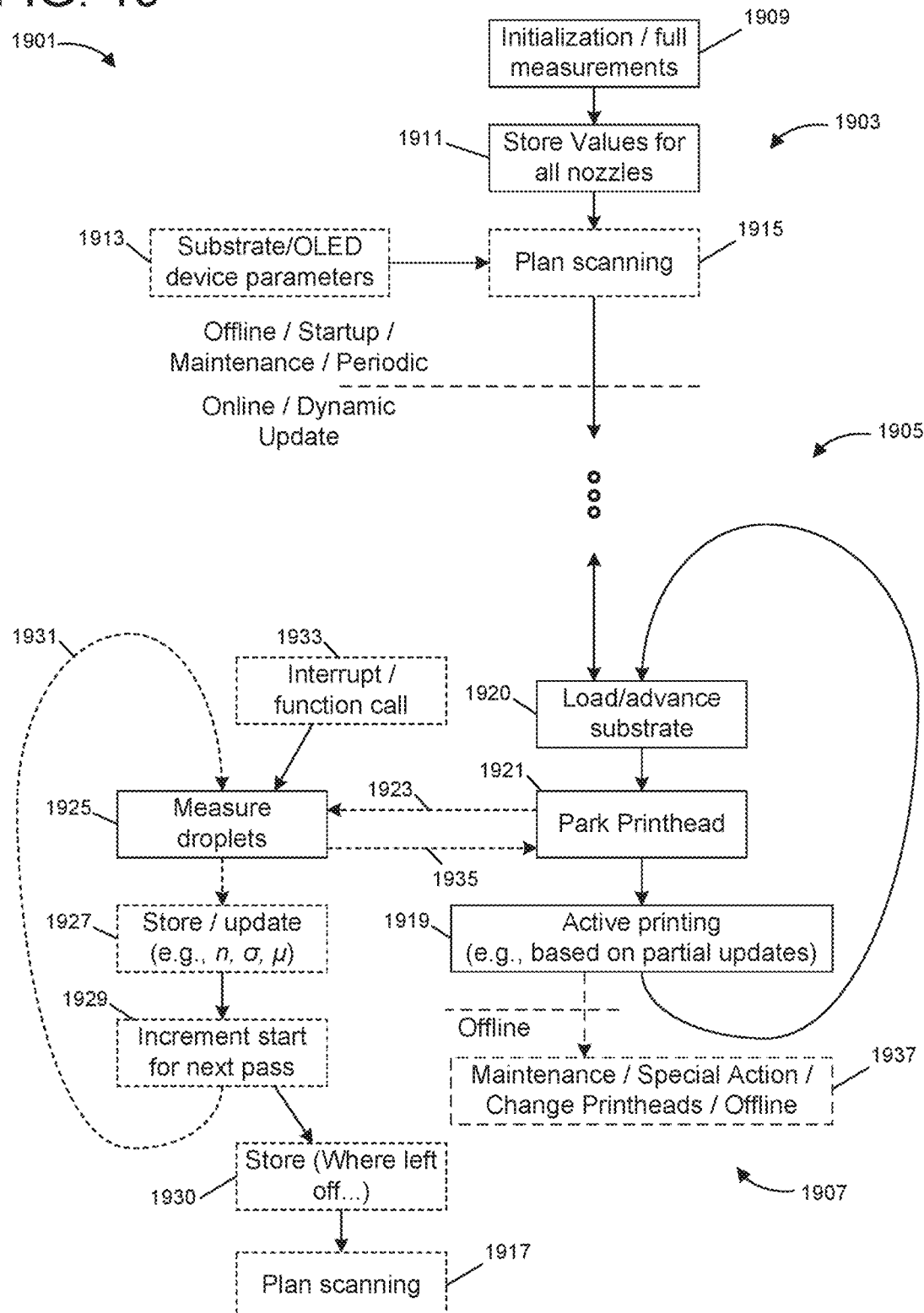
FIG. 19 shows a flow diagram associated with one illustrative process that integrates a droplet measurement system with an industrial printer, optionally used for OLED device fabrication.

With principal parts of several different embodiments thus laid out, this disclosure will be roughly organized as follows. FIGS. 2A-2E will be used to introduce certain droplet measurement configurations for imaging large-scale printhead assemblies. These configurations can optionally be integrated within a printer, for example, a flat panel display fabrication device that prints ink material that will form a permanent thin film layer on a flat panel device substrate. In optional implementations, these configurations can use three dimensional articulation of part or all of the optics associated with droplet measurement, e.g., to articulate about a printhead assembly with multiple printheads and thousands of ink jet nozzles which has been parked in a service station of a printer. FIGS. 3A-4D will be used to introduce some general principles relating to the nozzle consistency issue, OLED printing/fabrication, and how embodiments address the nozzle consistency issue. These techniques can optionally be used with the mentioned droplet measurement configurations. FIGS. 5-7 will be used to exemplify software processes that can be used to plan droplet combinations for each target region of the substrate. FIGS. 8A-B are used to illustrate principles associated with building a statistical model of droplet volume for each nozzle/waveform combination, and for using these models to produce a statistical model of aggregate ink fill for each target region. These principles can optionally be used in conjunction with droplet measurement to reliably produce composite ink fills (i.e., through the use of planned droplet combinations) that meet specified tolerance ranges with quantifiable certainty (e.g., with a 99% or better confidence per target region), notwithstanding nozzle consistency issues. FIGS. 9A-10C are used to present some empirical data, that is, which demonstrates effectiveness of the mentioned planned droplet combination techniques in improving target region fill consistency. FIGS. 11-12 will be used to discuss an exemplary application to OLED panel fabrication, and associated printing and control mechanisms. FIGS. 13A-13C are used to discuss printhead offsets that can be used to vary droplet combinations that can be deposited with each scan. FIGS. 14A-15D are used to further discuss different, alternate nozzle firing waveforms, applied to provide for different droplets volumes or combinations. FIGS. 16-17 will provide additional detail on the structure and configuration of an industrial printer which includes a droplet measurement device. FIGS. 18A and 18B will respectively be used to discuss certain detailed embodiments of a droplet measurement system, for example, integrated with such an industrial printer. FIG. 19 will be used to discuss techniques for hiding droplet measurement times behind other system processes, so as to maximize production time. Finally, FIG. 20 will be used to discuss another embodiment of droplet measurement, including some specific principles relating to z-axis offset from a printhead and related calibration, and measurement and correction of nozzle bow.

FIGS. 2A-2E are used to generally introduce techniques for per-nozzle droplet measurement.

Figure 2A:
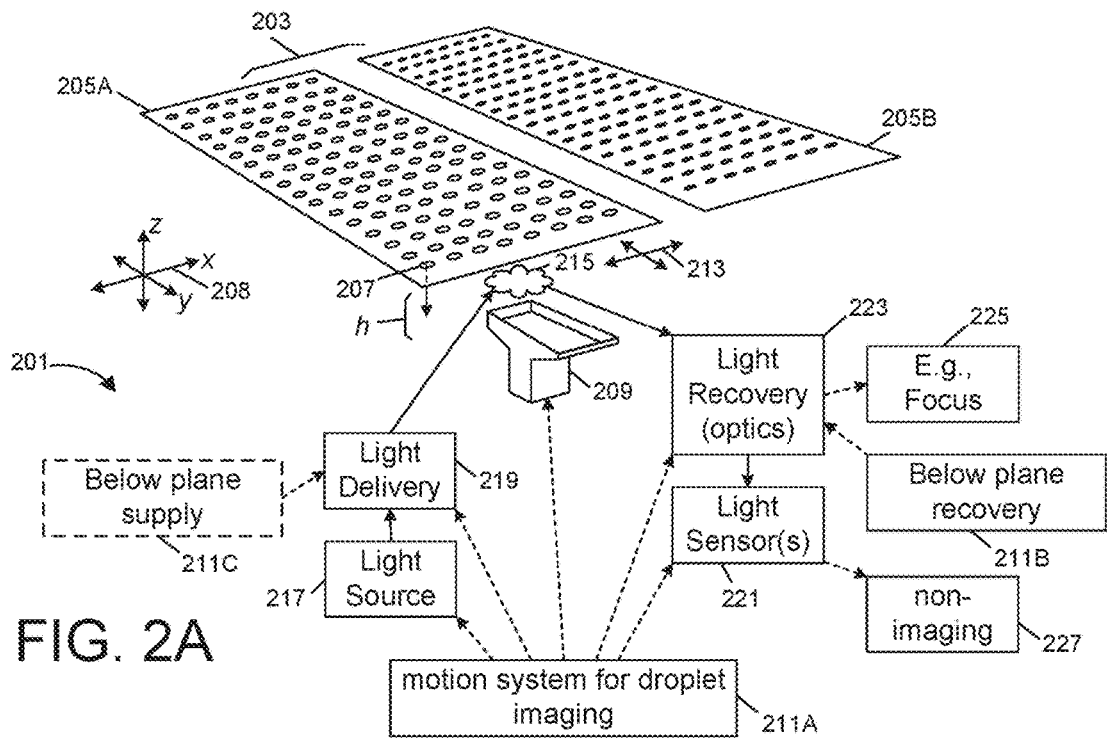
FIG. 2A is an illustrative diagram that shows a droplet measurement system capable of measuring droplet volumes for each nozzle of a large printhead assembly.

More particularly, FIG. 2A provides an illustrative view depicting an optics system 201 and a relatively large print head assembly 203; the print head assembly has multiple printheads (205A/205B) each with a multitude of individual nozzles (e.g., 207), with hundreds-to-thousands of nozzles present. An ink supply (not shown) is fluidically connected with each nozzle (e.g., nozzle 207), and a piezoelectric transducer (also not shown) is used to jet droplets of ink under the control of a per-nozzle electric control signal. The nozzle design maintains slightly negative pressure of ink at each nozzle (e.g., nozzle 207) to avoid flooding of the nozzle plate, with the electric signal for a given nozzle being used to activate the corresponding piezoelectric transducer, pressurize ink for the given nozzle, and thereby expel droplets from the given nozzle. In one embodiment, the control signal for each nozzle is normally at zero volts, with a positive pulse or signal level at a given voltage used for a specific nozzle to eject droplets (one per pulse) for that nozzle; in another embodiment, different, tailored pulses (or other, more complex waveforms) can be used nozzle-to-nozzle. In connection with the example provided by FIG. 2A, however, it should be assumed that it is desired to measure a droplet volume produced by a specific nozzle (e.g., nozzle 207) where a droplet is ejected downward from the printhead (i.e., in the direction "h," representing z-axis height relative to a three-dimensional coordinate system 208) to be collected by a spittoon 209. Note that in a typical application, the dimension of "h" is typically on the order of one millimeter or less and that there are thousands of nozzles (e.g., 10,000 nozzles) that are to have respective nozzles individually measured in this manner within an operating printer. Thus, in order to optically measure each droplet with precision (i.e., droplets originating from a specific one of thousands of nozzles in a large printhead assembly environment, within the approximately millimeter measurement window, as just described), certain techniques are used in disclosed embodiments to precisely position elements of the optics assembly 201, the printhead assembly 203, or both relative to one another for optical measurement.

In one embodiment, these techniques utilize a combination of (a) x-y motion control (211A) of at least part of the optical system (e.g., within dimensional plane 213) to precisely position a measurement area 215 immediately adjacent to any nozzle that is to produce a droplet for optical calibration/measurement and (b) below plane optical recovery (211B) (e.g., thereby permitting easy placement of the measurement area next to any nozzle notwithstanding a large printhead surface area). Thus, in an exemplary environment having about 10,000 or more print nozzles, this motion system is capable of positioning at least part of the optical system in (e.g.) 10,000 or so discrete positions proximate to the discharge path of each respective nozzle of the printhead assembly. As will be discussed below, two contemplated optical measurement techniques include shadowgraphy and interferometry. With each, optics are typically adjusted in position so that precise focus is maintained on the measurement area so as to capture droplets in-flight (e.g., to effectively image the droplet's shadow in the case of shadowgraphy). Note that a typical droplet may be on the order of microns in diameter, so the optical placement is typically fairly precise, and presents challenges in terms of relative positioning of the printhead assembly and measurement optics/measurement area. In some embodiments, to assist with this positioning, optics (mirrors, prisms, and so forth) are used to orient a light capture path for sensing below the dimensional plane 213 originating from the measurement area 215, such that measurement optics can be placed close to the measurement area without interfering with relative positioning of the optics system and printhead. This permits effective positional control in a manner that is not restricted by the millimeter-order deposition height h within which a droplet is imaged or the large scale x and y width occupied by a print head under scrutiny. With interferometry-based droplet measurement techniques, separate light beams incident from different angles on a small droplet creates interference patterns detectable from a perspective generally orthogonal to the light paths; thus, optics in such a system capture light from an angle of approximately ninety-degrees off of paths of the source beams, but also in a manner that utilizes below plane optical recovery so as to measure droplet parameters. Other optical measurement techniques can also be used. In yet another variant of these systems, the motion system 211A is optionally and advantageously made to be an xyz-motion system, which permits selective engagement and disengagement of the droplet measurement system without moving the printhead assembly during droplet measurement. Briefly introduced, it is contemplated in an industrial fabrication device having one or more large print head assemblies that, to maximize manufacturing uptime, each printhead assembly will be "parked" in a service station from time to time to perform one or more maintenance functions; given the sheer size of the printhead and number of nozzles, it can be desired to perform multiple maintenance functions at once on different parts of the printhead. To this effect, in such an embodiment, it can be advantageous to move measurement/calibration devices around the printhead, rather than vice-versa. [This then permits engagement of other non-optical maintenance processes as well, e.g., relating to another nozzle if desired.] To facilitate these actions, the printhead assembly can be optionally "parked," with the system identifying a specific nozzle or range of nozzles that are to be the subject of optical calibration. Once the printhead assembly or a given printhead is stationary, the motion system 211A is engaged to move at least part of the optics system relative to the "parked" printhead assembly, to precisely position the measurement area 215 at a position suitable for detecting a droplet jetted from a specific nozzle; the use of a z-axis of movement permits selective engagement of light recovery optics from well below the plane of the printhead, facilitating other maintenance operations in lieu of or in addition to optical calibration. Perhaps otherwise stated, the use of an xyz-motion system permits selective engagement of a droplet measurement system independent of other tests or test devices used in a service station environment. Note that this structure is not required for all embodiments; for example, in connection with FIGS. 16-17 below, a mechanism will be described that permits motion of both the measurement assembly and the printhead assembly, e.g. z-axis motion of the printhead assembly relative to a measurement assembly having x-y motion for purposes of droplet measurement. Other alternatives are also possible, in which only the printhead assembly moves and the measurement assembly is stationary or in which no parking of the printhead assembly is necessary.

Generally speaking, the optics used for droplet measurement will include a light source 217, an optional set of light delivery optics 219 (which direct light from the light source 217 to the measurement area 215 as necessary), one or more light sensors 221, and a set of recovery optics 223 that direct light used to measure the droplet(s) from the measurement area 215 to the one or more light sensors 221. The motion system 211A optionally moves any one or more of these elements together with spittoon 209 in a manner that permits the direction of post-droplet measurement light from the measurement area 215 around spittoon 209 to a below-plane location, while also providing a receptacle (e.g., spittoon 209) to collect jetted ink. In one embodiment, the light delivery optics 219 and/or the light recovery optics 223 use mirrors that direct light to/from measurement area 215 along a vertical dimension parallel to droplet travel, with the motion system moving each of elements 217, 219, 221, 223 and spittoon 209 as an integral unit during droplet measurement; this setup presents an advantage that focus need not be recalibrated relative to measurement area 215. As noted by numeral 211C, the light delivery optics are also used to optionally supply source light from a location below the dimensional plane 213 of the measurement area, e.g., with both light source 217 and light sensor(s) 221 directing light on either side of spittoon 209 for purposes of measurement, as generally illustrated. As noted by numerals 225 and 227, the optics system can optionally include lenses for purposes of focus, as well as photodetectors (e.g., for non-imaging techniques that do not rely on processing of a many-pixeled "picture"). Note once again that the optional use of z-motion control over the optics assembly and spittoon permits optional engagement and disengagement of the optics system, and precise positioning of measurement area 215 proximate to any nozzle, at any point in time while the printhead assembly is "parked." Such parking of the printhead assembly 203 and xyz-motion of the optics system 201 is not required for all embodiments. For example, in one embodiment, laser interferometry is used to measure droplet characteristics, with either the printhead assembly (and/or the optics system) is moved within or parallel to the deposition plane (e.g., within or parallel to plane 213) to image droplets from various nozzles; other combinations and permutations are also possible.

Figure 2B:
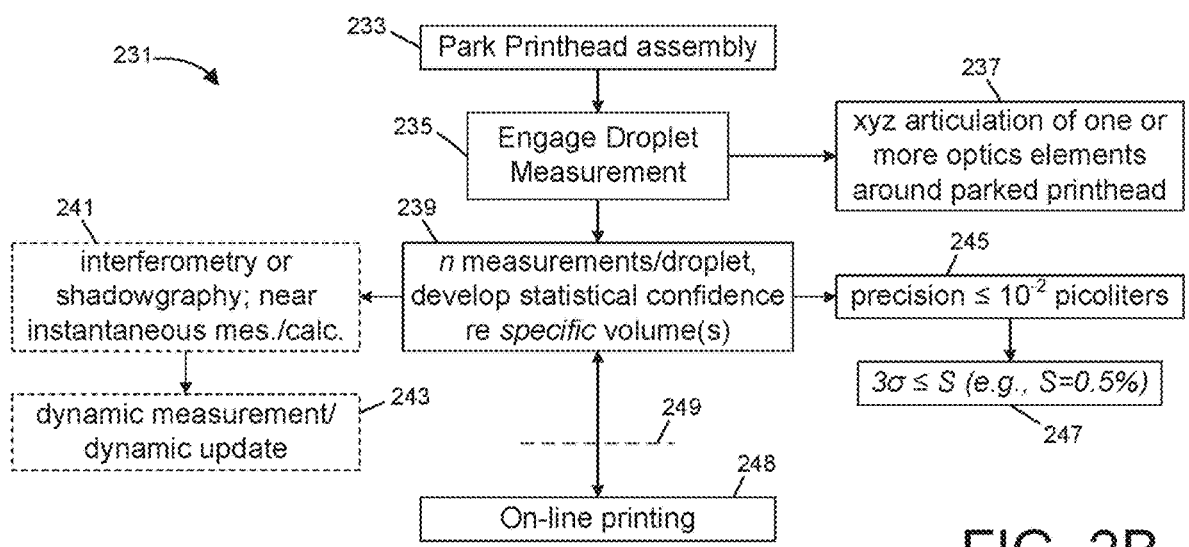
FIG. 2B is a method diagram that shows various processes and options associated with measurement of droplet volumes for each nozzle.

FIG. 2B provides flow of a process associated with droplet measurement for some embodiments. This process flow is generally designated using numeral 231 in FIG. 2B. More specifically, as indicated by reference numeral 233, in this particular process, the printhead assembly is first parked, for example, in a service station (not shown) of a printer or deposition apparatus. A droplet measurement device is then engaged (235) with the printhead assembly, for example, by selective engagement of part or all of an optics system through movement from below a deposition plane into a position where the optics system is capable of measuring individual droplets. Per numeral 237, this motion relative of one or more optics-system components relative to a parked printhead can optionally be performed in x, y and z dimensions.

As alluded to previously, even a single nozzle and associated nozzle firing drive waveform (i.e., pulse(s) or signal level(s) used to jet a droplet) can produce droplet volume, trajectory, and velocity that varies slightly from droplet to droplet. In accordance with teachings herein, in one embodiment, the droplet measurement system, as indicated by numeral 239, obtains n measurements per droplet of a desired parameter, to derive statistical confidence regarding the expected properties of that parameter. In one implementation, the measured parameter can be volume, whereas for other implementations, the measured parameter can be flight velocity, flight trajectory or another parameter, or a combination of multiple such parameters. In one implementation, "n" can vary for each nozzle, whereas in another implementation, "n" can be a fixed number of measurements (e.g., "24") to be performed for each nozzle; in still another implementation, "n" refers to a minimum number of measurements, such that additional measurements can be performed to dynamically adjust measured statistical properties of the parameter or to refine confidence. Clearly, many variations are possible. For the example provided by FIG. 28, it should be assumed that droplet volume is being measured, so as to obtain an accurate mean representing expected droplet volume from a given nozzle and a tight confidence interval. This enables optional planning of droplet combinations (using multiple nozzles and/or drive waveforms) while reliably maintaining distributions of composite ink fills in a target region about an expected target (i.e., relative to a composite of droplet means). As noted by optional process boxes 241 and 243, interferometry or shadowgraphy are contemplated optical measurement processes that ideally enable instantaneous or near instantaneous measurement and calculation of volume (or other desired parameter); with such fast-measurement, it becomes possible to frequently and dynamically update volume measurements, for example, to account for changes over time in ink properties (including viscosity and constituent materials), temperature, power supply fluctuation and other factors. Building on this point, shadowgraphy typically features capture of an image of a droplet, for example, using a high resolution CCD camera as a light sensor mechanism; while droplets can be accurately imaged in a single image capture frame at multiple positions (e.g., using a strobed light source), image processing software typically involves a finite amount of time to calculate droplet volume, such that imaging of a sufficient droplet population from a large printhead assembly (e.g., with thousands of nozzles) can take hours. Interferometry, which relies on multiple binary light detectors and detection of interference pattern spacing based on output of such detectors, is a non-imaging technique (i.e., that does not require image analysis) and so produces droplet volume measurements many orders of time faster (e.g., 50×) than shadowgraphy or other techniques; for example, with a 10,000 nozzle printhead assembly, it is expected that large measurement populations for each of the thousands of nozzles can be obtained in minutes, rendering it feasible to frequently and dynamically perform droplet measurement. As noted earlier, in one optional embodiment, droplet measurement (or measurement of other parameters, such as trajectory and/or velocity) can be performed as a periodic, intermittent process, with the droplet measurement system being engaged according to a schedule, or in between substrates (e.g., as substrates are being loaded or unloaded), or stacked against other assembly and/or other printhead maintenance processes. Note that for embodiments that permit alternate nozzle drive waveforms to be used in a manner specific to each nozzle, a rapid measurement system (e.g., interferometric system) readily permits statistical population development for each nozzle and for each alternative drive waveform for that nozzle, thereby facilitating planned droplet combinations of droplets produced by various nozzle-waveform pairings, as alluded to earlier. Per numerals 245 and 247, by measuring expected droplet volume nozzle-by-nozzle (and/or by nozzle-waveform pairing-by-pairing) to a precision of better than 0.01 pL, it becomes possible to plan for very precise droplet combinations per target deposition region, where composite fills can also be planned to 0.01 pL resolution, and where target volumes can be kept within a specified error (e.g., tolerance) range of 0.5% of target volume or better; as indicated by numeral 247, the measurement populations for each nozzle or each nozzle-waveform pairing are in one embodiment planned so as to produce reliability distribution models for each such nozzle or nozzle-waveform pairing, i.e., with $3\sigma$ confidence (or other statistical measure, such as $4\sigma$, $5\sigma$, $6\sigma$; etc.) that is less than the specification maximum fill error. Once sufficient measurements are taken for various droplets, fills involving combinations of those droplets can be evaluated and used to plan printing (248) in the most efficient manner possible. As indicated by separation line 249, droplet measurement can be performed with intermittent switching back and forth between active printing processes and measurement and calibration processes.

Figure 2C:
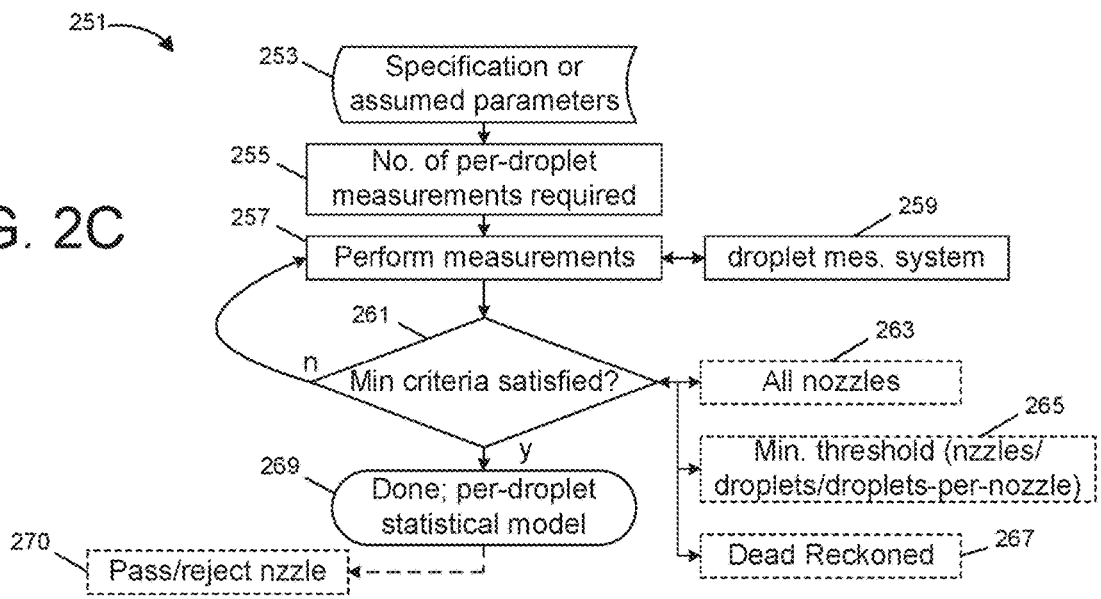
FIG. 2C is a method diagram that shows various processes and options associated with measurement of droplet volumes for each nozzle, to achieve a high-confidence understanding of expected droplet volume.

FIG. 2C illustrates flow 251 of one possible process associated with the planning of droplet measurements per-nozzle (or per-nozzle-waveform pairing) and/or initialization of statistical data with which to model behavior of each nozzle. As indicated by numeral 253, data is in this process first received that specifies a desired tolerance range, which for example can be established according to manufacturer specification. In one embodiment, for example, this tolerance or acceptability range can be specified as ±5.0% of a given target; in another embodiment, another range such as ±2.5%, ±2.0%, ±1.0%, ±0.6% or ±0.5% of a desired target droplet size can be used. It is also possible to specify a range or a set of acceptable values in an alternate manner. Irrespective of method of specification, dependent on the desired tolerance and droplet system measurement error, a threshold number of measurements is then identified (255). Note that as indicated above, this number can be selected to achieve a number of objectives: (a) obtaining a large enough population of droplet measurements so as to provide a reliable measure of the expected droplet parameter (e.g., mean volume, velocity or trajectory); (b) obtaining a large enough population of droplet measurements so as to model variation in the droplet parameter (e.g., standard deviation or a for the given parameter); and/or (c) obtaining enough data so as to identify nozzles or nozzle-waveform pairings with larger than expected error for purposes of disqualifying the use of particular nozzles/nozzle-waveform pairings during a print process. With any planned number of droplet measurements or desired measurement criteria or related minimums thus defined, measurements are then performed (257) using a droplet measurement system 259 (for example, using optical techniques as discussed herein). The measurements for each nozzle (or nozzle-waveform) are then performed until the specified criteria are met, per process decision block 261. If the number of measurements meets planned criteria, the method then ends per process block 269. If additional measurements need to be performed, the measurement process loops until sufficient measurements have been obtained, as referenced in FIG. 2C.

FIG. 2C shows a number of exemplary process variations. First, as indicated by numeral 263, this measurement process is optionally applied to all nozzles of a printhead assembly (and/or all possible nozzle/waveform combinations). This need not be the case for all embodiments. For example, in one embodiment (see the discussion of FIGS. 14A-15C, below), a potentially limitless number of drive waveform variations can be used to influence parameters of a jetted droplet for a given nozzle; instead of exhaustively testing each possible waveform, a droplet measurement process can experiment with a set of predetermined waveforms representing a wide distribution of the possible waveforms, with an iterative, interpolative search process used to select a small number of waveforms (e.g., likely to produce a mean droplet volume spanning a range of ±10% of a desired droplet size). In another embodiment, if based on initial measurements, a given nozzle is deemed defective (e.g., droplet volume having greater than 20% distribution from a desired mean), that nozzle (or nozzle-waveform pairing) can be optionally excluded from further consideration. In yet another example, if print scans in practice are planned that do not use certain nozzles, it can be advantageous to perform dynamic additional droplet measurements for only nozzles that are actively used in planned scanning, at least until some type of error or variance criteria is reached. Once again, many possibilities exist; function block 263 simply indicates that applied processes do not have to involve all nozzles (or nozzle-waveform pairings). Second, numeral 265 indicates that in one embodiment, the minimum criteria can involve a minimum threshold that can differ for each nozzle or nozzle-waveform pairing. To cite a few examples pertinent to this function, in one embodiment, droplet measurements are performed for a given nozzle or nozzle-waveform pairing, and a distribution spread measure (e.g., variance, standard deviation or another measure) is computed, with measurements beyond a raw threshold performed until the spread measure satisfies a predetermined criteria; as should be appreciated, if the minimum is, e.g., 10 droplet measurements per nozzle, and if 10 droplet measurements for a particular nozzle yields a larger than expected variance, additional measurements could uniquely be performed for the given nozzle until the desired spread is achieved (e.g., $3\sigma<1.0\%$ of mean volume) or until some maximum number of measurements had been performed. Such an embodiment for example, can result in different numbers of measurements per nozzle, i.e., with measurement iterations planned to achieve some minimum criteria (e.g., minimum number of measurements and the spread measure less than a threshold in this example). Third, as indicated by numeral 267, it is also possible to use dead-reckoning in droplet measurement planning, e.g., to obtain "exactly 24" droplet measurements per nozzle (or nozzle-waveform), or to obtain x number of measurements per hour, and so forth. Finally, irrespective of measurements management techniques, it is possible to apply measurements to qualify (pass) or disqualify certain nozzles or nozzle-waveform combinations. Again citing a possible implementation option, following performance of a threshold number of measurements, certain nozzles or nozzle-waveforms could be qualified or disqualified based on measurement data, per numeral 270. For example, if an ideal droplet volume is 10.00 pL in one application, nozzles/nozzle-waveform pairings not producing a mean droplet volume of 9.90 pL-10.10 pL could be immediately disqualified; the same approach can be taken for statistical spread, e.g., following a minimum number of measurements, any nozzle/nozzle-waveform pairing producing droplet spread (e.g., variance, standard deviation, etc.) of greater than 0.5% could be immediately disqualified, and so forth. Once again, many implementation examples exist.

Figure 2D:
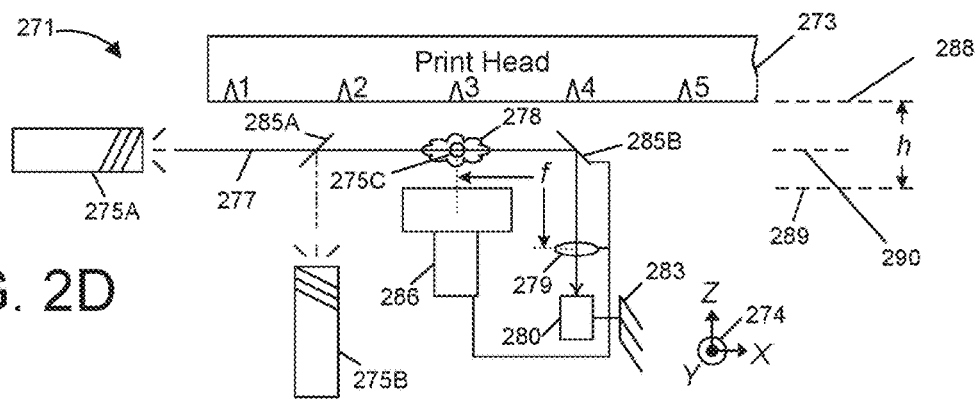
FIG. 2D is a schematic diagram that shows layout of various components used in one embodiment to perform droplet measurement.

FIG. 2D is a schematic view of one implementation of a droplet measurement system predicated on optical techniques, generally referenced by numeral 271. More particularly, a printhead 273 is illustrated in cross-section as having five enumerated print nozzles, arranged as a row of nozzles that will jet fluidic ink downward in the z-direction (as indicated by reference legend 274). A light source 275A is arranged to the side of the printhead so as to illuminate a measurement area 278 through which a droplet will pass for measurement; in the case of FIG. 2D, this measurement area (and part or all of the optics system) are arranged so as to measure droplets originating from nozzle (3) of the printhead. The light source 275A is depicted external to one lateral side of the printhead 273 so as to generate a light path 277 that will direct light into the light measurement area (i.e., within millimeter-order height, represented by the variable h, to illuminate any of multiple nozzles without interfering with the printhead 273. As represented by numeral 2758, in one embodiment, the light source can also instead be advantageously mounted below deposition plane 289 (and the upper periphery of spittoon 286) so as to provide for relatively easy fixed-distance positioning of optics relative to the droplet path from any nozzle; again, while five nozzles are depicted in FIG. 2D, in one embodiment, there are hundreds to thousands of nozzles, or more. Below deposition plane light generation, with optics used to direct illumination to the droplet measurement area 278, facilitates easy positioning of the optics system relative to any nozzle of the depicted printhead 273, and for selective engagement and disengagement of the droplet measurement system (e.g., relative to an optional service station, as previously described). In the depicted example, a mirror 285A is used to redirect light from the light source 275B so as to be incident with droplets within the measurement area 278 traveling from the printhead 273 toward the spittoon 286. Other means of positioning the optics path relative to the light source 2758 can also be used, such as by way of non-limiting example, prisms, fiber optic cables and so forth. For an implementation where an imaging measurement technique is used (e.g., shadowgraphy), the light source 275A/275B can be a strobed thermal light source or a monochromatic source. Note that FIG. 2D also shows a light from a third originating position directed along path 275C where the source is outside of the drawing page and directs light into or out of the drawing page with or without the assistance of light path routing optics (e.g., along the y dimension depicted by the reference legend 274); such a positioning framework can be used for example where interferometry is relied upon, with detection of an interference pattern occurring from a direction orthogonal to (or at another angle to) an illumination path. Irrespective of the relative arrangement of the illumination source, it should be noted that light is directed along a light path 277 and illumination plane 290 which is intermediate to the position of the printhead 273 and the deposition plane 290, and that measurement light (i.e., from the measured droplet) is routed by light path routing optics 2858 from the imaging plane to a light detector mounted below deposition plane 289. Once again, this permits narrow direction and focus of light notwithstanding a large printhead size and relatively small height h. Also, as with light path routing optics 285A, mirrors, prisms, fiber optics, or other light redirection devices and techniques can be used to effectuate this below-deposition-plane routing of light recovery. As seen in FIG. 2D, the measurement light is directed to focusing optics 279 (e.g., a lens) and on to a light detector 280. The distance of the light path between the focusing optics and the measurement area is identified by the distance f, representing the focal length of the optics system. As alluded to earlier, it is desired that droplet measurement (depending on optics technology) provide precise focus needed to properly image droplets and, to this effect, for the system represented by FIG. 2D, the light path routing optics 285B, the focusing optics 279, the droplet measurement area 278, and the spittoon 286 lens are all moved as an integral unit to measure droplets from different nozzles, as represented by depicted connection to a common chassis 283. The light source 275A/275B and light source direction optics, depending on embodiment, can optionally also be coupled to this chassis.

Note that in an interferometry-based system, also represented conceptually by FIG. 2D, the light source 275A/275B (or producing light path 275C) can be a laser, with beams split at some point along the optical path into two or more different components, used to produce an interference pattern. Additional specifics as to these optics, and the use of multiple beams to create an interference pattern, will be discussed further below in connection with FIG. 18B; for the time being, a laser source (including a light source for interferometry) should be assumed as encompassed by references 275A/275B/275C.

Figure 2E:
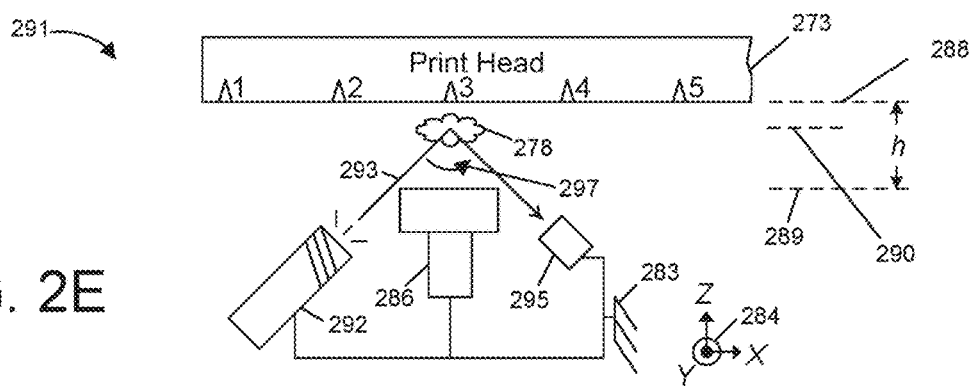
FIG. 2E is a schematic diagram that shows layout of various components used in another embodiment to perform droplet measurement.

FIG. 2E illustrates another schematic view of an implementation of a droplet measurement system predicated on optical techniques, generally referenced by numeral 291. More specifically, the implementation seen in FIG. 2E relies on interferometry to measure droplet parameters (such as volume). As before, this configuration relies upon a printhead 273, a measurement area 278, a chassis 283 and a spittoon 286. In this embodiment, however, a laser is specifically used as the light source 292 to generate light beams directed to the measurement area via illumination path 293. Note that typically two or more beams are directed in this manner, as will be explained further below. An interference pattern is generated in a droplet in the measurement area 278, and this interference pattern is observed from a direction substantially orthogonal to the illumination path 293, as represented by numeral 297. This same relationship (measurement from a direction not parallel with the illumination path) was also represented by FIG. 2D (e.g., using path 275C), but in FIG. 2E, the divergent measurement angle is such that measurement light is natively directed downward, below the plane of the measurement area 278. Note that a light detector 295 is non-imaging in the sense that (while multiple light detectors are typically used) the use of a camera is not required, and the use of image processing to identify droplet contours within a pixelated image is not required, substantially improving speed of detection and measurement; that is, the interferometric approach simply measures changes in an interference pattern as a droplet passes through a region of coincident light beams, with droplet volume derivable from obtained results. The use of more than two light beams (or an increased number of detectors) facilitates measurement of droplet trajectory and velocity and other parameters. As before, the light source 292, spittoon 286 and light detector 295 can be moved as one (i.e., with common chassis 283), facilitating preservation of precise optical path parameters. In one implementation, motion of the optics system is once again performed in three dimensions relative to a "parked" printhead assembly, to selectively engage and disengage a droplet measurement device while the printhead assembly is in a service station, and to easily and precisely position a droplet measurement device to measure any of thousands of nozzle of a large scale printhead.

As noted earlier, with suitable configuration of a droplet measurement device or system, an industrial printer (e.g., used for OLED device fabrication) can have nozzles and their consequent droplets repeatedly calibrated, permitting the planning of very precise droplet combinations in any target region. That is, the measurement device can be used to quickly develop accurate, tightly-grouped statistical distributions of volume for each nozzle and each waveform used for a nozzle, which enables accurate planning of droplet combinations used to achieve composite fills. In other embodiments, these same techniques are used to build models for droplet velocity and flight angle, such that models for these parameters can be applied in the printing process.

Note that any of these various techniques (and any of the printing or composite fill techniques introduced in this disclosure) can be manifested in different products and/or different manufacturing tiers. For example, FIG. 3A represents a number of different implementation tiers, collectively designated by reference numeral 301; each one of these tiers represents a possible discrete implementation of the techniques introduced above. First, the techniques introduced above can be embodied as instructions stored on non-transitory machine-readable media, as represented by graphic 303 (e.g., software for controlling a computer or a printer). Second, per computer icon 305, these techniques can be implemented as part of a computer or network, for example, within a company that designs or manufactures components for sale or use in other products. For example, the techniques introduced above can be implemented as design software by a company that consults to, or performs design for, a high definition television (HDTV) manufacturer; alternatively, these techniques could be used directly by such a manufacturer to make televisions (or display screens). Third, as introduced earlier and exemplified using a storage media graphic 307, the techniques introduced earlier can take the form of printer instructions, e.g., as stored instructions or data that, when acted upon, will cause a printer to fabricate one or more layers of a component dependent on the use of planned droplet aggregation techniques, per the discussion above. Fourth, as represented by a fabrication device icon 309, the techniques introduced above can be implemented as part of a fabrication apparatus or machine, or in the form of a printer within such an apparatus or machine. For example, a fabrication machine could be sold or customized in a manner where droplet measurement, and conversion of externally-supplied "layer data" is automatically converted by the machine (e.g., through the use of software) into printer instructions that will print using the techniques described here to transparently optimize/speed-up the printing process. Such data can also be computed off-line, and then reapplied on a reproducible basis in a scalable, pipelined manufacturing process that manufactures many units. It is noted that the particular depiction of the fabrication device icon 309 represents one exemplary printer device that will be discussed below (e.g., in reference to FIGS. 11-12). The techniques introduced above can also be embodied as an assembly such as an array 311 of multiple components that will be separately sold; in FIG. 3 for example, several such components are depicted in the form of an array of semi-finished flat panel devices, which will later be separated and sold for incorporation into end consumer products. The depicted devices may have, for example, one or more layers (e.g., color component layers, semiconductor layers, encapsulation layers or other materials) deposited in dependence on the methods introduced above. The techniques introduced above can also be embodied in the form of end-consumer products as referenced, e.g., in the form of display screens for portable digital devices 313 (e.g., such as electronic pads or smart phones), as television display screens 315 (e.g., HDTVs), or other types of devices. For example, FIG. 3A uses a solar panel graphic 317 to denote that the processes introduced above can be applied to other forms of electronic devices, e.g., to deposit per-target region structures (such as one or more layers of individual cells that make up an aggregate device) or blanket layers (e.g., an encapsulation layer for a TV or solar panel). Clearly, many examples are possible.

The techniques introduced above, without limitation, can be applied to any of the tiers or components illustrated in FIG. 3A. For example, one embodiment of the techniques disclosed herein is an end consumer device; a second embodiment of the techniques disclosed herein is an apparatus comprising data to control the fabrication of a layer using combinations of specific nozzle volumes to obtain specific per-target region fills; nozzle volumes can be determined in advance, or measured and applied in situ. Yet another embodiment is a deposition machine, for example, that uses a printer to print one or more inks using techniques introduced above. These techniques can be implemented on one machine or more than one machine, e.g., a network or series of machines where different steps are applied at different machines. All such embodiments, and others, can independently or collectively make use of techniques introduced by this disclosure.

As represented by FIG. 3B, in one application, a printing process can be used to deposit one or more layers of material onto a substrate. The techniques discussed above can be used to generate printer control instructions (e.g., an electronic control file that can be transferred to a printer) for subsequent use in fabricating a device. In one specific application, these instructions can be geared for an inkjet printing process useful in printing a layer of a low-cost, scalable organic light-emitting diode ("OLED") display. More specifically, the mentioned techniques can be applied to deposit one or more light-emitting or other layers of such an OLED device, for example, "red" "green" and "blue" (or other) pixelated color components or other light-emitting layers or components of such a device. This exemplary application is non-limiting, and the mentioned techniques can be applied to fabrication of many other types of layers and/or devices, whether or not those layers are light-emitting and whether or not the devices are display devices. In this exemplary application, various conventional design constraints of inkjet printheads provide challenges to the process efficiency and film coating uniformity of various layers of an OLED stack that can be printed using various inkjet printing systems. Those challenges can be addressed through the teachings herein.

More specifically, FIG. 3B is a plan view of one embodiment of a printer 321. The printer includes a printhead assembly 323 that is used to deposit fluidic ink onto a substrate 325. Unlike printers that print text and graphics, the printer 321 in this example is used in a manufacturing process to deposit fluidic ink that will have a desired thickness. That is, in a typical manufacturing application, the ink carries a material that will be used to form a permanent layer of a finished device, where that layer has a specifically-desired thickness. The thickness of the layer produced by deposition of fluidic ink is dependent on the volume of applied ink. The ink typically features one or more materials that will form part of the finished layer, formed as monomer, polymer, or a material carried by a solvent or other transport medium. In one embodiment, these materials are organic. Following deposition of the ink, the ink is dried, cured or hardened to form the permanent layer; for example, some applications use an ultraviolet (UV) cure process to convert a liquid monomer into a solid polymer, while other processes dry the ink to remove the solvent and leave the transported materials in a permanent location. Other processes are also possible. Note that there are many other variations that differentiate the depicted printing process from conventional graphics and text applications; for example, in some embodiments, deposition of the desired materials layers is performed in an environment controlled to either regulate the ambient atmosphere to be something other than air, or otherwise to exclude unwanted particulates. For example, as will be described further below, one contemplated application uses a fabrication mechanism that encloses the printer 321 within a gas chamber, such that printing can be performed in the presence of a controlled atmosphere such as an inert environment including, for example, but not limited by, nitrogen, any of the noble gases, and any combination thereof.

As further seen in FIG. 3B, the printhead assembly 323 includes a number of nozzles, such as nozzle 327. Note that in FIG. 3B, for ease of illustration, the printhead assembly 323 and nozzles are depicted as opening out of the top of the page, but in fact, these nozzles face downward toward the substrate and are hidden from view from the perspective of FIG. 3B (i.e., FIG. 38 shows what in effect is a cut-away view of the printhead assembly 323). The nozzles are seen to be arranged in rows and columns (such as exemplary row 328 and column 329), although this is not required for all embodiments, i.e., some implementations use only a single row of nozzles (such as row 328). In addition, it is possible for rows of nozzles to be disposed on respective printheads, with each printhead being (optionally) individually offsettable relative to one another, as introduced above. In an application where the printer is used to fabricate part of a display device, for example, materials for each of respective red, green and blue color components of a display device, the printer will typically use dedicated printhead assemblies for each different ink or material, and the techniques discussed herein can be separately applied to each corresponding printhead or printhead assembly.

FIG. 3B illustrates one printhead assembly 323 (i.e., with one or more individual printheads not separately depicted). The printer 321 includes in this example two different motion mechanisms that can be used to position the printhead assembly 323 relative to the substrate 325. First, a traveler or carriage 331 can be used to mount the printhead assembly 323 and to permit relative motion as denoted by arrows 333. This motion mechanism also can optionally convey the printhead assembly 323 to a service station, if present; such a service station is represented by numeral 334 in FIG. 3B. Second, however, a substrate transport mechanism can be used to move the substrate relative to the traveler, along one or more dimensions. For example, as denoted by arrows 335, the substrate transport mechanism can permit movement in each of two orthogonal directions, such as in accordance with x and y Cartesian dimensions (337), and can optionally support substrate rotation. In one embodiment, the substrate transport mechanism comprises a gas floatation table used to selectively secure and permit movement of the substrate on a gas bearing. Note further that the printer optionally permits rotation of the printhead assembly 323 relative to the traveler 331, as denoted by rotation graphic 338. Such rotation permits the apparent spacing and relative configuration of the nozzles 327 to be changed relative to the substrate; for example, where each target region of the substrate is defined to be a specific area, or to have a spacing relative to another target region, rotation of the printhead assembly and/or the substrate can change the relative separation of the nozzles in a direction along or perpendicular to a scan direction. In an embodiment, the height of the printhead assembly 323 relative to the substrate 325 can also be changed, for example, along a z Cartesian dimension that is into and out of the direction of view of FIG. 3B.

Two scan paths are respectively illustrated by directional arrows 339 and 340 in FIG. 3B. Briefly, the substrate motion mechanism moves the substrate back and forth in the direction of arrows 339 and 340 as the printhead moves in geometric steps or offsets in the direction of arrows 333. Using these combinations of movements, the nozzles of the printhead assembly can reach any desired region of the substrate to deposit ink. As referenced earlier, the ink is deposited on a controlled basis into discrete target regions of the substrate. These target regions can be arrayed, that is, arranged in rows and columns such as optionally along the depicted y and x dimensions, respectively. Note that the rows of nozzles (such as row 328) are seen in this FIG. perpendicular to the rows and columns of target regions, i.e., such that a row of nozzles sweeps with each scan along the direction of rows of target regions, traversing each of the columns of target regions of the substrate (for example, along direction 339). This need not be the case for all embodiments. For efficiency of motion, the subsequent scan or pass then reverses this direction of motion, addressing the columns of target regions in reverse order, that is, along direction 340.

Arrangement of the target regions in this example is depicted by a highlighted region 341, which is seen in expanded view to the right side of the FIG. That is, two rows of pixels, each pixel having red, green and blue color components, are each represented by numeral 343, whereas columns of pixels orthogonal to the scan direction (339/340) are each represented by numeral 345. In the upper left-most pixel, the red, green and blue color components are seen to occupy distinct target regions 347, 349 and 351 as part of respective, overlapping arrays of regions. Each color component in each pixel can also have associated electronics, for example as represented by numeral 353. Where the device to be fabricated is a backlit display (for example, as part of a conventional-type LCD television), these electronics can control selective masking of light that is filtered by the red, green and blue regions. Where the device to be fabricated is a newer type display, that is where red, green and blue regions directly generate their own light having corresponding color characteristics, these electronics 353 can include patterned electrodes and other material layers that contribute to the desired light generation and light characteristics.

Figure 3C:
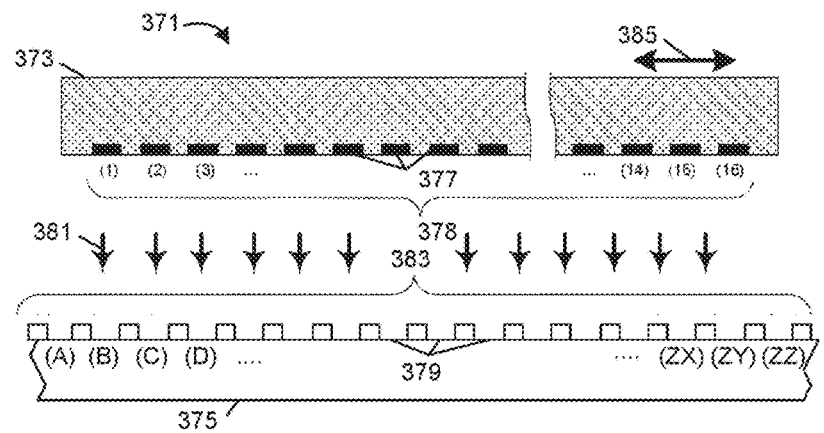
FIG. 3C is a cross-sectional close-up view of the printhead and substrate of FIG. 3B, taken from the perspective of lines C-C from FIG. 3B.

FIG. 3C provides a close-up, cross-sectional view of a printhead 373 and substrate 375, taken relative to the printhead assembly of FIG. 3B from the perspective of lines C-C. More specifically, numeral 371 generally denotes the printer, while numeral 378 represents a row of print nozzles 377. Each nozzle is designated using a parenthetical number, e.g., (1), (2), (3), etc. A typical printhead typically has plural such nozzles, for example, 64, 128 or another number; in one embodiment, there can be 1,000-10,000 nozzles, or more, arranged in one or more rows. As noted earlier, the printhead in this embodiment is moved relative to the substrate to effectuate geometric steps or offsets between scans, in the direction referenced by arrows 385. Depending on the substrate motion mechanism, the substrate can be moved orthogonal to this direction (e.g., into and out of the page, relative to the view of FIG. 3C) and in some embodiments, also in the direction represented by arrows 385. Note that FIG. 3C also shows a column 383 of respective target regions 379 of the substrate, in this case, arranged as "wells" that will receive deposited ink and retain the deposited ink within structural confines of the respective well. It will be assumed for purposes of FIG. 3C that only one ink is represented (e.g., each depicted well 379 represents only one color of a display, such as the red color component, with other color components and associated wells not being shown). Note that the drawing is not true to scale, e.g., the nozzles are seen to be numbered from (1) to (16) while the wells are seen to be lettered from (A) to (ZZ), representing 702 wells. In some embodiments, the nozzles will align to respective wells, such that the depicted printhead with 16 nozzles would deposit ink in the direction of arrows 381 in as many as 16 wells at the same time using scans of relative printhead/substrate motion that are into and out of the page from the perspective of FIG. 3C. In other embodiments, as mentioned earlier (e.g., with reference to FIG. 1B), nozzle density will be much greater than target region density, and with any scan or pass, a subset of nozzles (.e.g, a group of one to many, dependent on which nozzles traverse each target region) will be used for deposition into each respective target region. For example, again using an illustrative example of sixteen nozzles, it could be that nozzles (1)-(3) can be used to deposit ink in a first target region and nozzles (7-10) can be concurrently used to deposit ink in a second target region, on a mutually-exclusive basis for the given pass.

Conventionally, a printer might be operated to use the depicted sixteen nozzles to concurrently deposit ink in as many as sixteen rows of wells, moving back and forth with ensuing scans as necessary, until e.g. five droplets were deposited in each well, with the printhead being advanced as necessary using a fixed step that is an integer multiple of a width of the swath traversed by the scan. The techniques provided by this disclosure, however, make use of the inherent variation in droplet volumes produced by different nozzles, in combinations calculated to produce a specific fill volume for each well. Different embodiments rely on different techniques to achieve these combinations. In one embodiment, the geometric step is varied to achieve the different combinations, and is free to be something other than an integer multiple of the width described by the printhead swath. For example, if appropriate to depositing selected sets of droplet combinations in the respective wells 379 of FIG. 3C, the geometric step could be $1/60^{th}$ of the swath of the printhead, in effect, representing a relative displacement between printhead and substrate of a spacing of one tenth of a one row of wells in this example. The next offset or geometric step could be different, as appropriate to the particular combination of droplets desired in each well, for example, a hypothetical offset of $5/16^{ths}$ of the printhead swath, corresponding to an integer spacing of wells; this variation could continue with both positive and negative steps as necessary to deposit ink to obtain the desired fill volumes. Note that many different types or sizes of offsets are possible and that step size need not be fixed from scan-to-scan or be a specific fraction of well spacing. In many manufacturing applications, however, it is desired to minimize printing time, in order to maximize rate of production and minimize per-unit manufacturing costs as much as possible; to this end, in specific embodiments, printhead motion is planned and sequenced in a manner to minimize the total number of scans, the total number of geometric steps, the size of offsets or geometric steps, and the cumulative distance traversed by the geometric steps. These or other measures can be used individually, together, or in any desired combination to minimize total printing time. In embodiments where independently offsettable rows of nozzles are used (e.g., multiple printheads), the geometric step can be expressed in part by the offset between printheads or nozzle rows; such offset, combined with overall offset of the printhead component (e.g., a fixed step for a printhead assembly) can be used to effectuate variable-size geometric steps and thus deposit droplet combinations into each well. In embodiments where variation in nozzle drive waveform is used alone, conventional, fixed steps can be used, with droplet volume variation effectuated using multiple printheads and/or multiple printhead passes. As will be noted below, in one embodiment, nozzle drive waveforms can be programmed for each nozzle in between droplets, thus permitting each nozzle to produce and contribute respective droplet volumes per well within a row of wells.

FIGS. 4A-4D are used to provide additional detail regarding reliance on specific droplet volumes in achieving desired fill volumes.

Figure 4A:
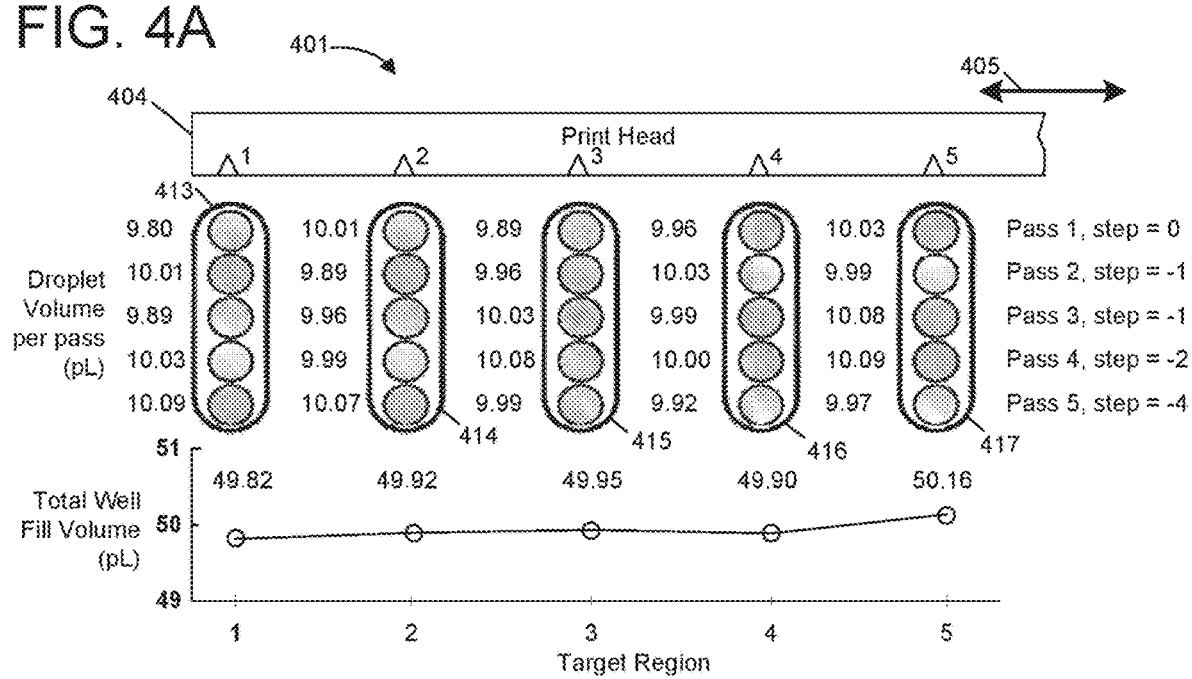
FIG. 4A is a diagram similar to FIG. 1A, but illustrates the use of combinations of droplet volumes to reliably produce ink fill volumes for each target region within a predetermined tolerance range; in one optional embodiment, different droplet volume combinations are produced from a set of predetermined nozzle firing waveforms, and in another optional embodiment, different droplet volume combinations are produced from respective nozzles of the printhead using relative motion (405) between printhead and substrate.
Figure 5:
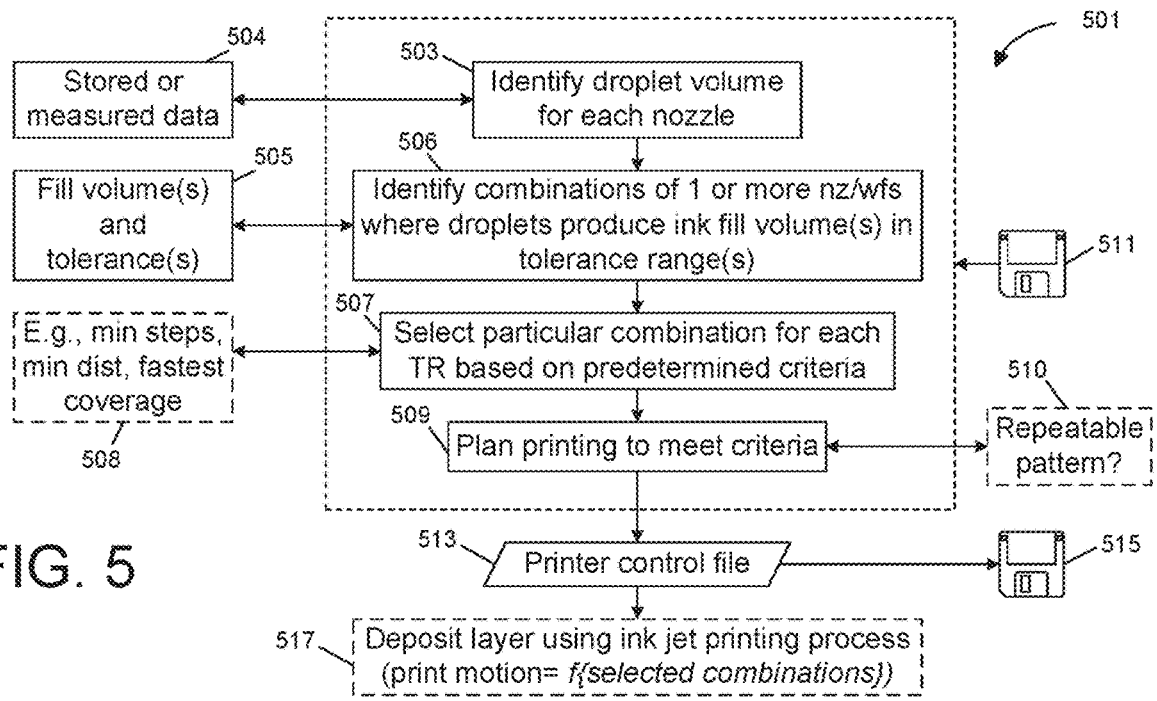
FIG. 5 provides a block diagram showing a method of planning combinations of droplets for each target region of a substrate; this method can be applied to any of the optional embodiment introduced by FIGS. 4A-D.

FIG. 4A presents an illustrative view 401 of a printhead 404 and two related diagrams seen below the printhead 401. The printhead is optionally used in an embodiment that provides non-fixed geometric steps of printhead relative to substrate, and so numeral 405 is used to denote offsets that align specific printhead nozzles (e.g., 16 total nozzles with nozzles (1)-(5) depicted in the FIG.) with different target regions (five in this example, 413, 414, 415, 416 and 417). Harkening back to the example of FIG. 1A, if nozzles (1)-(16) respectively produce droplet volumes of 9.80, 10.01, 9.89, 9.96, 10.03, 9.99, 10.08, 10.00, 10.09, 10.07, 9.99, 9.92, 9.97, 9.81, 10.04 and 9.95 pL of fluidic ink (e.g., mean droplet volumes), and if it is desired to deposit 50.00 pL per target region, ±0.5 percent of this value, the printhead could be used to deposit droplets in five passes or scans, respectively using geometric steps of 0, −1, −1, −2 and −4, resulting in (expected mean) total fill values per region of 49.82, 49.92, 49.95, 49.90 and 50.16 pL, as depicted in the FIG; this is clearly within the desired tolerance range of 49.75-50.25 pL for each of the depicted target regions. Every step in this example is expressed on an incremental basis relative to previous position, although it is possible to use other measures as well. Depending on variation in expected per-droplet volumes, it is still possible to virtually guarantee that fills will conform to the desired tolerance range; for example, by taking many droplet measurements as referenced above (e.g., 20-30 droplet measurements per nozzle, or more), the expected variance of each droplet volume can be made quite small, permitting high confidence in the distribution of expected composite volume. Thus, as seen, the combining of droplets in a deliberate manner that depends on respective droplet volumes and the desired fill for each target region can be used to achieve precise, regulated fills, with a high degree of reliability.

Note that this same FIG. can be used to represent nozzle drive waveform variation and/or the use of multiple printheads. For example, if the nozzle references (1)-(16) refer to droplet volumes for a single nozzle produced by sixteen different drive waveforms (i.e., using waveforms 1-16), the per-region fill volumes can in theory be obtained simply by using different drive waveforms, for example, waveform nos. 1, 2, 3, 5 and 9 for target region 413. In practice, since process variations can result in different per-nozzle characteristics, the system would measure droplet volumes for each nozzle for each waveform, and would intelligently plan droplet combinations on this basis. In an embodiment where the nozzle references (1)-(15) refer to multiple printheads (e.g., references (1)-(5) referring to a first printhead, references (6)-(10) referring to a second printhead and references (11)-(15) referring to a third printhead), offsets between printheads can be used to reduce the number of passes or scans; for example, the right-most target region 417 could have three droplets deposited in one pass, including droplet volumes of 10.03, 10.09 and 9.97 pL (printhead (1), 0 offset; printhead (2), +1 offset; and printhead (3), +2 offset). It should be apparent that the combination of these various techniques facilitates many possible combinations of specific volume droplets to achieve specific fill volumes within a tolerance range. Note in FIG. 4A that the variance in the aggregate ink fill volumes amongst target regions is small and within tolerance, i.e., within a range of 49.82 pL to 50.16 pL.

Figure 4B:
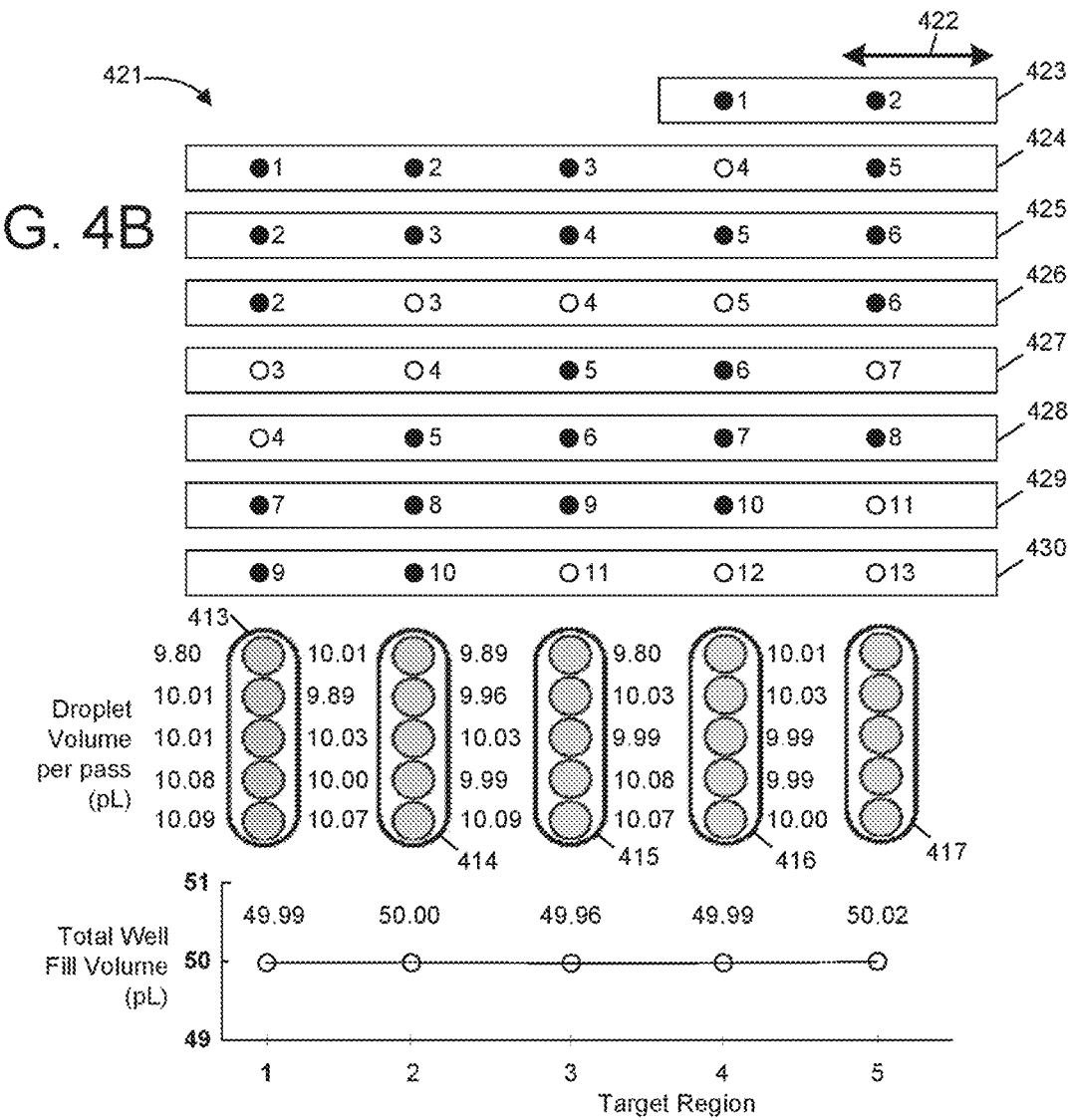
FIG. 4B is a diagram used to illustrate relative printhead/substrate motion and the ejection of different droplet volume combinations into respective target regions of a substrate.

FIG. 4B shows an illustrative view 421 of a series of printhead scans, with each scan perpendicular to the direction of arrows 422, with nozzles represented by a different rectangle or bar, such as referenced by numerals 423-430. In connection with this FIG., it should be assumed printhead/substrate relative motion is advanced in a sequence of variable-size geometric steps. Note again that, typically, each step will designate a scan that sweeps multiple columns of target regions (e.g., pixels) beyond a single column of five regions represented on the plane of the drawing page (and represented by numerals 413-417). Scans are shown in order from top-to-bottom, including a first scan 423 where the printhead is seen displaced to the right relative to the substrate, such that only nozzles (1) and (2) are aligned with target regions 416 and 417, respectively. Within each print scan depiction (such as box 423), circles represent each nozzle either with a solid black fill, to denote that the nozzle is to be fired when that nozzle is over the specifically-depicted target region during the scan, or "hollow," that is, with a white fill, to denote that the nozzle is not to be fired at the pertinent time (but may be for other target regions encountered on the scan). Note that, in this embodiment, each nozzle is fired on a binary basis, i.e., each nozzle is either fired or not according to any adjustable parameters, e.g., to deposit for each target region encountered during the scan a predetermined droplet volume. This "binary" firing scheme can optionally be employed for any of the embodiments described herein (that is, e.g., in embodiments where multiple firing waveforms are used, with waveform parameters being adjusted in between droplets). In the first pass 423, it is seen that nozzle (1) is fired to deposit a 9.80 pl droplet into the second-to-right-most target region while nozzle (2) is fired to deposit a 10.01 pl droplet into right-most target region 417. The scan continues to sweep other columns of target regions (e.g., other rows of pixel wells), depositing ink droplets as appropriate. After the first pass 423 is completed, the printhead is advanced by a geometric step of −3, which moves the printhead left relative to the substrate, such that nozzle (1) will now traverse target region 413 during a second scan 424 in a direction opposite to the first scan. During this second scan 424, nozzles (2), (3), (4) and (5) will also respectively traverse regions 414, 415, 416 and 417. It is seen by the black-filled circles that, at the appropriate time, nozzles (1), (2), (3) and (5) will be fired to respectively deposit droplet volumes of 9.80 pL, 10.01 pL, 9.89 pL and 10.03 pL, corresponding to inherent characteristics of nozzles (1), (2), (3) and (5). Note also that in any one pass, the nozzles in a row of nozzles used to deposit ink will do so on a mutually-exclusive basis into respective target regions, e.g., for pass 424, nozzle (1) is used to deposit ink into target region 413 (but none of target regions 414-417), nozzle (2) is used to deposit ink in target region 414 (but none of regions 413 or 415-417), nozzle (3) is used to deposit ink in target region 415 (but none of regions 413-414 or 416-417) and nozzle (5) is used to deposit ink in target region 417 (but none of regions 413-416). A third scan, denoted using numeral 425, advances the printhead effectively by one row of target regions (−1 geometric step), such that nozzles (2), (3), (4), (5) and (6) will traverse regions 413, 414, 415, 416 and 417, respectively during the scan; solid-fill nozzle graphics denote that during this pass, each of nozzles (2)-(6) will be actuated to fire droplets, respectively producing expected droplet volumes of 10.01, 9.89, 9.96, 10.03 and 9.99 pL.

If the print process was stopped at this point in time, region 417 would for example have a fill of 30.03 pL (10.01 pL+10.03 pL+9.99 pL corresponding to three droplets, whereas region 413 would have a fill of 19.81 pL (9.80 pL+10.01 pL), corresponding to two droplets. Note that the scan pattern in one embodiment follows the back and forth pattern represented by arrows 339 and 340 of FIG. 3B. Ensuing passes 426-430 across these target regions (or scans of multiple columns of multiple such regions) respectively deposit: (a) 10.01 pL, 0.00 pL, 0.00 pL, 10.08 pL and 10.09 pL droplets in region 413, corresponding to passes by nozzles (2), (3), (4), (7) and (9) in successive scans; (b) 0.00 pL, 0.00 pL, 10.03 pl, 10.00 pL and 10.07 pl droplets in region 414, corresponding to respective passes by nozzles (3), (4), (5), (8) and (10) in successive scans; (c) 9.89 L, 9.96 pL, 10.03 pL, 9.99 pL, 10.09 pL and 0.00 pL droplets in region 415, corresponding to passes by nozzles (4), (5), (6), (9) and (11) in successive scans; (d) 0.00 pL, 9.99 pL, 10.08 pL, 10.07 pL and 0.00 pL droplets in region 416, corresponding to passes by nozzles (5), (6), (7), (10) and (12) in successive scans; and (e) 9.99 pL, 0.00 pL, 10.00 pL, 0.00 pL and 0.00 pL droplets in region 417, corresponding to passes by nozzles (6), (7), (8), (11) and (13) in successive scans. Again, note that nozzles in this example are used with only a single firing waveform (i.e., such that their droplet volume characteristics do not change from scan to scan) and on a binary basis, e.g., in the fifth scan 427, nozzle (7) is not fired, producing no droplet (0.00 pL) for region 417, while on the ensuing scan, it is fired, producing a 10.08 pL droplet for region 416.

As seen in a graph at the bottom most portion of the page, this hypothetical scanning process produces expected aggregate fills of 49.99 pL, 50.00 pL, 49.96 pl, 49.99 pL and 50.02 pL, easily within the desired range of a target value (50.00 pL) plus or minus % percent (49.75 pL-50.25 pL). Note that in this example, nozzles were used to deposit ink into multiple target regions on a generally concurrent basis for each scan, with particular combinations of droplet volumes for each depicted region (i.e., as identified by the graphics at numerals 413-417) planned so that multiple droplets could be deposited in each target region with many of the passes. The eight depicted passes together correlate with particular sets (or a particular combination) of droplet volumes that produce a fill volume within the specified tolerance range (for example, combinations of droplets from nozzles (1), (2), (2), (7) and (9) in the case of region 413), but other sets of possible droplets could have been also possibly used. For example, for region 413, it would have alternatively been possible to use five droplets from nozzle (2) (5×10.01 pL=50.05 pL); this alternative would have been inefficient, however, as additional scans would have been required because (for example) nozzle (3) (9.89 pL) could not have been extensively used on a concurrent basis during this time (i.e., the result from five droplets from this nozzle would have been 5×9.89=49.45 pL, outside the desired tolerance range). In the example relayed by FIG. 48, the particular scans and their sequence were chosen so as to use less print time, a smaller number of passes, smaller geometric steps and potentially small aggregate geometric step distance, or according to some other criteria. Note that the depicted example is used for narrative discussion only, and that it might be possible to further reduce the number of scans using the presented droplet volumes to fewer than eight scans to obtain target fill. In some embodiments, the scan process is planned in a manner that avoids a worst-case scenario with the number of scans required (e.g., one scan per row of target regions with the printhead rotated by ninety degrees). In other embodiments, this optimization is applied to a degree based on one or more maximums or minimums, for example, planning scans in a manner that results in the fewest number of scans possible given all possible droplet combinations for each target region for a given ink.

Figure 4C:
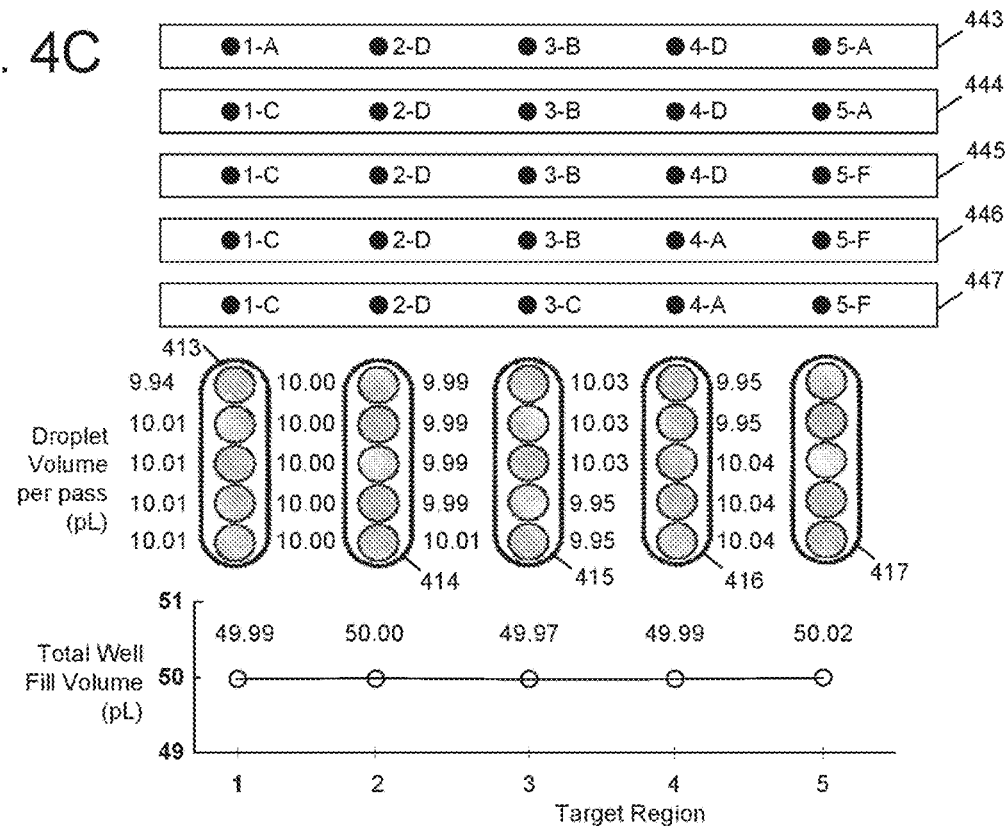
FIG. 4C is a diagram used to illustrate use of different nozzle drive waveforms at each nozzle to produce different droplet volume combinations into respective target regions of a substrate.

FIG. 4C presents a diagram similar to FIG. 4B, but which corresponds to the use of different nozzle-drive waveforms for each nozzle. As should be appreciated, in an ink jet printhead, ink is typically ejected using a piezoelectric actuator, which expands and contracts a fluid reservoir in order to expel ink from a respective print nozzle. Ink is usually maintained in the reservoir under slight negative pressure to avoid flooding the nozzle plate, with a voltage pulse applied to the actuator to eject a droplet with properties that depend on the size and shape of the voltage pulse. Different pulse characteristics can thus result in different volume, velocity and other characteristics of the ejected droplet. In FIG. 4C, it should be assumed that different preplanned voltage pulse waveforms have been determined to produce a series of different droplet volumes (and associated droplet volume probability distributions). Scanning is generally referenced by numeral 441, with each of scans 443-447 occurring in a direction perpendicular to bars 443-447; within each scan bar (e.g., box 443) a numeral designation represents a particular printhead nozzle and a letter designation represents a different waveform for the particular nozzle. For example, reference "1-A" denotes a first drive waveform "A" used for an actuator for nozzle (1) whereas reference "1-C" denotes a third drive waveform "C" used for the actuator for nozzle (1). Note that during a calibration procedure, any desired number of waveforms can be tested to select a waveform that produces an expected droplet volume (or set of multiple droplets) matching an ideal target droplet volume. In FIG. 4C, for example, testing of multiple waveforms for nozzle (1) might yield a result that two specific waveforms (e.g., "A" and "C" produce expected droplet volumes close to a desired 10.00 pL mean, e.g., 9.94 pL and 10.01 pL means, respectively). That is, if an expected mean cannot be produced through testing which exactly matches an ideal droplet volume (e.g., 10.00 pL) then two or more waveforms can be selected which bracket the desired idealized volume, for example, 9.94 pL/10.01 pL, 9.99 pL/10.01 pL, 10.03 pL/9.95 pL, and 9.95/10.04 pL as depicted for nozzles (1), (3), (4) and (5). Much as with the examples above, different droplets can then be combined using the different nozzle drive waveforms to specifically plan aggregate fills for each target region which are within desired tolerance. Note that for the example of FIG. 4C, it is not necessary to offset the printhead assembly between scans to achieve these combinations; in many embodiments, however, the use of multiple nozzle waveforms can be combined with fractional-swath-width offsets to develop many possible droplet combinations that can be used to produce target fills using a minimal number of scans (and thus, minimal per-substrate print time). In FIG. 4C, the depicted process is seen to produce hypothetical fills that are very tightly grouped, e.g., 49.99 pL-50.02 pL expected fill volumes.

Figure 4D:
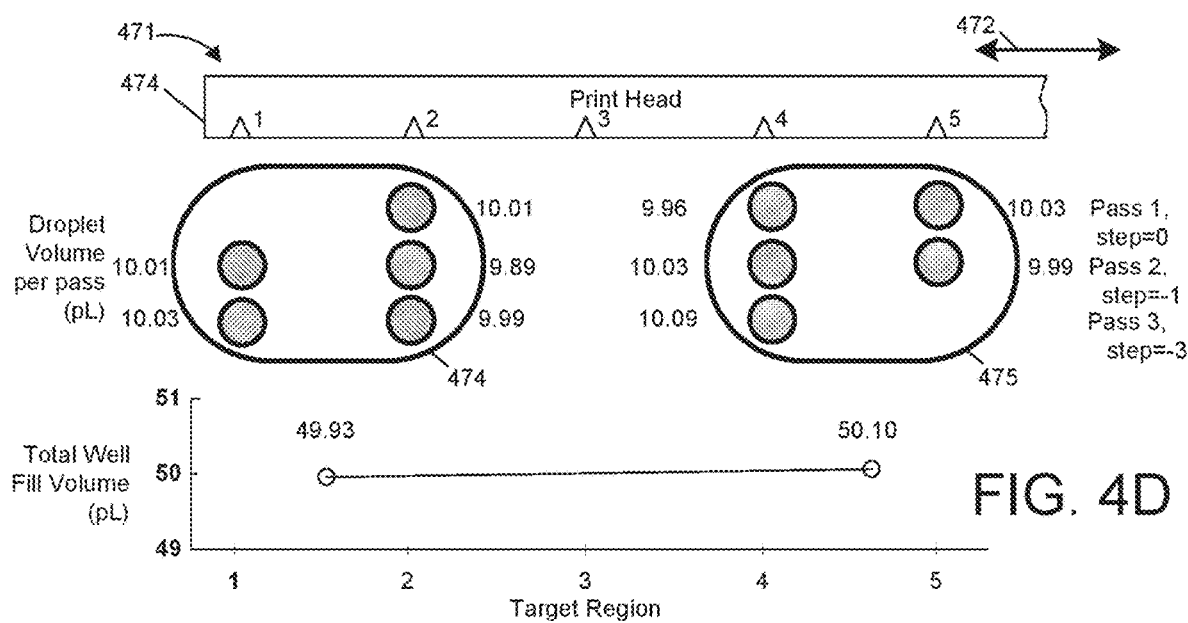
FIG. 4D is a diagram similar to FIG. 1B, but illustrates the use of combinations of droplet volumes to reliably produce ink fill volumes for each target region within a predetermined tolerance range; in one optional embodiment, different droplet volume combinations are produced from a set of predetermined nozzle firing waveforms, and in another optional embodiment, different droplet volume combinations are produced from respective nozzles of the printhead using relative motion (472) between printhead and substrate.

FIG. 4D presents an illustrative view 471 of a printhead 474 and two related diagrams seen below the printhead 474, in analogy to FIG. 4A, but here having nozzles that are not specially aligned to specific wells. The printhead is optionally used in an embodiment that provides non-fixed geometric steps of printhead relative to substrate, and so numeral 472 is used to denote offsets that align specific printhead nozzles (e.g., 16 total nozzles with nozzles (1)-(5) depicted in the FIG.) with different target regions (two in this example, 474 and 475). Following again the hypothetical of FIG. 4A, if nozzles (1)-(16) respectively produce expected droplet volumes of 9.80, 10.01, 9.89, 9.96, 10.03, 9.99, 10.08, 10.00, 10.09, 10.07, 9.99, 9.92, 9.97, 9.81, 10.04 and 9.95 pL of fluidic ink, and if it is desired to deposit 50.00 pL per target region, ±0.5 percent of this value, the printhead could be used to deposit droplets in three passes or scans, respectively using geometric steps of 0, −1, and −3, and firing one or two drops into each target region per scan. This would result in total fill values per region of 49.93 and 50.10, as depicted in the FIG, which is again clearly within the desired tolerance range of 49.75-50.25 pL for each of the depicted target regions. Thus, as seen, the same approach applies equally to the case of nozzles that are not aligned to the wells, and combining of droplets in a deliberate manner that depends on respective droplet volumes and the desired fill for each target region can be used to achieve precise, regulated fills. Furthermore, just as described above for the hypothetical of FIG. 4A, this same FIG. can be used to represent nozzle drive waveform variation and/or the use of multiple printheads. For example, if the nozzle references (1)-(16) refer to droplet volumes for a single nozzle produced by sixteen different drive waveforms (i.e., using waveforms 1-16), the per-region fill volumes can in theory be obtained simply by using different drive waveforms. One of ordinary skill in the art can see that the same approaches as described above with reference to FIGS. 4B-4C also apply equally to the case of nozzles that are not specially aligned to the wells, i.e., with groups of one or more nozzles being used for concurrent droplet deposition into respective wells. Note finally that FIGS. 4A-D also represent relatively simple examples; in a typical application, there may be hundreds to thousands of nozzles, and millions of target regions. For example, in an application where the disclosed techniques are applied in the fabrication of each pixel color component of a current high-definition television screen (e.g., pixels each having red, green and blue wells, with pixels arranged in 1080 horizontal lines of vertical resolution and 1920 vertical lines of horizontal resolution), there are approximately six million wells that might receive ink (i.e., three overlapping arrays each of two million wells). Next generation televisions are expected to increase this resolution by a factor of four or more. In such a process, to improve the speed of printing, printheads may use thousands of nozzles for printing, e.g., there will typically be a staggering number of possible print process permutations. The simplified examples presented above are used to introduce concepts but it should be noted that, given the staggering numbers presented in a typical combination, permutations represented by a real-life television application are quite complex, with print optimization typically being applied by software and using complex mathematical operations. FIGS. 5-7 are used to provide non-limiting examples of how these operations can be applied.

An exemplary process for planning printing is introduced by FIG. 5. This process and associated methods and devices are generally referenced using the numeral 501.

More specifically, the droplet volume for each nozzle (and for each nozzle for each waveform if multiple drive waveforms are applied) is specifically determined (503). Such measurement can be performed for example using a variety of techniques, including without limitation an optical-imaging or laser-imaging or non-imaging device built into a printer (or a factory-resident machine) that measures droplets during flight (e.g., during a calibration printing operation or a live printing operation) and that calculates volume with precision based on droplet shape, velocity, trajectory and/or other factors. In specific embodiments, as mentioned, each measurement is only approximately accurate, as even droplet volume from a single nozzle produced using a single drive waveform can vary from droplet-to-droplet. To this effect, droplet measurement techniques can be used to develop a statistical model for droplet from each nozzle and for each nozzle-waveform combination, each specific droplet volumes expressed as a mean expected droplet volume from a given nozzle and a given nozzle drive waveform. Other measurement techniques can also be used including printing ink and then using post-printing imaging or other techniques to calculate individual droplet volumes based on pattern recognition. Alternatively, identification can be based on data supplied by a printer or printhead manufacturer, for example, based on measurements taken at a factory well prior to the fabrication process and supplied with a machine (or on-line). In some applications, droplet volume characteristics can change over time, for example, dependent on ink viscosity or type, temperature, nozzle clogging or other degradation, or because of other factors; therefore, in one embodiment, droplet volume measurement can be dynamically performed in situ, for example, upon power up (or at occurrence of other types of power cycle events), with each new printing of a substrate, upon expiration of a predetermined time or on another calendared or uncalendared basis. In one embodiment, such measurement is continuously performed on an intermittent basis, as referenced earlier, by performing measurements for a moving window of print nozzles and nozzle-waveform combinations each time a new flat panel substrate is loaded or unloaded, to obtain dynamic updates. As denoted by numeral 504, this data (measured or provided) is stored for use in an optimization process.

In addition to per-nozzle (and optionally, per-drive-waveform) droplet volume data, information (505) is also received concerning desired fill volume for each target region. This data can be a single target fill value to be applied to all target regions, respective target fill values to be applied to individual target regions, rows of target regions or columns of target regions, or values broken down in some other manner. For example, as applied to fabricating a single "blanket" layer of material that is large relative to individual electronic device structures (such as transistors or pathways), such data could consist of a single thickness to be applied to an entire layer (e.g., which software then converts to a desired ink fill volume per target region based upon predetermined conversion data specific to the pertinent ink); in such a case, the data could be translated to a common value for each "print cell" (which in this case might be equivalent to each target region or consist of multiple target regions). In another example, the data could represent a specific value (e.g., 50.00 pL) for one or more wells, with range data either being provided or understood based on context. As should be understood from these examples, the desired fill can be specified in many different forms including, without limitation, as thickness data or volume data. Additional filtering or processing criteria can also optionally be provided to or performed by a receiving device; for example, as referenced earlier, random variation in fill volumes could be injected by a receiving device into one or more provided thickness or volume parameters to render line effect invisible to the human eye in a finished display. Such variation could be performed in advance (and provided as respective, per-target region fills that vary from region to region) or could be independently and transparently derived from a recipient device (e.g., by a downstream computer or printer).

Based on the target fill volumes for each region and individual droplet volume measurements (i.e., per-printhead nozzle and per nozzle drive waveform), the process then optionally proceeds to calculate combinations of various droplets that sum to a fill volume within the desired tolerance range (i.e., per process block 506). As mentioned, this range can be provided with target fill data or can be "understood" based on context. In one embodiment, the range is understood to be ±one percent of a provided fill value. In another embodiment, the range is understood to be ±one-half percent of a provided fill value. Clearly, many other possibilities exist for tolerance ranges, whether larger or smaller than these exemplary ranges.

At this point, an example would help convey one possible method for calculating sets of possible droplet combinations. Returning to simplified examples described earlier, it should be assumed that there are five nozzles, each having respective hypothetical mean droplet volumes of 9.80 pL, 10.01 pL, 9.89 pL, 9.96 pL, and 10.03 pL, and that it is desired to deposit a target volume of 50.00 pL, ±½ percent (49.75 pL-50.25 pL) in five wells. This method begins by determining the number of droplets that can be combined to reach but not exceed the tolerance range and, for each nozzle, the minimum and maximum number of droplets from that nozzle that can be used in any acceptable permutation. For example, in this hypothetical, no more than a single droplet from nozzle (1), two droplets from nozzle (3) and four droplets from nozzle (4) would be expected to be usable in any combination, given the minimum and maximum droplet volumes of the nozzles under consideration. This step limits the number of combinations that need be considered. Armed with such constraints on set consideration, the method then considers combinations of the required number of droplets (five in this example), taking each nozzle in turn. For example, the method first starts with nozzle (1) with an understanding that the only acceptable combinations involving this nozzle, given calculated means, feature one drop or fewer from this nozzle. Considering combinations involving a single droplet from this nozzle, the method then considers minimum and maximum drop volumes of the other respective nozzle-waveform combinations under consideration; for example, given that nozzle (1) is determined to produce a mean droplet volume of 9.80 pL for a given drive waveform, no more than one droplet from nozzle (3) or two droplets from nozzle (4) can be used in combination with a droplet from nozzle (1) to reach the desired tolerance range. The method proceeds to consider combinations of the droplet from nozzle (1) and a combination of four droplets from other nozzles, for example, four from nozzles or (5), three droplets from nozzle (2) and one droplet from nozzle (4), and so on. Considering combinations involving nozzle (1) only, to simplify discussion, any of the following different combinations involving the first nozzle could potentially be used within the tolerance range: {1(1),4(2)}, {1(1),3(2),1(4)}, {1(1),3(2),1(5)}, {1(1),2(2),1(4),1(5)}, {1(1),1(2),1(3),2(5)}, {1(1),1(2),1(4),2(5)}, {1(1),1(2),3(5)}, {1(1),1(3),3(5)}, {1(1),2(4),2(5)}, {1(1),1(4),3(5)} and {1(1),4(5)}. In the mathematical expression set forth above, the use of brackets denotes a set of five droplets representing droplet volume combinations from one or more nozzles, with each parenthetical within these brackets identifying the specific nozzle; for example, the expression {1(1),4(2)} represents one droplet from nozzle (1) and four droplets from nozzle (2), 9.80 pL+(4×10.01 pL)=49.84 pL, which is expected to produce a composite fill within the specified tolerance range. In effect, the method in this example considers the highest number of droplets from the nozzle (1) that can be used to produce the desired tolerance, evaluates combinations involving this highest number, reduces the number by one, and repeats the process of consideration, based on the various means. In one embodiment, this process is repeated to determine all possible sets of non-redundant droplet combinations that can be used. When combinations involving nozzle (1) have been fully explored, the method proceeds to combinations involving nozzle (2) but not nozzle (1) and repeats the process, and so forth, testing the combined mean of each possible nozzle combination to determine whether it can achieve the desired tolerance range. In this embodiment for example, the method has determined that combinations of two or more droplets from nozzle (1) cannot be used, so it begins with consideration of combinations involving one droplet from nozzle (1) and four droplets from other nozzles in various combination. The method in effect evaluates whether four droplets of nozzle (2) can be used, determines that it can {1(1),4(2)}, then drops this number by one (three droplets from nozzle 2), and determines that this number can be used in combination with a single droplet from nozzles (4) or (5), yielding acceptable sets of {1(1),3(2),1(4)}, {1(1),3(2),1(5)}. The method then further reduces the number of acceptable droplets from nozzle (2) by one, and evaluates combinations of {1(1),2(2) . . . }, and then {1(1), 1 (2) . . . }, and so forth. Once combinations involving nozzle (2) have been considered in combination with a droplet from nozzle (1), the method then takes the next nozzle, nozzle (3), and considers combinations of nozzle (1) involving this nozzle but not nozzle (2) and determines that the only acceptable combination is given by {1(1),1(3),3(5)}. Once all combinations involving a droplet from nozzle (1) have been considered, the method then considers 5-droplet combinations involving droplets from nozzle (2) but not nozzle (1), e.g., {5(2)},{4(2),1(3)}, {4(2),1(4)}, {4(2),1(5)}, {3(2),2(3)}, {3(2),1(3),1(4)} and so on.

It is also noted that the same approach applies equally in the case that the nozzles can be driven by multiple firing waveforms (each generating different droplet volumes). These additional nozzle-waveform combinations simply provide additional droplet volume means for use in selecting the set of droplet combinations that are within the target volume tolerance range. The use of multiple firing waveforms can also improve the efficiency of the printing process by making available a larger number of acceptable droplet combinations and thereby increasing the likelihood of concurrently firing droplets from a large fraction of the nozzles on each pass. In the case that nozzles have multiple driving waveforms and geometric steps are also used, the selection of a set of droplet combinations will incorporate both the geometric offset to be used in a given scan and the nozzle waveform that will be used for each nozzle.

Note that, for purposes of narration, a brute force approach has been described and that a staggering number of possible combinations will typically be presented in practice, e.g., where the number of nozzles and target regions are large (e.g., more than 128 each). However, such computation is well within the capabilities of a high-speed processor having appropriate software. Also, note that there exist various mathematical shortcuts that can be applied to reduce computation. For example, in a given embodiment, the method can exclude from consideration any combination that would correspond to use of less than half of the available nozzles in any one pass (or alternatively, can limit consideration to combinations that minimize volume variance across target regions (TR) in any single pass). In one embodiment, the method determines only certain sets of droplet combinations that will produce acceptable composite fill values; in a second embodiment, the method exhaustively calculates every possible set of droplet combinations that will produce acceptable composite fill values. It is also possible to use an iterative approach where, in multiple repetitions, a print scan is performed, and volumes of ink still remaining to be deposited to reach the desired tolerance range(s) are considered for purposes of optimizing a next, succeeding scan. Other processes are also possible.

Note also that as an initial operation, if the same fill value (and tolerance) applies to each target region, it suffices to compute the combinations once (e.g. for one target region) and to store these possible droplet combinations for initial use with each target region. This is not necessarily the case for all set computation methods and for all applications (e.g., in some embodiments, the acceptable fill range can vary for every target region).

In yet another embodiment, the method uses mathematical shortcuts, such as approximations, matrix math, random selection or other techniques, to determine sets of acceptable droplet combinations for each target region.

As denoted by process block 507, once sets of acceptable combinations have been determined for each target region, the method then effectively plans scanning in a way that correlates with a particular set (or droplet combination) for each target region. This particular set selection is performed in a manner where the particular set (one for each target region) represents process savings through the use of at least one scan to deposit droplet volumes concurrently in multiple target regions. That is to say, in an ideal case, the method selects one particular set for each target region, where the particular set represents particular droplet volume combinations in a manner where a printhead can simultaneously print into multiple rows of target regions at once. The particular droplet choices in the selected combinations represent a print process matching a predetermined criterion, such as minimal printing time, minimal number of scans, minimal sizes of geometric steps, minimal aggregate geometric step distance, or other criteria. These criteria are represented by numeral 508 in FIG. 5. In one embodiment, optimization is pareto optimal, with the particular sets selected in a manner that minimizes each of number of scans, aggregate geometric step distance and sizes of geometric steps, in that order. Again, this selection of particular sets can be performed in any desired manner, with several non-limiting examples further discussed below.

In one example, the method selects a droplet from each set for each target region corresponding to a particular geometric step or waveform applied to all regions being considered, and it then subtracts this droplet from available sets and determines a remainder. For example, if choices of available sets is initially {1(1),4(2)}, {1(1),3(2),1(4), {1(1),3(2),1(5)}, {1(1),2(2),1(4),1 (5)}, {1(1),1(2),1(3),2(5)}, {1(1),1(2),1(4),2(5)}, {1(1),1(2),3(5)}, {1(1),1 (3),3(5)}, {1(1),2(4),2(5)}, {1(1),1(4),3(5)} and {1(1),4(5)} for each of five target regions, this embodiment would subtract one droplet (1) from this initial set to obtain a remainder specific to a first of the five target regions, one droplet (2) from the initial set to obtain a remainder specific to a second of the five target regions, one droplet (3) from the initial set to obtain a remainder specific to the third of the target regions, and so on. This evaluation would represent a geometric step of "0." The method would then evaluate the remainders and repeat the process for other possible geometric steps. For example, if a geometric step of "−1" was then applied, the method would subtract one droplet (2) from the initial set for the first of the five target regions, one droplet (3) from the initial set from the second of the target regions and so forth, and evaluate the remainders.

In selecting a particular geometric step (and nozzle firing) as part of print planning, the method analyzes the various remainders according to a scoring or priority function, and selects the geometric step with the best score. In one embodiment, scoring is applied to more heavily weight a step that (a) maximizes the number of nozzles used simultaneously and (b) maximizes the minimum number of combinations remaining for affected target regions. For example, a scan that used droplets from four nozzles during a scan would be more heavily favored than one that used droplets from just two nozzles. Similarly, if using the subtraction process discussed above in considering different steps resulted in 1, 2, 2, 4 and 5 remaining combinations for respective target regions for one possible step, and 2, 2, 2, 3 and 4 remaining combinations for respective target regions for a second possible step, the method would more heavily weight the latter (i.e., the largest minimum number is "2"). In practice, suitable weighting coefficients can be empirically developed. Clearly, other algorithms can be applied, and other forms of analysis or algorithmic shortcuts can be applied. For example, matrix math can be used (e.g., using an eigenvector analysis) to determine particular droplet combinations and associated scanning parameters that satisfy predetermined criteria. In another variation, other formulae can used, for example, that factor in use of planned random fill variation to mitigate line effect.

Once the particular sets and/or scan paths have been selected per numeral 507, printer actions are sequenced, per numeral 509. For example, it is noted that a set of droplets can typically be deposited in arbitrary order if aggregate fill volumes were the only consideration. If the printing is planned to minimize the number of scans or passes, the order of geometric steps can also be selected to minimize printhead/substrate motion; for example, if acceptable scans in a hypothetical example involve relative geometric steps of {0,+3,−2,+6 and −4}, these scans can be reordered to minimize printhead/substrate motion and thus further improve printing speed, for example, ordering the scans as a sequence of steps of {0,+1,+2,0 and +4}. Compared to the first sequence of geometric steps {0,+3,−2,+6 and −4}, involving an aggregate step increment distance of 15, the second sequence of geometric steps {0,+1,+2,+0 and +4} involves an aggregate step increment distance of 7, facilitating faster printer response.

As denoted by numeral 510, for applications involving large numbers of rows of target regions which are to receive the same target fill, a particular solution might also be expressed as a repeatable pattern which is then reproduced over subset areas of the substrate. For example, if in one application there were 128 nozzles arranged in a single row and 1024 rows of target regions, it is expected than an optimal scan pattern could be determined for a subset area of 255 rows of target regions or fewer; thus, the same print pattern could be applied to four or more subset areas of the substrate in this example. Some embodiments therefore take advantage of repeatable patterns as expressed by optional process block 510.

Note the use of non-transitory machine-readable media icon 511; this icon denotes that the method described above is optionally implemented as instructions for controlling one or more machines (e.g., software or firmware for controlling one or more processors). The non-transitory media can include any machine-readable physical medium, for example, a flash drive, floppy disk, tape, server storage or mass storage, dynamic random access memory (DRAM), compact disk (CD) or other local or remote storage. This storage can be embodied as part of a larger machine (e.g., resident memory in a desktop computer or printer) or on an isolated basis (e.g., flash drive or standalone storage that will later transfer a file to another computer or printer). Each function mentioned in reference to FIG. 5 can be implemented as part of a combined program or as a standalone module, either stored together on a single media expression (e.g., single floppy disk) or on multiple, separate storage devices.

As represented by numeral 513 in FIG. 5, once the planning process is completed, data will have been generated that effectively represent a set of printer instructions, comprising nozzle firing data for the printhead and instructions for relative movement between printhead and substrate to support the firing pattern. This data, effectively representing the scan path, scan order and other data, is an electronic file (513) that can either be stored for later use (e.g., as depicted by non-transitory machine-readable media icon 515), or immediately applied to control a printer (517) to deposit ink representing the selected combinations (particular sets of nozzles per target region). For example, the method can be applied on a standalone computer, with the instruction data being stored in RAM for later use, or for download to another machine. Alternatively, the method could be implemented and dynamically applied by a printer to "inbound" data, to automatically plan scanning dependent on printer parameters (such as nozzle-droplet-volume data). Many other alternatives are possible.

FIGS. 6A-6D provide diagrams that generally relate to the nozzle selection and scan planning process. Note again that scans do not have to be continuous or linear in direction or speed of movement and do not have to proceed all the way from one side of a substrate to another.

Figure 6A:
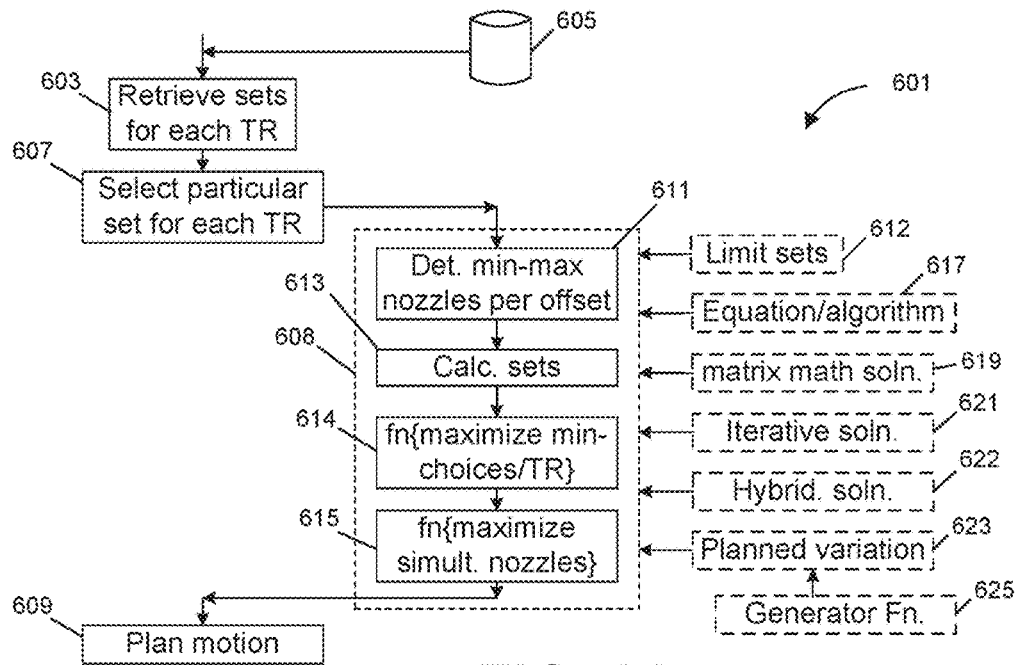
FIG. 6A provides a block diagram for choosing particular sets of acceptable droplet combinations for each target region of the substrate, usable for example with any of the embodiments introduced earlier.

A first block diagram is denoted by numeral 601 in FIG. 6A; this FIG. represents many of the exemplary processes discussed in the previous narration. The method first begins by retrieving from memory sets of acceptable droplet volume combinations for each target region, per numeral 603. These sets can be dynamically computed or could have been computed in advance, for example, using software on a different machine. Note the use of a database icon, 605, representing either a local-stored database (for example, stored in local RAM) or a remote database. The method then effectively selects a particular one of the acceptable sets for each target region (607). This selection in many embodiments is indirect, that is, the method processes the acceptable combinations to select particular scans (for example, using the techniques referenced above), and it is these scans that in effect define the particular sets. Nevertheless, by planning scanning, the method selects particular sets of combinations for each respective target region. This data is then used to order scans and finalize motion and firing patterns (609) as referenced above.

The middle and right of FIG. 6A illustrate a few process options for planning scan paths and nozzle firing patterns and, in effect, selecting a particular droplet combination for each target region in a manner that represents printing optimization. As denoted by numeral 608, the illustrated techniques represent but one possible methodology for performing this task. Per numeral 611, analysis can involve determining minimum and maximum use of each nozzle (or nozzle-waveform combination, in those instances in which a nozzle is driven by more than one firing waveform) in acceptable combinations. If a particular nozzle is bad (e.g., does not fire, or fires at an unacceptable trajectory), that nozzle can optionally be ruled out for use (and for consideration). Second, if a nozzle has either a very small or very large expected droplet volume, this may limit the number of droplets that can be used from that nozzle in acceptable combinations; numeral 611 represents advance processing that reduces the number of combinations that will be considered. As represented by numeral 612, processes/shortcuts can be used to limit the number of sets of droplet combinations that will be evaluated; for example, instead of considering "all" possible droplet combinations for each nozzle, the method can be configured to optionally rule out combinations involving fewer than half of the nozzles (or another quantity of the nozzles, such as ¼), combinations where more than one-half of the droplets come from any particular nozzle-waveform, or combinations representing a high variance in droplet volume or representing a large variance in simultaneous droplet volumes applied across target regions. Other metrics can also be used.

Subject to any limitations to the number of sets to be computed/considered, the method then proceeds to calculate and consider acceptable droplet combinations, per numeral 613. As referenced by numerals 614 and 615, various processes can be used to plan scanning and/or otherwise effectively select a particular set of droplet volumes per target region (TR). For example, as introduced above, one method assumes a scan path (e.g., particular geometric step selection) and then considers the maximum of the fewest remaining set choices across all TRs being considered; the method can favorably weight those scan paths (alternative geometric steps) that maximize ability of ensuing scans to cover multiple target regions at-once. Alternatively or in addition, the method can favorably weight geometric steps that maximize the number of nozzles used at once; returning to the simplified five-nozzle discussion above, a scan that would apply five nozzles to a target region can be weighted more favorably that a scan or pass that would fire only three nozzles in a pass. Thus, in one embodiment, the following algorithm can be applied by software:

$$S_i = [w_1 f\{\max\{\# \text{ RemCombs}_{TR,i}\} + \{\max\{\# \text{ Simult.Nozzles}_i\}\}].$$

In this exemplary equation, "i" represents the particular choice of geometric step or scan path, $w_1$ represents one empirically-determined weighting, $w_2$ represents a second empirically-determined weighting, $\# \text{ RemCombs}_{TR,i}$ represents the number of remaining combinations per target region assuming scan path i; and $\# \text{ Simult.Nozzles}_i$ represents a measure of the number of nozzles used for scan path i; note that this latter value need not be an integer, e.g., if fill values per TR are varied (for example, to hide potentially visible artifacts in a display device), a given scan path could feature varying numbers of nozzles used per column of target region, e.g., an average or some other measure can be used. Note also that these factors and the weightings are illustrative only, i.e., it is possible to use different weighting and/or considerations than these, use only one variable but not the other, or to use a completely different algorithm.

FIG. 6A also shows a number of further options. For example, consideration of droplet sets in one implementation is performed according to an equation/algorithm, per numeral 617. A comparative metric can be expressed as a score that can be calculated for each possible alternative geometric step in order to select a particular step or offset. For example, another possible algorithmic approach involves an equation with three terms, as shown below:

$$S_i = W_v(S_{v,min}/S_v) + W_e(S_e/S_{e,max}) + W_d(S_{d,min}S_d),$$

where the terms based on $S_v$, $S_e$ and $S_d$ are scores respectively computed for variance in deposited droplet volumes, efficiency (maximum nozzles used per-pass) and variation in geometric step. In one formulation, the term "$(s_{v,min}/S_v)$" seeks to minimize variation in fill volume from a per-pass target value in a manner dependent on the total number of droplets.

Numeral 619 in FIG. 6A represents that, in one embodiment, droplet combination selection can be performed using matrix math, for example, through the use of mathematical techniques that simultaneously consider all droplet volume combinations and that use a form of eigenvector analysis to select scan paths.

As represented by numeral 621, an iterative process can be applied to reduce the number of considered droplet combinations. That is, for example, as represented by the earlier narration of one possible processing technique, geometric steps can be computed one at a time. Each time a particular scan path is planned, the method determines the incremental volume still needed in each target region under consideration, and then proceeds to determine a scan or geometric offset best suited to producing aggregate volumes or fill volumes per target region that are within desired tolerances. This process can then be repeated as respective iterations until all scan paths and nozzle firing patterns have been planned.

Per numeral 622, use of a hybrid process is also possible. For example, in one embodiment, a first set of one or more scans or geometric steps can be selected and used, for example, based on minimized deviation in per-nozzle droplet volume and maximum efficiency (e.g., nozzles used per scan). Once a certain number of scans have been applied, e.g., 1, 2, 3 or more, a different algorithm can be invoked, for example, that maximizes nozzles used per scan (e.g., irrespective of deviation in applied droplet volumes). Any of the specific equations or techniques discussed above (or other techniques) can optionally be applied one of the algorithms in such a hybrid process, and other variations will no doubt occur to those skilled in the art.

Note that as referenced earlier, in an exemplary display-manufacturing process, per-target region fill volumes can have planned randomization deliberately injected (623) to mitigate line effect. In one embodiment, a generator function (625) is optionally applied to deliberately vary target fill volumes (or to skew aggregate volumes produced for the droplet combination for each target region) in a manner that achieves this planned randomization or other effect. As noted earlier, in a different embodiment, it is also possible for such variation to be factored into target fill volumes and tolerances, i.e., before droplet combinations are even analyzed, and to apply, for example, algorithmic approaches as indicated earlier to meet per-target-region fill requirements. As will be discussed below in connection with FIG. 8B, it is also possible to consider randomization as a probability distribution and to plan droplet measurements (and development of per-nozzle, per-waveform distributions) dependent on such randomization in a manner calculated to meet composite fill tolerances. For example, if randomization of planned fills is to vary normally between ±0.2% of target composite fill, and specified tolerance is ±0.5% of target composite fill, then droplet measurement for each nozzle and each nozzle-waveform combination can be planned to produce a 3σ value for each nozzle/nozzle-waveform that is within 0.3% of target (0.2%+0.3%=0.5%).

Figure 6B:
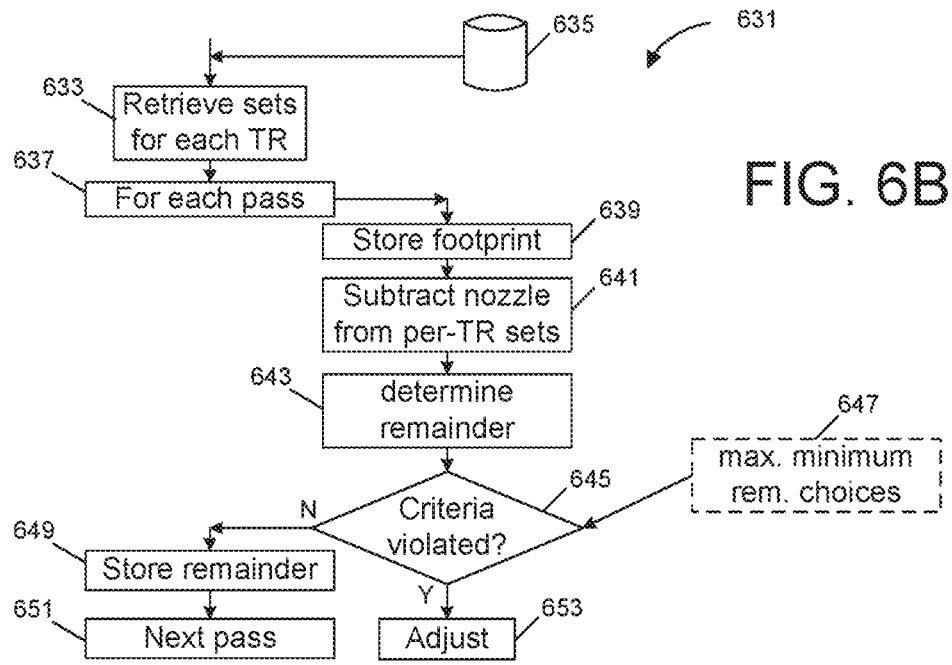
FIG. 6B provides a block diagram for iteratively planning printhead/substrate motion and using of nozzles based on combinations of droplets for each print region.

FIG. 6B and numeral 631 refer to a more detailed block diagram related to the iterative droplet combination selection process referenced above. As represented by numerals 633 and 635, possible droplet combinations are once again first identified, stored, and retrieved as appropriate, for evaluation by software. For each possible scan path (or geometric step), per numeral 637, the method stores a footprint identifying the scan path (639) and nozzles applied, and it subtracts per nozzle firings from the per-target region sets (641) to determine remainder combinations for each target region (643). These are also stored. Then, per numeral 645, the method evaluates the stored data according to predefined criteria. For example, as indicated by optional (dashed-line) block 647, a method that seeks to maximize the minimum number of droplet combinations across all pertinent target regions can assign a score indicating whether the just-stored combination is better than, or worse than, previously considered alternatives. If the specified criteria are met (645), the particular scan or geometric step can be selected, with the remainder combinations being stored or otherwise flagged for use in consideration of another printhead/substrate scan or pass, as represented by numerals 649 and 651. If the criteria are not met (or consideration is incomplete), another step can be considered and/or the method can adjust consideration of the geometric step under consideration (or a previously selected step), per numeral 653. Again, many variations are possible.

It was noted earlier that the order in which scans are performed or droplets are deposited is unimportant to ultimate composite fill value for each target region. While this is true, to maximize printing speed and throughput, scans are preferably ordered so as to result in the fastest or most efficient printing possible. Thus, if not previously factored into geometric step analysis, the sorting and/or ordering of scans or steps can then be performed. This process is represented by FIG. 6C.

Figure 6C:
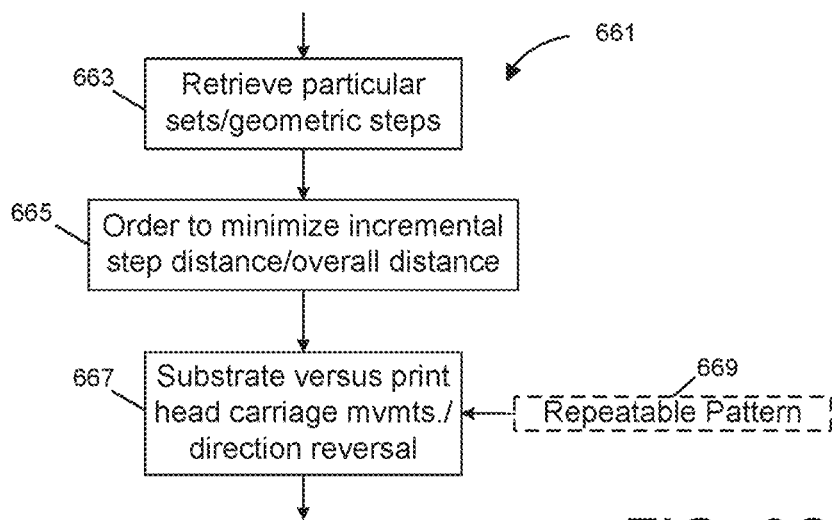
FIG. 6C provides a block diagram that illustrates further optimization of printhead/substrate motion and the use of nozzles, specifically, to order scans in a manner that printing can be performed as efficiently as possible.
Figure 6D:
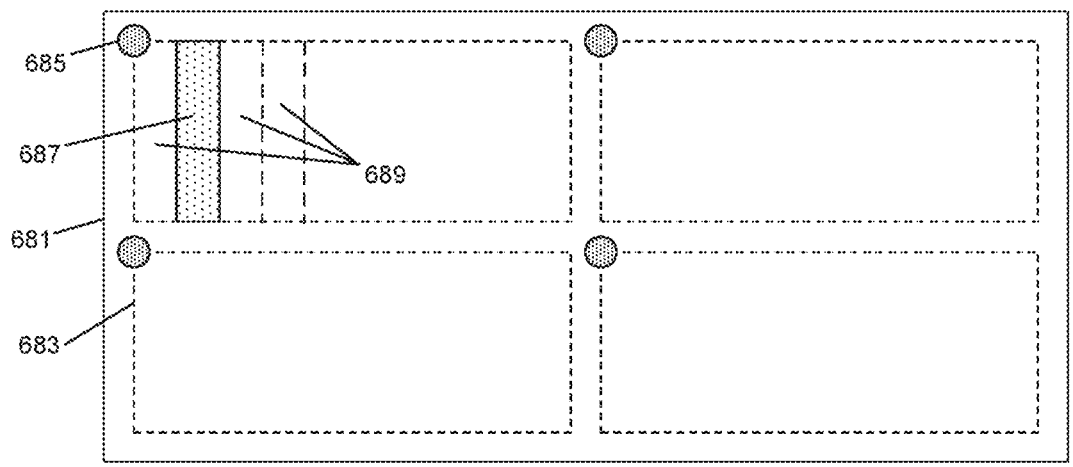
FIG. 6D is a hypothetical plan view of a substrate that will ultimately produce multiple flat panel display devices (e.g., 683); as denoted by region 687, printhead/substrate motion can be optimized for a particular region of a single flat panel display device, with optimizations being used on a repeatable or periodic basis across each display device (such as the four depicted flat panel display devices).

In particular, numeral 661 is used to generally designate the method of FIG. 6C. Software, for example, running on a suitable machine, causes a processor to retrieve (663) the selected geometric steps, particular sets, or other data that identifies the selected scan paths (and as appropriate, nozzle firing patterns, which can further include data specifying which of a plurality of firing waveforms is to be used for each droplet, in those embodiments in which certain nozzles can be driven by more than one firing waveforms). These steps or scans are then sorted or ordered in a manner that minimizes incremental step distance. For example, again referring to the hypothetical example introduced earlier, if the selected steps/scan paths were {0,+3,−2,+6 and −4}, these might be reordered to minimize each incremental step and to minimize overall (aggregate) distance traversed by a motion system in between scans. Without reordering for example, the incremental distance between these offsets would be equivalent to 3, 2, 6 and 4 (such that the aggregate distances traversed would be "15" in this example). If the scans (e.g., scans "a," "b," "c," "d" and "e") were reordered in the manner described (e.g., in order of "a," "c," "b," "e" and "d"), the incremental distances would be +1,+2, 0 and +4 (such that the aggregate distances traversed would be "7"). As denoted by numeral 667, at this point, the method can assign motion to a printhead motion system and/or a substrate motion system, and can reverse the order of nozzle firing (e.g., if alternating, reciprocal scan path directions are used, per numerals 339 and 340 of FIG. 38). As noted earlier and represented by optional process block 669, in some embodiments, planning and/or optimization can be performed for a subset of the target regions, with a solution then applied on a spatially-repeating basis over a large substrate.

This repetition is represented in part by FIG. 60. As implied by FIG. 60, it should be assumed for this narration that it is desired to fabricate an array of flat panel devices. A common substrate is represented by numeral 681, and a set of dashed-line boxes, such as box 683, represents geometry for each flat panel device. A fiducial 685, preferably with two-dimensional characteristics, is formed on the substrate and used to locate and align the various fabrication processes. Following eventual completion of these processes, each panel 683 will be separated from the common substrate using a cutting or similar process. Where the arrays of panels represent respective OLED displays, the common substrate 681 will typically be glass, with structures deposited atop the glass, followed by one or more encapsulation layers; each panel will then be inverted such that the glass substrate forms the light emitting surface of the display. For some applications, other substrate materials can be used, for example, a flexible material, transparent or opaque. As noted, many other types of devices can be manufactured according to the described techniques. A solution can be computed for a specific subset 687 of a flat panel 683. This solution can then be repeated for other, similarly-sized subsets 689 of the flat panel 683, and the entire solution set can then also be repeated for each panel to be formed from a given substrate.

Reflecting on the various techniques and considerations introduced above, a manufacturing process can be performed to mass produce products quickly and at low per-unit cost. Applied to display device manufacture, e.g., flat panel displays, these techniques enable fast, per-panel printing processes, with multiple panels produced from a common substrate. By providing for fast, repeatable printing techniques (e.g., using common inks and printheads from panel-to-panel), it is believed that printing can be substantially improved, for example, reducing per-layer printing time to a small fraction of the time that would be required without the techniques above, all while guaranteeing per-target region fill volumes are within specification. Again returning to the example of large HD television displays, it is believed that each color component layer can be accurately and reliably printed for large substrates (e.g., generation 8.5 substrates, which are approximately 220 cm×250 cm) in one hundred and eighty seconds or less, or even ninety seconds or less, representing substantial process improvement. Improving the efficiency and quality of printing paves the way for significant reductions in cost of producing large HD television displays, and thus lower end-consumer cost. As noted earlier, while display manufacture (and OLED manufacture in particular) is one application of the techniques introduced herein, these techniques can be applied to a wide variety of processes, computer, printers, software, manufacturing equipment and end-devices, and are not limited to display panels.

One benefit of the ability to deposit precise target region volumes (e.g., well volumes) within tolerance is the ability to inject deliberate variation within tolerance, as mentioned. These techniques facilitate substantial quality improvements in displays, because they provide the ability to hide pixelated artifacts of the display, rendering such "line effect" imperceptible to the human eye. FIG. 7 provides a block diagram 701, associated with one method for injecting this variation. As with the various methods and block diagrams discussed above, the block diagram 701 and related method can optionally be implemented as software, either on standalone media, or as part of a larger machine.

As denoted by numeral 703, variation can be made to depend on specific criteria. For example, it is generally understood that sensitivity of the human eye to contrast variation is a function of brightness, expected viewing distance, display resolution, color and other factors. As part of the specified criteria, a measure is used to ensure that, given typical human-eye sensitivity to spatial variation in contrast between colors at different brightness levels, such variation will be smoothed in a manner not perceptible to the human eye, e.g., varied in a manner that does not contribute human-observable patterns in (a) any direction or directions, or (b) between color components given expected viewing conditions. This can be achieved optionally using a planned randomization function, as referenced earlier. With minimum criteria specified, the target fill volumes for each color component and each pixel can be deliberately varied in a manner calculated to hide any visible artifacts from the human eye, as represented by numeral 705. Note that the right side of FIG. 7 represents various process options, for example, that variation can be made independent across color components (707), with tests for perceptible patterns applied on an algorithmic basis to ensure that fill variations do not give rise to perceptible patterns. As noted by numeral 707, for any given color component (e.g., any given ink), variation can also be made independent in each of multiple spatial dimensions, for example, x and y dimensions (709). Again, in one embodiment, not only is the variation smoothed for each dimension/color component so as to not be perceptible, but any pattern of differences between each of these dimensions is also suppressed so as to not be visible. Per numeral 711, a generator function or functions can be applied to ensure that these criteria are met, for example, by optionally assigning minor target fill variations to each target region's fill prior to droplet volume analysis, using any desired criteria. As denoted by numeral 713, in one embodiment, the variation can optionally be made to be random.

Per numeral 715, selection of the particular droplet combinations for each target region are thus weighted in favor of the selected variation criteria. This can be performed, as mentioned, via target fill variation, or at the time of droplet (e.g., scan path, nozzle-waveform combination, or both) selection. Other methods for imparting this variation also exist. For example, in one contemplated implementation, per numeral 717, the scan path is varied in a nonlinear manner, effectively varying droplet volumes across mean scan path direction. Per numeral 719, nozzle firing patterns can also be varied, for example by adjusting firing pulse rise time, fall time, voltage, pulse width or using multiple signal levels per pulse (or other forms of pulse shaping techniques) to provide minor droplet volume variations; in one embodiment, these variations can be calculated in advance, and in a different embodiment, only waveform variations that create very minor volume variations are used, with other measures employed to ensure that aggregate fills stay within specified tolerance ranges. In one embodiment, for each target region, a plurality of droplet combinations that fall within specified tolerance ranges are computed and for each target region, the selection of which droplet combination is used in that target region is varied (e.g. randomly or based on a mathematical function) or a specific waveform (i.e., used to produce a droplet of given volume) is varied for one nozzle that contributes to a selected combination, for example, providing a slight volume variation, thereby effectively varying the droplet volumes across the target regions but without varying planned scan path. Such variation can be implemented along the scan path direction over a row of target regions, over a column of target regions, or over both.

FIGS. 8A-8B are used to explain methods for developing statistical models used to evaluate droplets produced by each nozzle or nozzle-waveform combination, and optionally to plan combination of multiple droplets according to statistical means determined from measurement. Note that in the examples of FIGS. 8A-8B, statistical models are built up for droplet volumes that can be expected from a given nozzle-drive waveform pairing; in alternate embodiments, similar statistical models can be built for droplet velocity, droplet flight trajectory (e.g., relative to normal) or for some other parameter.

A method depicted by FIG. 8 is generally designated by numeral 801. Per function block 803, the method in this embodiment begins with establishment of a specification range, for example, a maximum and minimum fill for a given target region that will receive ink. In examples presented earlier, this specification range can be expressed as a mean plus or minus a specific value (e.g., 50.00 pL±0.5%), but nearly any range or expression of acceptable values can be used. In one contemplated implementation, the specified tolerance about a target is ±0.5%, but other values such as without limitation 1.0% or 2.0% can also be used. In keeping in line with earlier examples, for this embodiment, it will be assumed that the target is 50.00 pL and that the tolerance is ±0.5% (such that the acceptable range is 49.75 pL-50.25 pL), but nearly any range or acceptance criteria can be used.

Per numeral 805, one or more candidate waveforms are selected for each nozzle of a printhead or printhead assembly. In an embodiment which uses a single drive waveform only (e.g., a square voltage pulse of fixed voltage), there is no selection that need be performed. In an embodiment which permits customized waveform definition (see e.g., the discussion below associated with FIG. 148 and FIGS. 15A-8), it is typically desired to evaluate several selective waveforms representing a range of values (e.g., that can be interpolated between to ultimately identify plural acceptable waveforms for each nozzle under consideration). This selection can be performed according to a manual design process (807) (i.e., with waveforms selected by a designer and preprogrammed into a system), or a selection process can also be automated, per numeral 809.

With one or more waveforms defined for each nozzle, droplet measurements are planned for different droplet ejections for a given nozzle-waveform pairing. For example, in one embodiment, a number of droplets (e.g., "24") could be required for each nozzle, providing a basis for evaluation of a measured statistical distribution for the various droplets. A droplet measurement device (e.g., imaging or non-imaging) can be used for this purpose, as discussed herein. The 24 (or other number of) measurements could be planned for at-once measurement, or for execution in respective or multiple measurement cycles or iterations. Furthermore, in one embodiment, a threshold number of measurements can be planned for initialization, with the system then increasing a measurement dataset over time to develop strong confidence regarding measured statistical distribution; in an alternative embodiment, each measurement can be planned for a moving window of time (e.g., remeasurement can be planned "every 3 hours" or measurement data can be retained only for some limited interval of time used for analysis); thus in one embodiment, each measurement is stored with a time stamp to indicate its validity and expiration during evaluation. Whichever measurement and/or measurement retention criteria are used, the number of measurements can be planned for each nozzle-waveform pairing for purposes of statistical analysis (811). Advantageously, the respective measurements for droplets resulting from each nozzle-waveform pairing are grouped as a set and planned in a manner conducive to developing a known, common distribution format with well-understood rules for mathematical processing (including aggregation). For example, Normal, Student's-T and Poisson distributions all have associated parameters that can be combined according to known mathematical processes in order to predict an aggregate or composite distribution of fill volume that would result from a combination of individual droplets (for respective nozzle-waveform pairings). Measurement planning can thus be performed according to the techniques described herein in order to develop droplet datasets that permit statistical combination of droplets associated with potentially-different nozzle-waveform pairings in order to achieve precise fills within specified tolerance with a very high degree of confidence (e.g., typically greater than 99% confidence, per numeral 813). Accordingly, in one implementation of the described techniques, droplet measurements for each nozzle-waveform combination are planned to satisfy a set of parameters that describe a known probability distribution type (e.g., number of measurements or members n, statistical mean p and standard deviation a in the case of a Normal distribution), with measurement data (once obtained) being stored for every possible nozzle and nozzle-waveform pairing under consideration. In one embodiment, planning and measurement can be iterative, i.e., repeated until some desired criteria is reached, such as a minimum number of raw measurements (n), a minimum number of measurements satisfying some criteria, a minimum statistical spread (e.g., 3σ value meeting some criteria or desired confidence interval) or something else. Whichever planning criteria is applied (e.g., by software), the system including a droplet measurement device and printhead assembly under consideration is then subjected to droplet measurements, individually applied to each nozzle (and each drive waveform for a given nozzle) to develop a statistically-significant number of droplets measurements (815). As noted by numerals 817 and 819, such measurement is optionally performed in situ (e.g., in a printer or OLED device fabrication apparatus, optionally in presence of a controlled atmosphere), and in a manner sufficient to develop statistical confidence. Collected data can then be stored as an aggregate probability distribution (821) and/or optionally in a manner that retains individual-measurement data (e.g., including any time stamp used to window per-nozzle measurements).

As noted earlier, in one embodiment, droplets from potentially-different nozzles and/or nozzle-drive-waveforms are intelligently combined to obtain precise fills within a high degree of statistical confidence. With probability distributions of a common format being built for each nozzle, this combination (and related planning) is effectuated by combining statistical parameters for respective droplets in order to obtain precise fills (and a well-understood probability distribution for each fill). This is represented by numerals 823, 825 and 827 in FIG. 8A. More specifically, droplet means are combined in one embodiment (e.g., corresponding to associated Normal distributions) to obtain a predicted aggregate fill for a target region. As an example, if for given first and second nozzle-waveform pairings mean droplet volumes are measured as 9.98 pL and 10.03 pL, respectively, then the mean aggregate fill based on one droplet associated with each pairing is expected to be 20.01 pL ($\mu_c=\mu_1 30 \mu_2$, where Normal distributions are involved); if in this same hypothetical example, standard deviations are 0.032 pL ($\sigma_1$) and 0.035 pL ($\sigma_2$) for the respective droplets, then the expected standard deviation of the aggregate would be 0.0474 pL (i.e., based on $\sigma2_c=\sigma2_1+\sigma2_2$) and the 3σ value of the aggregate would be approximately 0.142 pL (note that 1σ equates to a confidence interval of approximately 68.27%, while 3σ equates to a confidence interval of approximately 99.73%). Similar techniques can be applied to any common distribution format via the treatment of droplet measurements for each nozzle-waveform pairing as independent random variables. Thus, techniques employed herein use droplet measurement techniques to build a statistical model for each nozzle-waveform pairing, to plan for various droplet combinations based on the analysis of aggregated random variables as represented by box 825 (in the case of a Normal Distribution). Nearly any distribution type can be used, provided the probability distribution type is amenable to random variable aggregation. As indicated by function block 827, in view of the desired specification range (e.g., 0.5% about a target), the proposed combination is analyzed (e.g., by software) to ensure that it satisfies the desired range with a high degree of statistical confidence. For example, in one embodiment, as mentioned, a desired confidence criteria (e.g., 3σ, representing a 99.73% confidence interval) is tested to ensure it fits within the desired tolerance range. As an example, if desired tolerance was 49.75-50.25 pL per the example introduced above, and a possible droplet combination was represented as a mean of 49.89 pL with a 3σ value equated to 0.07 pL, this would translate to a 99% confidence that aggregate fill would lie between 49.82 pL and 49.96 pL, well within the desired tolerance range, and the particular combination would be deemed an acceptable combination (per the droplet combination analysis functions described above). Once again, any desired statistical criteria or goodness of fit data can be used; in another embodiment, a 4σ value (99.993666%) or other value is analyzed relative to a desired tolerance range. With acceptable droplet combinations determined for each print well, specific, particular combinations of droplets for each well (representing concurrent deposition by multiple nozzles of a printhead assembly) can then be planned (see FIGS. 5-7), with ensuing printing (829) according to preplanned droplet combinations for each well.

FIG. 8B provides another method 851 for accommodating deliberate target region fill variation according to desired criteria, and optionally, for also performing a variable number of droplet measurements per nozzle (or per nozzle-waveform). More specifically, the method can be implemented once again as instructions stored on non-transitory machine-readable media that control at least one processor to perform a set of functions dictated by the instructions. A desired tolerance range is received as a first operand, "x," per numeral 853; for example, it could be specified that target region (e.g., pixel well) fill should be within a given percentage of a target volume, e.g., 50.00 pL ±0.5%. This tolerance range can be dictated by customer or industry specification, as indicated by function 855. If it is desired to plan for a deliberate variation of composite volume (e.g., random variation within a small range to avoid line effect or other noticeable artifacts in a finished display), that range is received as a second operand "y," per function 857. Based on these two operands, the method computes an effective allowable maximum variation, standard deviation or other measure, per block 859. In one embodiment, y is subtracted from x as depicted in the FIG. and equated to the effective permitted fill variation; for example, if the specification requires a fill within ±0.5% per the example above, and a deliberate random variation of ±0.1% is to be injected into a planned composite mean for a well fill (e.g., 49.95 pL-50-05 pL), then the permitted variation (prior to random variation) could be restricted to 49.80 pL-50.20 pL, again using the example of a target of 50.00 pL ±0.5%. Note that other techniques are also possible, e.g., instead of simply subtracting these measures, another set of bounding criteria could be used, for example, based on mathematics associated with statistical combination of standard deviation or variance for independent random variables; many other criteria can be applied depending on embodiment. Per block 859, the remaining range (e.g., ±0.4% of target) can then be equated with a desired confidence interval (e.g., a 3σ interval or other statistical measure) and used to assess whether possible droplet combinations are acceptable or are to be excluded from consideration per the examples given above.

Alternatively, as indicated by function blocks 861 and 863, the remaining range and associated confidence interval can be applied as criteria governing droplet measurement, in order to build desired statistical models for each droplet. For example, as represented by block 861, with a desired confidence interval defined (e.g., 3σ<=0.4% of target), a desired variance or maximum permitted variance can be identified, effectively defining a baseline number n of droplet measurements that need be taken for each nozzle-waveform combination in a manner calculated to produce statistical models meeting desired statistical criteria. For example, whether or not fill is to be deliberately varied, the desired effective tolerance range can be used to identify a number of measurements (e.g., 24, 50 or another number) that are calculated to produce statistical distributions that will be tight, and thus lead to a large number of possible droplet combinations that can be used for print planning. This calculation can be applied in a number of ways, for example (a) identifying a threshold number of measurements to be applied for each nozzle-waveform combination (e.g., 24 droplet measurements for each), or (b) identifying a threshold statistical criteria that must be met for each nozzle-waveform combination (e.g., with a potentially-variable number of measurements performed per nozzle or nozzle-waveform until the threshold criteria, e.g., variance, standard deviation, etc.). A drop test function is then applied (863) using a droplet measurement device to perform measurement, with various, exemplary functions represented by this test set forth in function box 865. For example, $n_i$ droplets can be measured for each nozzle (or nozzle-waveform pairing) "i" as indicated in box 865. For each measurement, software controlling the droplet measurement device can perform an incremental droplet volume measurement (867) and store data in memory (869). Following each measurement (or after a threshold number of measurements), the collective measurements for a given nozzle-waveform combination can be aggregated to compute (871) statistical parameters (e.g., mean and standard deviation, μ and σ in the case of a Normal distribution-type) for the specific nozzle-waveform combination. These values can then be stored in memory (873). Optionally, these same or different measurement techniques can be applied to store one or multiple droplet measurements for velocity, v, and x and y dimension trajectory (α and β), per function box 874. As reflected by numeral 875, a decision criteria can then be applied to determine whether sufficient measurements have been taken for the given parameter (e.g., volume) for the particular nozzle-waveform combination (i), or whether additional measurements are desired. If additional measurements are needed, the method loops per flow arrow 877 to procure such additional measurements, i.e., so that a statistical model meeting desired robustness criteria can be built for the particular nozzle-waveform combination. If no additional measurements are needed, the method can then proceed to the next nozzle 879, looping as appropriate per flow arrow 881 until all nozzles and/or nozzle-waveform combinations have been processed. Note that this order is not required for all embodiments; for example, loops 877 and 881 can be changed in order, e.g., with droplet measurements performed for each nozzle in succession, with this process repeated until sufficiently robust data has been obtained; such a process provides certain advantages for example, for embodiments where droplet measurement is to be incrementally performed, in a manner stacked against other system processes (see, e.g., the discussion of FIG. 19, below). Once all nozzles or nozzle-waveform combinations have been sufficiently tested, the method ends or temporarily halts if run on an intermittent basis, per numeral 883. For the described droplet testing, the obtained data including measured data and/or calculated statistical parameters are stored in machine-readable memory 885, for use for example in droplet combination planning as discussed above. The procured data can also optionally be used in other manner in lieu of or in addition to intelligent mixing of different droplet volumes. In one embodiment, as mentioned, the stored data can represent any desired droplet parameter including one or more of droplet volume, droplet volume and/or droplet trajectory, again, in the form of individual measurements and/or statistical parameters.

Figure 9A:
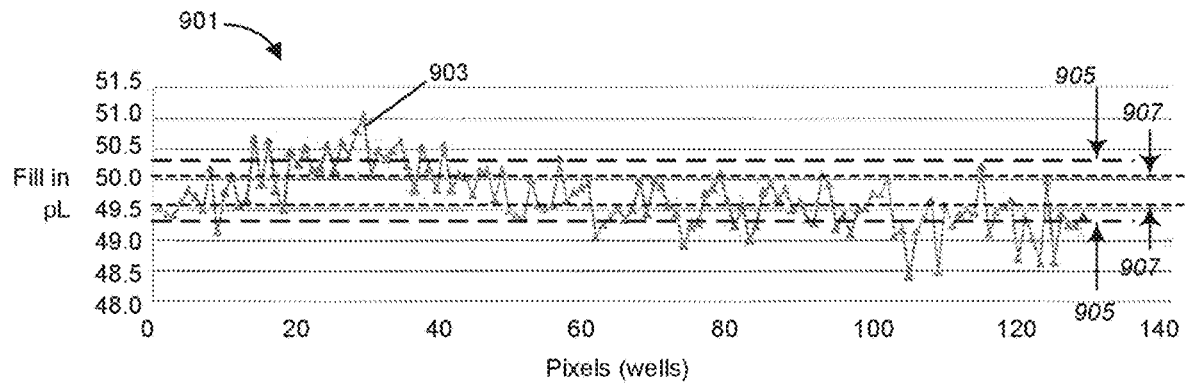
FIG. 9A provides a graph that shows variation in target region fill volume without adjustments for nozzle-to-nozzle droplet volume variation of a printhead.
Figure 9B:
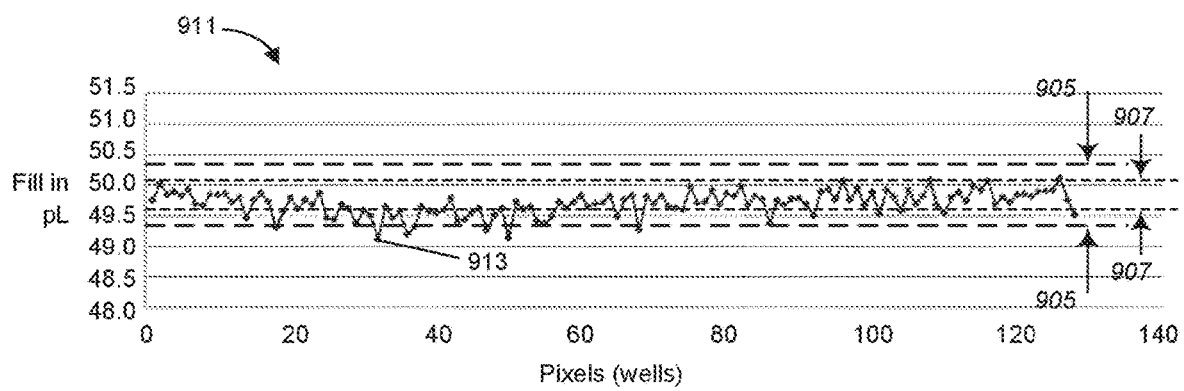
FIG. 9B provides a graph that shows variation in target region fill volume where different nozzles are randomly used to statistically compensate for nozzle-to-nozzle droplet volume variation of a printhead.
Figure 9C:
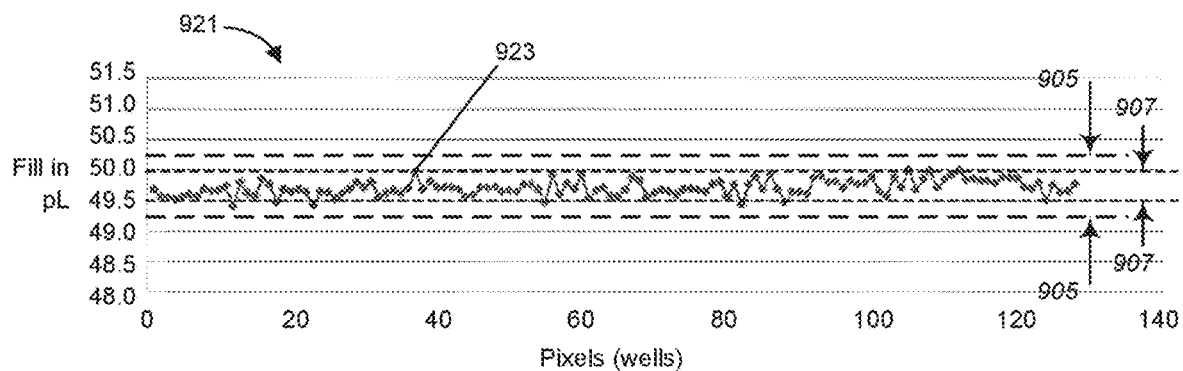
FIG. 9C provides a graph that shows variation in target region fill volume where one or more droplets of different volumes are used to achieve target region fill volume within precise tolerances on a planned basis.
Figure 10A:
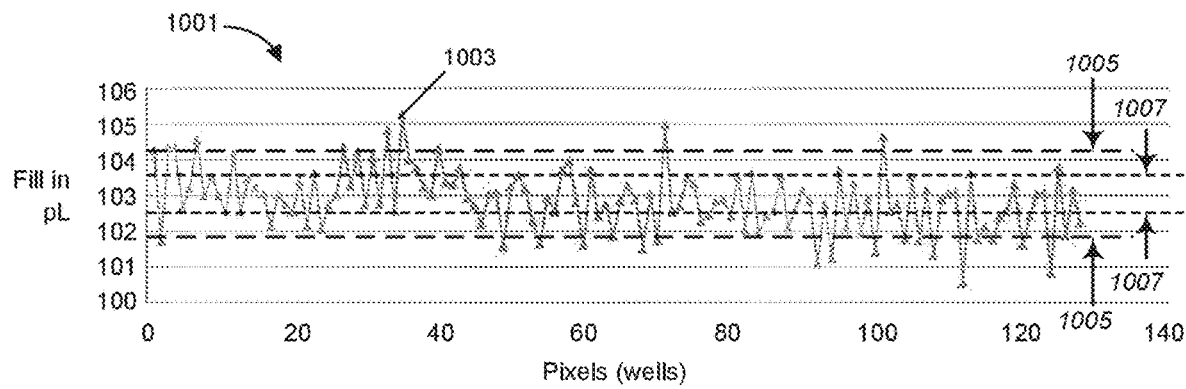
FIG. 10A provides a graph that shows variation in target region fill volume without adjustments for nozzle-to-nozzle droplet volume variation of a printhead.
Figure 10B:
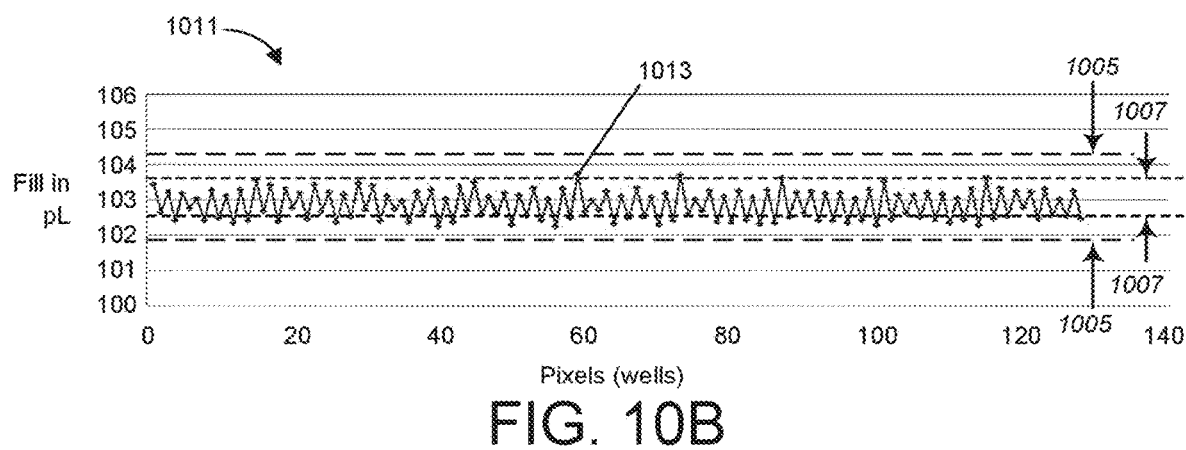
FIG. 10B provides a graph that shows variation in target region fill volume where different nozzles are randomly used to statistically compensate for nozzle-to-nozzle droplet volume variation of a printhead.
Figure 10C:
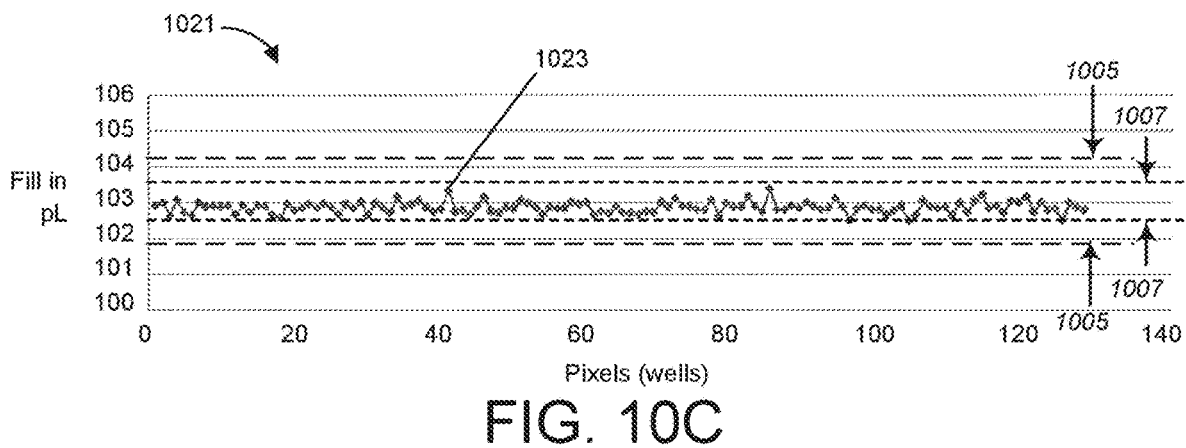
FIG. 10C provides a graph that shows variation in target region fill volume where one or more droplets of different volumes are used to achieve target region fill volume within precise tolerances on a planned basis.

FIGS. 9A-10C are used to provide simulation data for techniques discussed here. FIGS. 9A-9C represent expected composite fill volumes based on five droplets, whereas FIGS. 10A-10C represent expected composite fill volumes based on ten droplets. For each of these figures, the letter designation "A" (e.g., FIGS. 9A and 10A) represents a situation where nozzles are used to deposit droplets without consideration as to volume differences. By contrast, the letter designation "B" (e.g., FIGS. 9B and 10B) represents situations where a random combination of (5 or 10) droplets are selected to "average out" expected volume differences between nozzles. Finally, the letter designation "C" (e.g., FIGS. 9C and 10C) represents situations where scans and nozzle firings are dependent on specific aggregate ink volumes per target region that seek to minimize aggregate fill variance across target regions. In these various FIGS., the variation per nozzle is assumed to be consistent with variation observed in actual devices, each vertical axis represents aggregate fill volumes in pL, and each horizontal axis represents the number of target regions, for example, pixel wells or pixel color components. Note that the emphasis of these FIGS. is to show variation in aggregate fill volumes, assuming randomly distributed droplet variations about an assumed average. For FIGS. 9A-9C, the average volume per nozzle is assumed to be slightly below 10.00 pL per nozzle, and for FIGS. 10A-10C, the average droplet volume per nozzle is assumed to be slightly above 10.00 pL per nozzle.

A first graph 901 represented in FIG. 9A shows per-well volume variations assuming differences in nozzle droplet volumes with no attempt to mitigate these differences. Note that these variations can be extreme (e.g., per peak 903), with a range of aggregate fill volumes of about ±2.61%. As mentioned, the average of five droplets is slightly below 50.00 pL; FIG. 9A shows two sets of sample tolerance ranges centered about this average, including a first range 905 representing a range of ±1.00% centered about this value, and a second range 907 representing a range of ±0.50% centered about this value. As is seen by the numerous peaks and troughs that exceed either range (e.g., peak 903), such a printing process results in numerous wells that would fail to meet specification (e.g., either one or the other of these ranges).

A second graph 911 represented in FIG. 9B shows per-well volume variations using a randomized set of five nozzles per well, in an effort to statistically average out the effects of droplet volume variation. Note that such a technique does not permit precise production of a specific volume of ink in any particular well, nor does such a process guarantee aggregate volumes within range. For example, although the percentage of fill volumes falling outside of specification represents a much better case than represented by FIG. 9A, there are still situations where individual wells (such as identified by trough 913) fall outside of specification, for example the ±1.00% and ±0.50% variation represented by numerals 905 and 907, respectively. In such a case, the min/max error is ±1.01%, reflecting the improvement with random mixing relative to the data presented in FIG. 9A.

FIG. 9C represents a third case, using specific combinations of per-nozzle droplets according to techniques above. In particular, a graph 921 shows that variation is entirely within a ±1.00% range and quite close to meeting a ±0.50% range for all represented target regions; once again, these ranges are represented by numerals 905 and 907, respectively. In this example, five specifically elected droplet volumes are used to fill the wells in each scan line, with the printhead/substrate shifts as appropriate for each pass or scan. The min/max error is ±0.595%, reflecting further improvement with this form of "smart mixing." Note that the improvements and data observations will be consistent for any form of intelligent, droplet volume combinations to achieve specific fills or tolerance ranges, e.g., where offsets between nozzle rows (or multiple printheads) are used, or where multiple preselected drive waveforms are used to permit combination of specifically selected droplet volumes.

As mentioned, FIGS. 10A-10C present similar data, but assuming combinations of 10 droplets per well, with an average droplet volume of about 10.30 pl per nozzle. In particular, graph 1001 in FIG. 10A represents a case where no attention is given to mitigating droplet volume differences, graph 1011 in FIG. 10B represents a case where droplets are applied randomly in an effort to statistically "average out" volume differences, and graph 1021 in FIG. 10C represents a case of planned mixing of specific droplets (to achieve the average fill volumes of FIGS. 10A/10B, i.e., approximately 103.10 pL). These various FIGS. show tolerance ranges of ±1.00% and ±0.50% variation about this average, respectively denoted using range arrows 1005 and 1007. Each of the FIGS. further shows respective peaks 1003, 1013 and 1023 represented by variation. Note however, that FIG. 10A represents a variation of ±2.27% about target, FIG. 10B represents a variation of ±0.707% about target and FIG. 10C represents a variation of ±0.447% about target. With the averaging of a larger number of droplets, the "random droplet" solution of FIG. 10B is seen to achieve a ±1.00% tolerance range about the average but not a ±0.50% range. By contrast, the solution depicted by FIG. 10C is seen to meet both tolerance ranges, demonstrating that variation can be constrained to lie within specification while still permitting variation in droplet combinations from well-to-well.

One optional embodiment of the techniques described in this disclosure is as follows. For a printing process in which nozzles with a droplet volume standard deviation of x % are used to deposit aggregate fill volumes having a maximum variation of ±y %, conventionally, there exist few means of guaranteeing that aggregate fill volumes will vary by ±y %. This presents a potential problem. A droplet averaging technique (e.g., as represented by the data seen in FIGS. 9B and 10B) statistically reduces the standard deviation of aggregate volumes across target regions to $x \%/(n)^{1/2}$, where n is the average number of droplets needed per target region to achieve desired fill volumes. However, even with such a statistical approach, there is no mechanism for reliably ensuring that actual target region fill volumes will in fact sit within a maximum error bound of ±y % particularly if y and n are small. The techniques discussed herein provide a mechanism for providing such reliability by guaranteeing a known percentage of target regions and achieve composite fills within ±y %. One optional embodiment therefore provides a method of generating control data, or controlling a printer, and related apparatuses, systems, software and improvements where the standard deviation of volume across target regions is better than $x \%/(n)^{1/2}$ (e.g., substantially better than $x \%/(n)^{1/2}$. In a specific implementation, this condition is met under circumstances where printhead nozzles are concurrently used to deposit droplets in respective rows of target regions (e.g., respective pixel wells) with each scan.

With a set of basic techniques for combining droplets such that the sum of their volumes is specifically chosen to meet specific targets thus described, this document will now turn to a more detailed discussion of specific devices and applications that can benefit from these principles. This discussion is intended to be non-limiting, i.e., to describe a handful of specifically contemplated implementations for practicing the methods introduced above.

As seen in FIG. 11, a multi-chambered fabrication apparatus 1101 includes several general modules or subsystems including a transfer module 1103, a printing module 1105 and a processing module 1107. Each module maintains a controlled environment, such that printing for example can be performed by the printing module 1105 in a first controlled atmosphere and other processing, for example, another deposition process such an inorganic encapsulation layer deposition or a curing process (e.g., for printed materials), can be performed in a second controlled atmosphere. The apparatus 1101 uses one or more mechanical handlers to move a substrate between modules without exposing the substrate to an uncontrolled atmosphere. Within any given module, it is possible to use other substrate handling systems and/or specific devices and control systems adapted to the processing to be performed for that module.

Various embodiments of the transfer module 1103 can include an input loadlock 1109 (i.e., a chamber that provides buffering between different environments while maintaining a controlled atmosphere), a transfer chamber 1111 (also having a handler for transporting a substrate), and an atmospheric buffer chamber 1113. Within the printing module 1105, it is possible to use other substrate handling mechanisms such as a flotation table for stable support of a substrate during a printing process. Additionally, an xyz-motion system, such as a split axis or gantry motion system, can be used for precise positioning of at least one printhead relative to the substrate, as well as providing a y-axis conveyance system for the transport of the substrate through the printing module 1105. It is also possible within the printing chamber to use multiple inks for printing, e.g., using respective printhead assemblies such that, for example, two different types of deposition processes can be performed within the printing module in a controlled atmosphere. The printing module 1105 can comprise a gas enclosure 1115 housing an inkjet printing system, with means for introducing an inert atmosphere (e.g., nitrogen, a noble gas, another similar gas, or a combination thereof) and otherwise controlling the atmosphere for environmental regulation (e.g., temperature and pressure), gas constituency and particulate presence.

A processing module 1107 can include, for example, a transfer chamber 1116; this transfer chamber also has a handler for transporting a substrate. In addition, the processing module can also include an output loadlock 1117, a nitrogen stack buffer 1119, and a curing chamber 1121. In some applications, the curing chamber can be used to cure a monomer film into a uniform polymer film, for example, using a heat or UV radiation cure process.

In one application, the apparatus 1101 is adapted for bulk production of liquid crystal display screens or OLED display screens in bulk, for example, the fabrication of an array of eight screens at once on a single large substrate. These screens can be used for televisions and as display screens for other forms of electronic devices. In a second application, the apparatus can be used for bulk production of solar panels in much the same manner.

Applied to the droplet-volume combination techniques described above, the printing module 1105 can advantageously be used in display panel manufacture to deposit one or more layers, such as light filtering layers, light emissive layers, barrier layers, conductive layers, organic or inorganic layers, encapsulation layers and other types of materials. For example, the depicted apparatus 1101 can be loaded with a substrate and can be controlled to move the substrate back and forth between the various chambers to deposit and/or cure or harden one or more printed layers, all in a manner uninterrupted by intervening exposure to an uncontrolled atmosphere. Optionally, ink droplet measurement (if used in connection with the depicted system) can be performed as a substrate is being moved or processed in any chamber. For example, a first substrate can be loaded via the input loadlock 1109, and during this process, a printhead assembly within printing module 1105 can be engaged with a droplet measurement device to perform droplet measurements for a subset of print nozzles; in an embodiment having many print nozzles, droplet measurement can be made periodic and intermittent, such that in between various printing cycles, different nozzles representing a circular-progressive subset of all nozzles of the print assembly are calibrated, and associated droplets measured to develop statistical models for each of droplet volume, angle of ejection (relative to normal) and velocity. A handler positioned in the transfer module 1103 can move the first substrate from the input loadlock 1109 to the printing module 1105, at which time droplet measurement is disengaged, and the printhead assembly moved to a position for active printing. Following completion of a printing process, the first substrate can then be moved to the processing module 1107 for cure. Once again, a new cycle of droplet measurement can be performed, and a second substrate can optionally be loaded into the input loadlock 1109 (if supported by the system). Many other alternatives and process combinations are possible. By repeated deposition of subsequent layers, e.g., by moving the first substrate back and forth for repeated iterations of printing and cure, each of controlled volume per target region, aggregate layer properties can be built up to suit any desired application. In an alternate embodiment, the output loadlock 1117 can be used to transfer the first substrate to a second printer (e.g., for sequential, pipelined printing a new layer, e.g., a new OLED material layer or an encapsulation or other layer. Note once again that the techniques described above are not limited to display panel manufacturing processes, and that many different types of tools can be used. For example, the configuration of the apparatus 1101 can be varied to place the various modules 1103, 1105 and 1107 in different juxtaposition; also, additional modules or fewer modules can also be used. As denoted by numerals 1121 and 1123, a computing device (e.g., a processor) running suitable software can be used to control various processes and to perform optional droplet measurement as described above in tandem with other processes, i.e., to minimize downtime of the apparatus, to maintain droplet measurements as current as possible while maintaining a robust statistical model, and to stack droplet measurement processes as much as possible to overlap other system processes.

While FIG. 11 provides one example of a set of linked chambers or fabrication components, clearly many other possibilities exist. The ink droplet measurement and deposition techniques introduced above can be used with the device depicted in FIG. 11, or indeed, to control a fabrication process performed by any other type of deposition equipment.

FIG. 12 provides a block diagram showing various subsystems of one apparatus that can be used to fabricate devices having one or more layers as specified herein. Coordination over the various subsystems is provided by a processor 1203, acting under instructions provided by software (not shown in FIG. 12). During a fabrication process, the processor feeds data to a printhead 1205 to cause the printhead to eject various volumes of ink depending on nozzle firing instructions. The printhead 1205 typically has multiple ink jet nozzles, arranged in a row (or rows of an array), and associated reservoirs that permit jetting of ink responsive to activation of a piezoelectric or other transducer per nozzle; such a transducer causes a nozzle to eject a controlled amount of ink in an amount governed by an electronic nozzle drive waveform signal applied to the corresponding piezoelectric transducer. If multiple printheads are present, there can be a processor for each printhead, or one processor can control an entire printhead assembly. Other firing mechanisms can also be used. Each printhead applies the ink to a substrate 1207 at various x-y positions corresponding to the grid coordinates within various print cells, as represented by the halftone print image. Variation in position is effected both by a printhead motion system 1209 and substrate handling system 1211 (e.g., that cause the printing to describe one or more swaths across the substrate). In one embodiment, the printhead motion system 1209 moves the printhead(s) back-and-forth along a traveler, while the substrate handling system provides stable substrate support and "y" dimension transport of the substrate to enable "split-axis" printing of any portion of the substrate; the substrate handling system provides relatively fast y-dimension transport, while the printhead motion system 1209 provides relatively slow x-dimension transport. In another embodiment, the substrate handling system 1211 can provide both x- and y-dimension transport. In yet another embodiment, primary transport can be provided entirely by the substrate handling system 1211. An image capture device 1213 can be used to locate any fiducials and assist with alignment and/or error detection.

The apparatus also comprises an ink delivery system 1215 and a printhead maintenance system 1217 to assist with the printing operation. The printhead can be periodically calibrated or subjected to a maintenance process; to this end, during a maintenance sequence, the printhead maintenance system 1217 is used to perform appropriate priming, purge of ink or gas, testing and calibration, and other operations, as appropriate to the particular process.

As was introduced previously, the printing process can be performed in a controlled environment, that is, in a manner that presents a reduced risk of contaminants that might degrade effectiveness of a deposited layer. To this effect, the apparatus includes a chamber control subsystem 1219 that controls atmosphere within the chamber, as denoted by function block 1221. Optional process variations, as mentioned, can include performing jetting of deposition material in presence of an ambient nitrogen gas atmosphere.

As previously mentioned, in embodiments disclosed herein, individual droplet volumes are combined to achieve specific fill volumes per target region, selected in dependence on a target fill volume. A specific fill volume can be planned for each target region, with fill value varying about a target value within an acceptable tolerance range. For such embodiments, droplet volumes are specifically measured, in a manner dependent on ink, nozzle, drive waveform, and other factors. To this end, reference numeral 1223 denotes an optional droplet volume measurement system, where droplet volumes 1225 are measured for each nozzle and for each drive waveform and are then stored in memory 1227. Such a droplet measurement system, as mentioned earlier, can be an optical strobe camera or laser scanning device (or other volume measurement tool) incorporated into a commercial printing device. In one embodiment, such a device uses non-imaging techniques (e.g., using simple optical detectors instead of image processing software that operates on pixels) to achieve real-time or near real time measurement of individual droplet volumes, deposition flight angle or trajectory and droplet velocity. This data is provided to processor(s) 1203 either during printing, or during a one-time, intermittent or periodic calibration operation. As indicated by numeral 1229, a prearranged set of firing waveforms can also optionally be associated with each nozzle, for later use in producing specific per-target region droplet combinations; if such a set of waveforms is used for the embodiment, droplet volume measurements are advantageously computed during calibration using the droplet measurement system 1223 for each nozzle, for each waveform. Providing a real-time or near-real-time droplet volume measurement system greatly enhances reliability in providing target region volume fills within the desired tolerance range, as measurements can be taken as needed and processed (e.g., averaged) to minimize statistical volume measurement error.

Numeral 1231 refers to the use of print optimization software running on processor 1203. More specifically, this software, based on statistical models of droplet volumes 1225 (measured in situ or otherwise provided), uses this information to plan printing in a way that combines droplet volumes as appropriate to obtain per target region specific fill volumes. In one embodiment, per the examples above, the aggregate volume can be planned down to the resolution of 0.01 pl or better, within a certain error tolerance, notwithstanding that the droplet measurement device may have a lower precision associated with individual droplet measurement; that is, by using techniques described herein to build a statistical model of droplet volume per-nozzle and per-nozzle/waveform combination, a degree of statistical accuracy can be deduced than represented by the precision of the droplet measurement system. Once printing has been planned, the processor(s) calculate(s) printing parameters such as number and sequence of scans, droplet sizes, relative droplet firing times, and similar information, and builds a print image used to determine nozzle firing for each scan. In one embodiment, the print image is a halftone image. In another embodiment, a printhead has multiple nozzles, as many as 10,000. As will be described below, each droplet can be described according to a time value and a firing value (e.g., data describing a firing waveform or data indicating whether a droplet will be "digitally" fired). In an embodiment where geometric steps and binary nozzle firing decisions are relied upon to vary droplet volumes per well, each droplet can be defined by a bit of data, a step value (or scan number) and a positional value indicating where the droplet is to be placed. In an implementation where scans represent continuous motion, a time value can be used as the equivalent of a positional value. Whether rooted in time/distance or absolute position, the value describes a position relative to a reference (e.g., a synchronization mark, position or pulse) that specifies with precision where and when a nozzle should be fired. In some embodiments, multiple values can be used. For example, in one specifically contemplated embodiment, a sync pulse is generated for each nozzle in a manner that corresponds to each micron of relative printhead/substrate motion during a scan; relative to each sync pulse, each nozzle is programmed with (a) an offset value describing an integer clock cycle delay before the nozzle is fired, (b) a 4-bit waveform selection signal, to describe one of fifteen waveform selections preprogrammed into memory dedicated to the particular nozzle driver (i.e., with one of the sixteen possible values specifying an "off" or non-firing state of the nozzle), and (c) a repeatability value specifying whether the nozzle should be fired once only, once for every sync pulse or once for every n sync pulses. In such a case, the waveform selection and an address for each nozzle are associated by the processor(s) 1203 with specific droplet volume data stored in memory 1227, with firing of a specific waveform from a specific nozzle representing a planned decision that a specific, corresponding droplet volume is to be used to supply aggregate ink to a specific target region of the substrate.

FIGS. 13A-15D will be used to introduce other techniques that can be used to combine different droplet volumes to obtain precision within-tolerance fill volumes for each target region. In a first technique, rows of nozzles can be selectively offset relative to one another within a printhead assembly during printing (e.g., in between scans). This technique is introduced with reference to FIGS. 13A-13B. In a second technique, nozzle drive waveforms can be used to adjust piezoelectric transducer firing and thus properties of each ejected droplet (including volume). FIGS. 14A-14B are used to discuss several options. Finally, in one embodiment, a set of multiple, alternative droplet firing waveforms are computed in advance and made available for use with each print nozzle. This technique and related circuitry is discussed with reference to FIGS. 15A-B.

FIG. 13A provides a plan diagram 1301 of a printhead 1303 traversing a substrate 1305 in a scanning direction indicated by arrow 1307. The substrate is seen here to consist of a number of pixels 1309 with each pixel having wells 1309-R, 1309-G and 1309-B associated with respective color components. Note again that this depiction is an example only, i.e., techniques as used herein can be applied to any layer of a display (e.g., not limited to individual color components, and not limited to color imparting layers); these techniques can also be used to make things other than display devices. In this case, it is intended that the printhead deposit one ink at a time, and assuming that the inks are color component-specific, separate printing processes will be performed, each for one of the color components, for respective wells of the display. Thus, if a first process is being used to deposit an ink specific to red light generation, only a first well of each pixel, such as well 1309-R of pixel 1309 and a similar well of pixel 1311, will receive ink in the first printing process. In a second printing process, only the second well (1309-G) of pixel 1309 and a similar well of pixel 1311 will receive a second ink, and so forth. The various wells are thus seen as three different overlapping arrays of target regions (in this case, fluid receptacles or wells).

The printhead 1303 includes a number of nozzles, such as denoted using numbers 1313, 1315 and 1317. In this case, each of numbers refers to a separate row of nozzles, with the rows extending along a column axis 1318 of the substrate. Nozzles 1313, 1315 and 1317 are seen to form a first column of nozzles, relative to the substrate 1305, and nozzles 1329 represent a second column of nozzles. As depicted by FIG. 13A, the nozzles do not align with the pixels and, as the printhead traverses the substrate in a scan, some nozzles will pass over target regions while other nozzles will not. Furthermore, in the FIG., while print nozzles 1313, 1315 and 1317 will precisely align to the center of a row of pixels beginning with pixel 1309 and while the print nozzles 1329 will also pass over the row of pixels beginning with pixel 1311, the alignment of print nozzles 1329 is not precise to the center of the pixel 1311 and its associated row. This alignment/misalignment of the columns of nozzles with the rows of wells is respectively depicted by lines 1325 and 1327, which denote centers of print wells that are to receive ink. In many applications, the precise location at which the droplet is deposited within a target region is not important, and such misalignments are acceptable (e.g., it may be desired to roughly align some group of multiple nozzles with each row, as discussed in connection with FIGS. 1B and 4D).

FIG. 13B provides a second view 1331, in which it is seen that all three rows of nozzles (or individual printheads) have been rotated by approximately thirty degrees relative to axis 1318. This optional capability was referenced earlier by numeral 338 in FIG. 38. More specifically, because of the rotation, the spacing of the nozzles along the column axis 1318 has now changed, with each column of nozzles aligning with well centers 1325 and 1327, or otherwise adjusted so as to increase nozzle apparent density per target print region during a scan. Note however, that because of such rotation and scanning motion 1307, nozzles from each column of nozzles will cross a column of pixels (e.g., 1309 and 1311) at different relative times, and thus potentially have different positional firing data (e.g., different timing for firing droplets). Methods for adjusting firing data for each nozzle will be discussed below in connection with FIGS. 15A-B.

As represented in FIG. 13C, in one embodiment, a printhead assembly optionally endowed with multiple printheads or rows of nozzles can have such rows selectively offset from one another. That is, FIG. 13C provides another plan view, where each of printheads (or nozzle rows) 1319, 1321 and 1323 are offset relative to one another, as represented by offset arrows 1353 and 1355. These arrows represent use of an optional motion mechanism, one for each row of nozzles, to permit selective offset of the corresponding row, relative to the printhead assembly. This provides for different combinations of nozzles (and associated specific droplet volumes) with each scan, and thus for different specific droplet combinations (e.g., per numeral 1307). For example, in such an embodiment, and as depicted by FIG. 13C, such an offset permits both of nozzles 1313 and 1357 to align with center line 1325 and thus have their respective droplet volumes combined in a single pass. Note that this embodiment is considered a specific instance of embodiments which vary geometric steps, e.g., even if the geometric step size between successive scans of a printhead assembly 1303 relative to the substrate 1305 is fixed, each such scan motion of a given row of nozzles is effectively positioned at a variable offset or step using the motion mechanism relative to a given row's position in other scans. Also or alternatively, such offset can be performed to adjust an effective print grid, to provided varied spacings between deposited droplets. Consistent with the principles introduced earlier, the use of optional offsets permits individual-per-nozzle droplet volumes to be aggregated in particular combinations (or droplet sets) for each well, but with a reduced number of scans or passes. For example, with the embodiment depicted in 13C, three droplets could be deposited in each target region (e.g., wells for red color component) with each scan, and further, the offsets permit planned variation of droplet volume and/or spatial combinations.

Figure 13D:
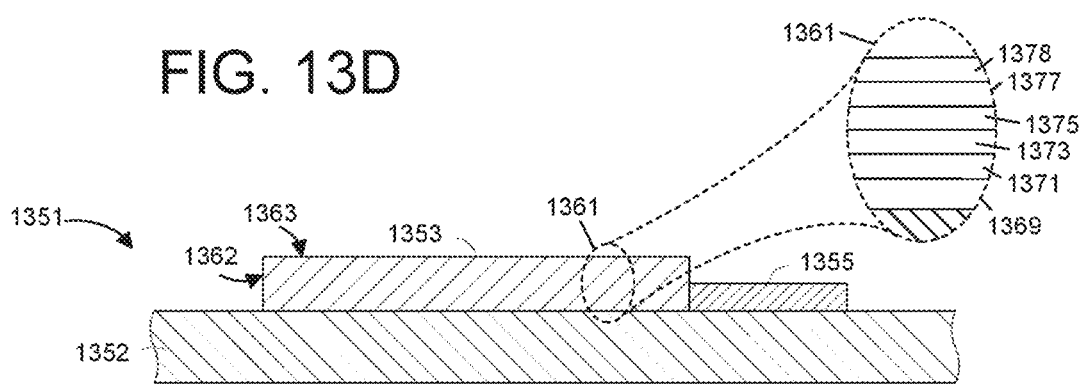
FIG. 13D shows a cross-section of a substrate, including layers that can be used in an organic light-emitting diode (OLED) display.
Figure 13C:
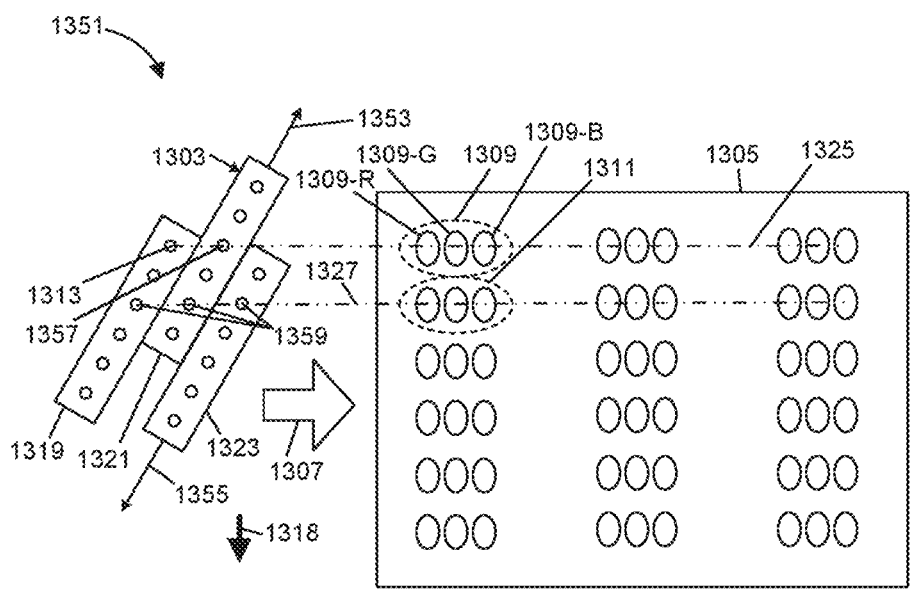
FIG. 13C shows offset of individual ones of the multiple printheads in association with intelligent scanning, to deliberately produce specific droplet volume combinations.

FIG. 13D illustrates a cross-section of a finished display for one well (e.g., well 1309-R from FIG. 13A), taken in the direction of scanning. In particular, this view shows the substrate 1352 of a flat panel display, in particular, an OLED device. The depicted cross-section shows an active region 1353 and conductive terminals 1355 to receive electrical signals to control the display (including color of each pixel). A small elliptical region 1361 of the view is seen magnified at the right side of the FIG. to illustrate layers in the active region above the substrate 1352. These layers respectively include an anode layer 1369, a hole injection layer ("HIL") 1371, a hole transport layer ("HTL") 1373, an emissive or light emitting layer ("EML") 1375, an electron transport layer ("ETL") 1377 and a cathode layer 1378. Additional layers, such as polarizers, barrier layers, primers and other materials can also be included. In some cases, the OLED device can include only a subset of these layers. When the depicted stack is eventually operated following manufacture, current flow causes the recombination of electrons and "holes" in the EML, resulting in the emission of light. The anode layer 1369 can comprise one or more transparent electrodes common to several color components and/or pixels; for example, the anode can be formed from indium tin oxide (ITO). The anode layer 1369 can also be reflective or opaque, and other materials can be used. The cathode layer 1378 typically consists of patterned electrodes to provide selective control to each color component for each pixel. The cathode layer can comprise a reflective metal layer, such as aluminum. The cathode layer can also comprise an opaque layer or a transparent layer, such as a thin layer of metal combined with a layer of ITO. Together, the cathode and anode serve to supply and collect the electrons and holes that pass into and/or through the OLED stack. The HIL 1371 typically functions to transport holes from the anode into the HTL. The HTL 1373 typically functions to transport holes from the HIL into the EML while also impeding the transport of electrons from the EML into the HTL. The ETL 1377 typically functions to transport electrons from the cathode into the EML while also impeding the transport of electrons from the EML into the ETL. Together these layers thereby serve to supply electrons and holes into the EML 1375 and confine those electrons and holes in that layer, so that they can recombine to generate light. Typically, the EML consists of separately-controlled, active materials for each of three primary colors, red, green and blue, for each pixel of the display, and as mentioned, is represented in this case by a red light producing material.

Layers in the active region can be degraded through exposure to oxygen and/or moisture. It is therefore desired to enhance OLED lifetime by encapsulating these layers, both on faces and sides (1362/1363) of those layers opposite the substrate, as well as lateral edges. The purpose of encapsulation is to provide an oxygen and/or moisture resistant barrier. Such encapsulation can be formed, in whole or in part, via the deposition of one or more thin film layers.

The techniques discussed herein can be used to deposit any of these layers, as well as combinations of such layers. Thus, in one contemplated application, the techniques discussed herein provide the ink volume for the EML layer for each of the three primary colors. In another application, the techniques discussed herein are used to provide ink volume for the HIL layer, and so on. In yet another application, the techniques discussed herein are used to provide ink volume for one or more OLED encapsulation layers. The printing techniques discussed herein can be used to deposit organic or inorganic layers, as appropriate to the process technology, and layers for other types of displays and non-display devices.

Figure 14A:
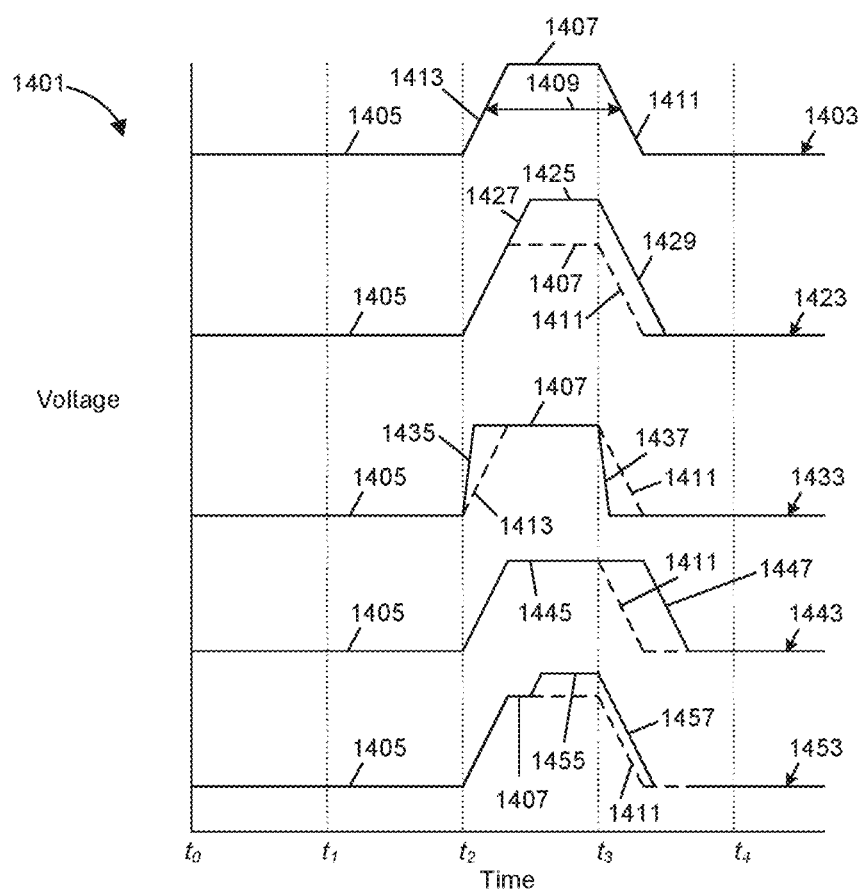
FIG. 14A shows a number of different ways of customizing or varying a nozzle firing waveform.
Figure 14B:
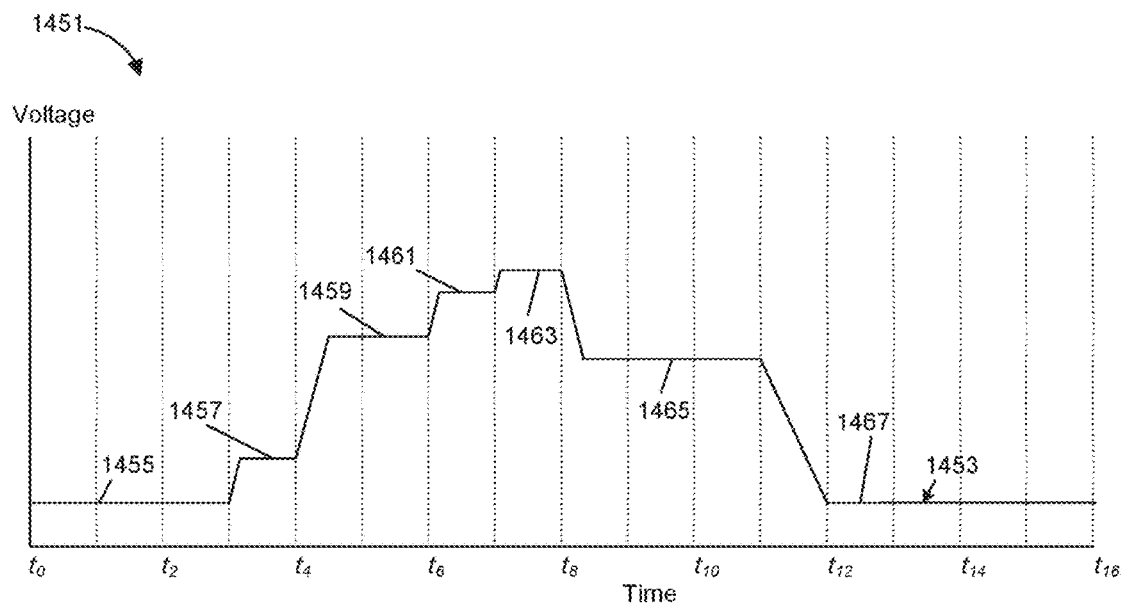
FIG. 14B shows a way of defining a waveform according to discrete waveform segments.

FIG. 14A is used to introduce nozzle drive waveform adjustment and the use of alternate nozzle drive waveforms to provide different ejected droplet volumes from each nozzle of a printhead. A first waveform 1403 is seen as a single pulse, consisting of a quiet interval 1405 (0 Volts), a rising slope 1413 associated with a decision to fire a nozzle at time $t_2$, a voltage pulse or signal level 1407, and a falling slope 1411 at time $t_3$. Effective pulse width, represented by numeral 1409, is of duration approximately equal to $t_3-t_2$, depending on differences between the rising and falling slopes of the pulse. In one embodiment, any of these parameters (e.g., rising slope, voltage, falling slope, pulse duration) can be varied to potentially change droplet volume ejection characteristics for a given nozzle. A second waveform 1423 is similar to the first waveform 1403, except it represents a larger driving voltage 1425 relative to the signal level 1407 of the first waveform 1403. Because of a larger pulse voltage and finite rising slope 1427, it takes longer to reach this higher voltage, and similarly, a falling slope 1429 typically lags relative to a similar slope 1411 from the first waveform. A third waveform 1433 is also similar to the first waveform 1403 except, in this case, a different rising slope 1435 and or a different falling slope 1437 can be used instead of slopes 1413 and 1411 (e.g., through adjustment of nozzle firing path impedances). The different slopes can be made either steeper or shallower (in the depicted case, steeper). With a fourth waveform 1443, by contrast, the pulse is made longer, for example using delay circuits (e.g., a voltage-controlled delay line) to increase both time of pulse at a given signal level (as denoted by numeral 1445) and to delay the falling edge of the pulse, as represented by numeral 1447. Finally, a fifth waveform 1453 represents the use of multiple, discrete signal levels as also providing a means of pulse shaping. For example, this waveform is seen to include time at the first-mentioned signal level 1407, but then a slope that rises to a second signal level 1455, applied halfway between times $t_3$ and $t_2$. Because of the larger voltage, a trailing edge of this waveform 1457 is seen to lag behind falling edge 1311.

Any of these techniques can be used in combination with any of the embodiments discussed herein. For example, drive waveform adjustment techniques can optionally be used to vary droplet volumes within a small range after scan motion and nozzle firing has already been planned, to mitigate line effect. The design of the waveform variation in a manner such that the second tolerance conforms to specification facilitates the deposition of high-quality layers with planned non-random or planned random variation. For example, returning to the hypothetical introduced earlier where a television maker specifies fill volumes of 50.00 pL±0.50%, per-region fill volumes can be calculated within a first range of 50.00 pL±0.25% (49.785 pL-50.125 pL), with non-random or random techniques applied to waveform variation where the variation statistically contributes no more than ±0.025 pl volume variation per droplet (given 5 droplets required to reach the aggregate fill volume). Alternatively or in addition, drive waveform variation can be used to influence velocity or trajectory (flight angle) of ejected droplet. For example, in one process, droplets are required to meet a predetermined set of criteria as to volume and/or velocity and/or trajectory; if a droplet falls outside of accepted norms, then a nozzle drive waveform can be adjusted until compliance is achieved. Alternatively, a set of predetermined waveforms can be measured, with a subset of these waveforms selected based on conformance to desired norms. Clearly, many variations exist.

As noted above, in one embodiment, represented by the fifth waveform 1453 from FIG. 14A, multiple signal levels can be used to shape a pulse. This technique is further discussed in reference to FIG. 14B.

That is, in one embodiment, waveforms can be predefined as a sequence of discrete signal levels, e.g., defined by digital data, with a drive waveform being generated by a digital-to-analog converter (DAC). Numeral 1451 in FIG. 14B refers to a waveform 1453 having discrete signal levels, 1455, 1457, 1459, 1461, 1463, 1465 and 1467. In this embodiment, each nozzle driver includes circuitry that receives and stores up to sixteen different signal waveforms, with each waveform being defined a series of up to sixteen signal levels, each expressed as a multi-bit voltage and a duration. That is to say, in such an embodiment, pulse width can effectively be varied by defining different durations for one or more signal levels, and drive voltage can be waveform-shaped in a manner chosen to provide subtle droplet size variation, e.g., with droplet volumes gauged to provide specific volume gradations increments such as in units of 0.10 pL. Thus, with such an embodiment, waveform shaping provides ability to tailor droplet volumes to be close to a target droplet volume value; when combined with other specific droplet volumes, such as using the techniques exemplified above, these techniques facilitate precise fill volumes per target region. In addition, however, these waveform shaping techniques also facilitate a strategy for reducing or eliminating line effect; for example, in one optional embodiment, droplets of specific volumes are combined, as discussed above, but the last droplet (or droplets) is selected in a manner that provides variation relative to the boundaries of the desired tolerance range. In another embodiment, predetermined waveforms can be applied with optional, further waveform shaping or timing applied as appropriate to adjust droplet volume, velocity and/or trajectory. In yet another example, the use of nozzle drive waveform alternatives provides a mechanism to plan volumes such that no further waveform shaping is necessary.

Typically, the effects of different drive waveforms and resultant droplet volumes are measured in advance. For each nozzle, up to sixteen different drive waveforms are then stored in a per-nozzle, 1 k synchronous random access memory (SRAM) for later, elective use in providing discrete volume variations, as selected by software. With the different drive waveforms on hand, each nozzle is then instructed droplet-by-droplet as to which waveform to apply via the programming of data that effectuates the specific drive waveform.

Figure 15A:
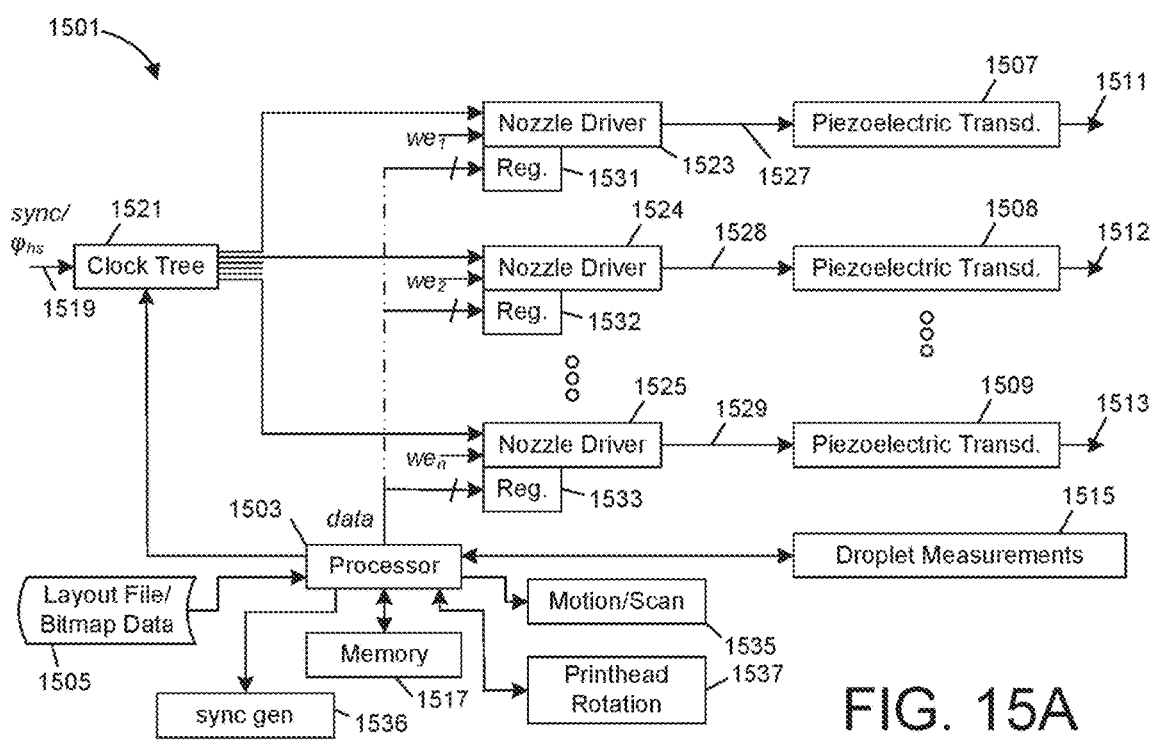
FIG. 15A shows an embodiment where different droplet volume combinations can be achieved using different combinations of predetermined nozzle firing waveforms.

FIG. 15A illustrates such an embodiment, generally designated by numeral 1501. In particular, a processor 1503 is used to receive data defining intended fill volumes per target region for a particular layer of material that is to be printed. As represented by numeral 1505, this data can be a layout file or bitmap file that defines droplet volumes per grid point or positional address. A series of piezoelectric transducers 1507, 1508 and 1509 generate associated ejected droplet volumes 1511, 1512 and 1513, that are respectively dependent on many factors, including nozzle drive waveform and print-head-to-print-head manufacturing variations. During a calibration operation, each one of a set of variables is tested for its effects on droplet volume, including nozzle-to-nozzle variation and the use of different drive waveforms, given the particular ink that will be used; if desired, this calibration operation can be made dynamic, for example, to respond to changes in temperature, nozzle clogging, or other parameters. This calibration is represented by a droplet measurement device 1515, which provides measured data to the processor 1503 for use in managing print planning and ensuing printing. In one embodiment, this measurement data is calculated during an operation that takes literally minutes, e.g., no more than thirty minutes for thousands of nozzles and preferably much less (e.g., for thousands of printhead nozzles and potentially dozens of possible nozzle firing waveforms). In another embodiment, as mentioned, such measurement can be performed iteratively, that is to update different subsets of nozzles at different points in time. A non-imaging (e.g., interferometric) technique can optionally be used as described earlier, potentially resulting in dozens of droplet measurements per nozzle, covering dozens to hundreds of nozzles per second. This data and any associated statistical models (and means) can be stored in memory 1517 for use in processing the layout or bitmap data 1505 when it is received. In one implementation, processor 1503 is part of a computer that is remote from the actual printer, whereas in a second implementation, processor 1503 is either integrated with a fabrication mechanism for products (e.g., a system for fabricating displays) or with a printer.

To perform the firing of droplets, a set of one or more timing or synchronization signals 1519 are received for use as references, and these are passed through a clock tree 1521 for distribution to each nozzle driver 1523, 1524 and 1525 to generate the drive waveform for the particular nozzle (1527, 1528 and 1529, respectively). Each nozzle driver has one or more registers 1531, 1532 and 1533, respectively, which receive multi-bit programming data and timing information from the processor 1503. Each nozzle driver and its associated registers receive one or more dedicated write enable signals (we$_n$) for purposes of programming the registers 1531, 1532 and 1533, respectively. In one embodiment, each of the registers comprises a fair amount of memory, including a 1 k SRAM to store multiple, predetermined waveforms, and programmable registers to select between those waveforms and otherwise control waveform generation. The data and timing information from the processor is depicted as multi-bit information, and although this information can be provided either via a serial or parallel bit connection to each nozzle (as will be seen in FIG. 15B, discussed below, in one embodiment, this connection is serial as opposed to the parallel signal representation seen in FIG. 15A).

For a given deposition, printhead or ink, the processor chooses for each nozzle a set of sixteen drive waveforms that can be electively applied to generate a droplet; note that this number is arbitrary, e.g., in one design, four waveforms could be used, while in another, four thousand could be used. These waveforms are advantageously selected to provide desired variation in output droplet volume for each nozzle, e.g., to cause each nozzle to have at least one waveform choice that produces a near-ideal droplet volume (e.g., a mean droplet volume of 10.00 pL) and to provide a range of deliberate volume variation for each nozzle. In various embodiments, the same set of sixteen drive waveforms are used for all of the nozzles, though in the depicted embodiment, sixteen, possibly-unique waveforms are each separate defined in advance for each nozzle, each waveform conferring respective droplet volume characteristics.

During printing, to control deposition of each droplet, data selecting one of the predefined waveforms is then programmed into each nozzle's respective registers 1531, 1532 or 1533 on a nozzle-by-nozzle basis. For example, given a target droplet volume of 10.00 pL, nozzle driver 1523 can be configured through writing of data into registers 1531 to set one of sixteen waveforms corresponding to one of sixteen different droplet volumes. The volume produced by each nozzle would have been measured by the droplet measurement device 1515, with nozzle-by-nozzle (and waveform-by-waveform) droplet volumes and associated distributions registered by the processor 1503 and stored in memory in aid of producing desired target fills. The processor can, by programming the register 1531, define whether or not it wants the specific nozzle driver 1523 to output a processor-selected one of the sixteen waveforms. In addition, the processor can program the register to have a per-nozzle delay or offset to the firing of the nozzle for a given scan line (e.g., to align each nozzle with a grid traversed by the printhead, to correct for error including velocity or trajectory error, and for other purposes); this offset is effectuated by counters which skew the particular nozzle (or firing waveform) by a programmable number of timing pulses for each scan. To provide an example, if the result of droplet measurement indicates that one particular droplet tends to have a lower than expected velocity, then corresponding nozzle waveform can be triggered earlier (e.g., advanced in time, by reducing a dead time before active signal levels used for piezoelectric actuation); conversely, if the result of droplet measurement indicates that the one particular droplet has a relatively high velocity, then the waveform can be triggered later, and so forth. Other examples are clearly possible—for example, a slow droplet velocity can be counteracted in some embodiments by increasing drive strength (i.e., signal levels and associated voltage used to drive a given nozzle's piezoelectric actuator). In one embodiment, a sync signal distributed to all nozzles occurs at a defined interval of time (e.g., one microsecond) for purposes of synchronization and in another embodiment, the sync signal is adjusted relative to printer motion and substrate geography, e.g., to fire every micron of incremental relative motion between printhead and substrate. The high speed clock ($\varphi_{hs}$) is run thousands of times faster than the sync signal, e.g., at 100 megahertz, 33 megahertz, etc.; in one embodiment, multiple different clocks or other timing signals (e.g., strobe signals) can be used in combination. The processor also programs values defining a grid spacing; in one implementation, the grid spacing is common to the entire pool of available nozzles, though this need not be the case for each implementation. For example, in some cases, a regular grid can be defined where every nozzle is to fire "every five microns." This grid can be unique to the printing system, the substrate, or both. Thus, in one optional embodiment, a grid can be defined for a particular printer with sync frequency or nozzle firing patterns used to effectively transform the grid to match a substrate geography that is a priori unknown. In another contemplated embodiment, a memory is shared across all nozzles that permits the processor to pre-store a number of different grid spacings (e.g., 16), shared across all nozzles, such that the processor can (on demand) select a new grid spacing which is then read out to all nozzles (e.g., to define an irregular grid). For example, in an implementation where nozzles are to fire for every color component well of an OLED (e.g. to deposit a non-color-specific layer), the three or more different grid spacings can be continuously applied in round robin fashion by the processor. Clearly, many design alternatives are possible. Note that the processor 1503 can also dynamically reprogram the register of each nozzle during operation, i.e., the sync pulse is applied as a trigger to launch any programmed waveform pulse set in its registers, and if new data is asynchronously received before the next sync pulse, then the new data will be applied with the next sync pulse. The processor 1503 also controls initiation and speed of scanning (1535) in addition to setting parameters for the sync pulse generation (1536). In addition, the processor controls rotation of the printhead (1537), for the various purposes described above. In this way, each nozzle can concurrently (or simultaneously) fire using any one of sixteen different waveforms for each nozzle at any time (i.e., with any "next" sync pulse), and the selected firing waveform can be switched with any other of the sixteen different waveforms dynamically, in between fires, during a single scan.

Figure 15B:
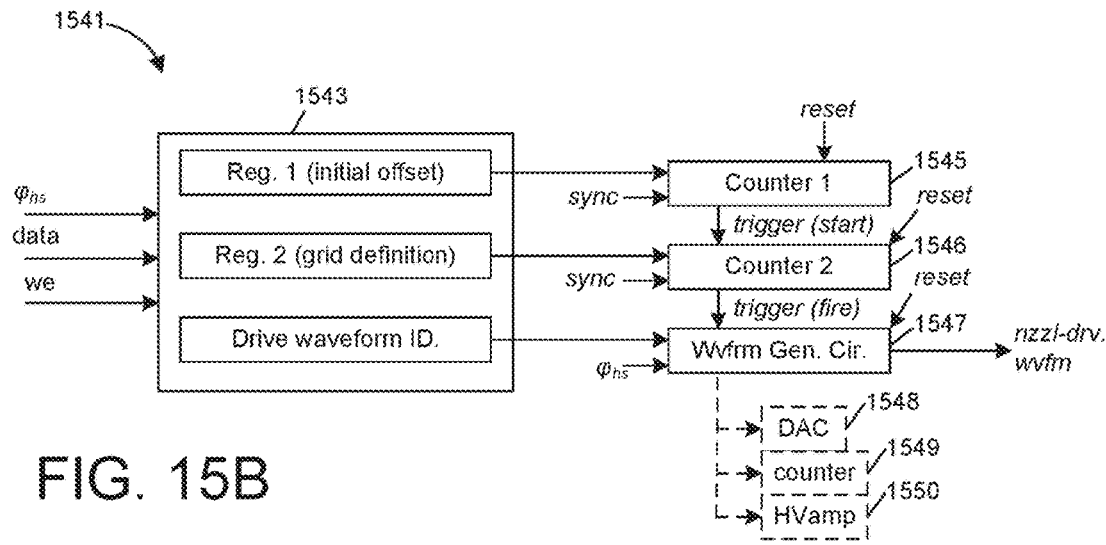
FIG. 15B shows circuitry associated with generating and applying a programmed waveform at a programmed time (or position) to a nozzle of a printhead; this circuitry provides one possible implementation of each of circuits 1523/1531, 1524/1532 and 1525/1533 from FIG. 15A, for example.

FIG. 15B shows additional detail of the circuitry (1541) used in such an embodiment to generate output nozzle drive waveforms for each nozzle; the output waveform is represented as "nzzl-drv.wvfm" in FIG. 15B. More specifically, the circuitry 1541 receives inputs of the sync signal, a single bit line carrying serial data ("data"), a dedicated write enable signal (we) and the high speed clock ($\varphi_{hs}$). A register file 1543 provides data for at least three registers, respectively conveying an initial offset, a grid definition value and a drive waveform ID. The initial offset is a programmable value that adjusts each nozzle to align with the start of a grid, as mentioned. For example, given implementation variables such as multiple printheads, multiple rows of nozzles, different printhead rotations, nozzle firing velocity and patterns and other factors, the initial offset can be used to align each nozzle's droplet pattern with the start of the grid, to account for delays and other factors. Offsets can be differently applied across multiple nozzles, for example, to rotate a grid or halftone pattern relative to substrate geography, or to correct for substrate misalignment. Similarly, as mentioned, offsets can also be used to correct for aberrant velocity or other effects. The grid definition value is a number that represents the number of sync pulses "counted" before the programmed waveform is triggered; in the case of an implementation that prints flat panel displays (e.g., OLED panels), the target regions to be printed in presumably have one or more regular spacings relative to the different printhead nozzles, corresponding to a regular (constant spacing) or irregular (multiple spacing) grid. As mentioned earlier, in one implementation, the processor keeps its own sixteen-entry SRAM to define up to sixteen different grid spacings that can be read out on demand to the register circuitry for all nozzles. Thus, if the grid spacing value was set to two (e.g., every two microns), then each nozzle would be fired at this interval. The drive waveform ID represents a selection of one of the pre-stored drive waveforms for each nozzle, and can be programmed and stored in many manners, depending on embodiment. In one embodiment, the drive waveform ID is a four bit selection value, and each nozzle has its own, dedicated 1 k-byte SRAM to store up to sixteen predetermined nozzle drive waveforms, stored as 16×16×4 B entries. Briefly, each of sixteen entries for each waveform contains four bytes representing a programmable signal level, with these four bytes representing a two-byte resolution voltage level and a two-byte programmable duration, used to count a number of pulses of the high-speed clock. Each programmable waveform can thus consist of (zero to one) discrete pulses to up to sixteen discrete pulses each of programmable voltage and duration (e.g., of duration equal to 1-255 pulses of a 33 megahertz clock).

Numerals 1545, 1546 and 1547 designate one embodiment of circuitry that shows how a specified waveform can be generated for a given nozzle. A first counter 1545 receives the sync pulse, to initiate a countdown of the initial offset, triggered by start of a new line scan; the first counter 1545 counts down in micron increments and, when zero is reached, a trigger signal is output from the first counter 1545 to a second counter 1546; this trigger signal essentially starts the firing process for each nozzle for each scan line. The second counter 1546 then implements a programmable grid spacing in increments of microns. The first counter 1545 is reset in conjunction with a new scan line, whereas the second counter 1546 is reset using the next edge of the high-speed clock following its output trigger. The second counter 1546, when triggered, and activates a waveform circuit generator 1547 which generates the selected drive waveform shape for the particular nozzle. As denoted by dashed line boxes 1548-1550, seen beneath the generator circuit, this latter circuit is based on a high speed digital-to-analog converter 1548, a counter 1549, and a high-voltage amplifier 1550, timed according to the high-speed clock ($\varphi_{hs}$). As the trigger from the second counter 1546 is received, the waveform generator circuit retrieves the number pairs (signal level and duration) represented by the drive waveform ID value and generates a given analog output voltage according to the signal level value, with the counter 1549 effective to hold DAC output for a duration according to the counter. The pertinent output voltage level is then applied to the high-voltage amplifier 1550 and is output as the nozzle-drive waveform. The next number pair is then latched out from registers 1543 to define the next signal level value/duration, and so forth.

The depicted circuitry provides an effective means of defining any desired waveform according to data provided by the processor 1503. If necessary to comply with grid geometry or to mitigate a nozzle with aberrant velocity or flight angle, the durations and/or voltage levels associated with any specific signal level (e.g., a first, "zero" signal level defining an offset relative to synch) can be adjusted. As noted, in one embodiment, the processor decides upon a set of waveforms in advance (e.g., 16 possible waveforms, per-nozzle) and it then writes definition for each of these selected waveforms into SRAM for each nozzle's driver circuitry, with a "firing-time" decision of programmable waveform then being effected by writing a four-bit drive waveform ID into each nozzles registers.

Figure 15C:
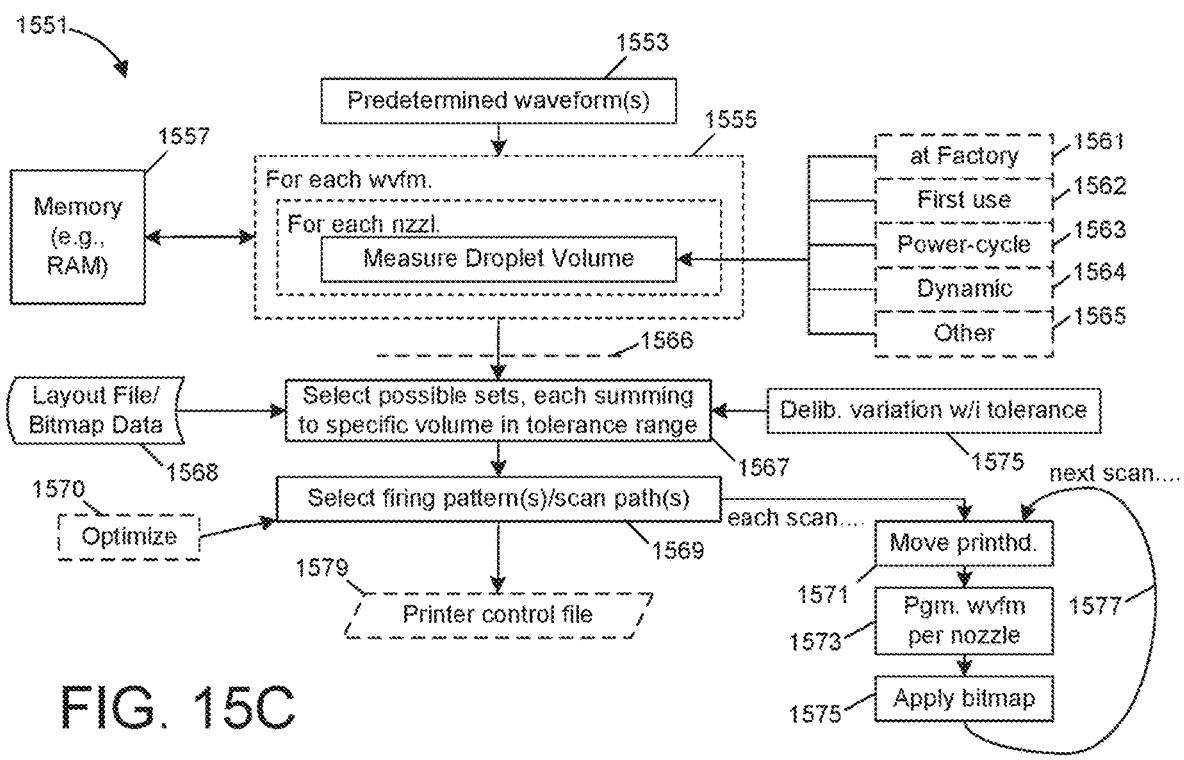
FIG. 15C shows a flow diagram of one embodiment that uses different nozzle firing waveforms.

FIG. 15C provides a flow chart 1551 that discusses methods of using different waveforms per nozzle and different configuration options. As denoted by 1553, a system (e.g., one or more processors acting under instruction from suitable software) selects a set of predetermined nozzle drive waveforms. For each waveform and for each nozzle (1555), droplet volume is specifically measured and a statistical model is built, e.g., using a laser measurement device or CCD camera for example. These volumes are stored in memory accessible to the processor, such as memory 1557. Again, measured parameters can vary depending on choice of ink and many other factors; therefore, calibration is performed depending on those factors and planned deposition activities. For example, in one embodiment 1561, calibration can be performed at the factory that manufactures the printhead or printer, and this data can be preprogrammed into a sold device (e.g., a printer) or made available for download. Alternatively, for printers that possess an optional droplet measurement device or system, these volume measurements can be performed at first use (1562), e.g., upon initial device configuration. In still another embodiment, the measurements are performed with each power or substrate cycle (1563), for example, each time the printer is turned "on" or is awakened from a low-power state or otherwise moved into a state in which it is ready for printing. As mentioned previously, for embodiments where ejected droplet volumes are affected by temperature or other dynamic factors, calibration can be performed on an intermittent or periodic basis (1564), for example, after expiration of a defined time interval, when an error is detected, at the state of each new substrate operation (e.g. during substrate loading and/or loading), every day, or on some other basis. Other calibration techniques and schedules can also be used (1565).

The calibration techniques can optionally be performed in an offline process, or during a calibration mode, as represented by process separation line 1566. As mentioned, in one embodiment, such a process is completed in less than thirty minutes, potentially for thousands of print nozzles and one or more associated nozzle firing waveforms. During an online operation (or during a printing mode), represented below this process separation line 1566, the measured droplet volumes are used in selecting sets of droplets per target region, based on specific, measured droplet volumes, such that droplet volumes for each set sum to a specific aggregate volume within a defined tolerance range, per 1567. The volumes per region can be selected based on a layout file, bitmap data, or some other representation, as represented by numeral 1568. Based on these droplet volumes and the permissible combinations of droplet volumes for each target region, a firing pattern and/or scan path is selected, in effect representing a particular combination of droplets (i.e., one of the acceptable sets of combinations) for each target region that will be used for the deposition process, as represented by numeral 1569. As part of this selection or planning process 1569, an optimization function 1570 can optionally be employed, for example, to reduce the number of scans or passes to fewer than the product of the average number of droplets per target region times the number of rows (or columns) of target regions (e.g., to less than what would be required for one row of nozzles, turned 90 degrees such that all nozzles in the row could be used in each scan for each affected target region, and depositing droplets in multiple passes for each row of target region, proceeding one row at a time). For each scan, the printhead can be moved, and per-nozzle waveform data can be programmed into the nozzle to effectuate droplet deposition instructions according to the bitmap or layout file; these functions are variously represented by numerals 1571, 1573 and 1575 in FIG. 15C. After each scan, the process is repeated for an ensuing scan, per numeral 1577. Optionally, these techniques and their implementation can be embodied in a printer control file 1579, developed for later or repeatable used in controlling the ejection of ink at specific times.

Note once again that several different implementations have been described above which are optional relative to one another. First, in one embodiment, drive waveform is not varied, but remains constant for each nozzle. Droplet volume combinations are produced, as necessary, by using a variable geometric step representing printhead/substrate offset to overlay different nozzles with different rows of target regions. Using measured per-nozzle droplet volumes, this process permits combination of specific droplet volumes means to achieve very specific fill volumes (e.g., to 0.01 pL resolution) per target region, with high confidence that any droplet volume variations can be accommodated within desired tolerances. This process can be planned such that multiple nozzles are used to deposit ink in different rows of target regions with each pass. In one embodiment, the print solution is optimized to produce the fewest scans possible and the fastest printing time possible. Second, in another embodiment, different drive waveforms can be used for each nozzle, again, using specifically measured droplet volumes. The print process controls these waveforms such that specific droplet volumes are aggregated in specific combinations. Once again, using measured per-nozzle droplet volumes, this process permits combination of specific droplet volume means to achieve very specific fill volumes (e.g., to 0.01 pL resolution) per target region. This process can be planned such that multiple nozzles are used to deposit ink in different rows of target regions with each pass. In both of these embodiments, a single row of nozzles can be used or multiple rows of nozzles can used, arranged as one or more printheads of a printhead assembly; for example, in one contemplated implementation, thirty printheads can be used, each printhead having a single row of nozzles, with each row having 256 nozzles. The printheads can be further organized into various different groupings; for example, these printheads can be organized into printhead assemblies each having five printheads that are mechanically mounted together, and these resulting six assemblies can be separately mounted into a printing system. In yet another embodiment, an aggregate printhead assembly is used which has having multiple rows of nozzles that can further be positionally offset from each other. This embodiment is similar to the first embodiment mentioned above, in that different droplet volumes can be combined using variable effective positional offsets or geometric steps. Once again, using measured per-nozzle droplet volumes, this process permits combination of specific droplet volume means to achieve very specific fill volumes (e.g., to 0.05 pL, or even to 0.01 pL resolution) per target region. This does not necessarily imply that measurements are free from statistical uncertainties, such as measurement error; in one embodiment, such error is small and is factored into target region fill planning. For example, if droplet volume measurement error is ±a %, then fill volume variation across target regions can be planned to within a tolerance range of a target fill ±(b-an$^{-1/2}$)%, where ±(b)% represents the specification tolerance range and n$^{1/2}$ represents the square root of the average number of droplets per target region or well. Perhaps otherwise stated, a range that is smaller than specification tolerance can be planned for, such that when expected measurement error is factored in, the resultant aggregate fill volumes for target region can be expected to fall within the specification tolerance range, e.g., as described above in connection with FIGS. 8A-8B. Naturally, the techniques described herein can be optionally combined with other statistical processes.

Droplet deposition can optionally be planned such that multiple nozzles are used to deposit ink in different rows of target regions with each pass, with the print solution optionally being optimized to produce the fewest scans possible and the fastest printing time possible. As mentioned earlier, any combination of these techniques with each other and/or with other techniques can also be employed. For example, in one specifically-contemplated scenario, variable geometric stepping is used with per-nozzle drive waveform variation and per-nozzle, per-drive-waveform volume measurements to achieve very specific volume combinations, planned per target region. For example, in another specifically-contemplated scenario, fixed geometric stepping is used with per-nozzle drive waveform variation and per-nozzle, per-drive-waveform volume measurements to achieve very specific volume combinations, planned per target region.

By maximizing the number of nozzles that can be concurrently used during each scan and by planning droplet volume combinations such that they necessarily meet specification, these embodiments promise high-quality displays; by also reducing printing time, these embodiments help promote ultra-low per-unit printing costs, and thus lower the price point to end consumers.

Figure 15D:
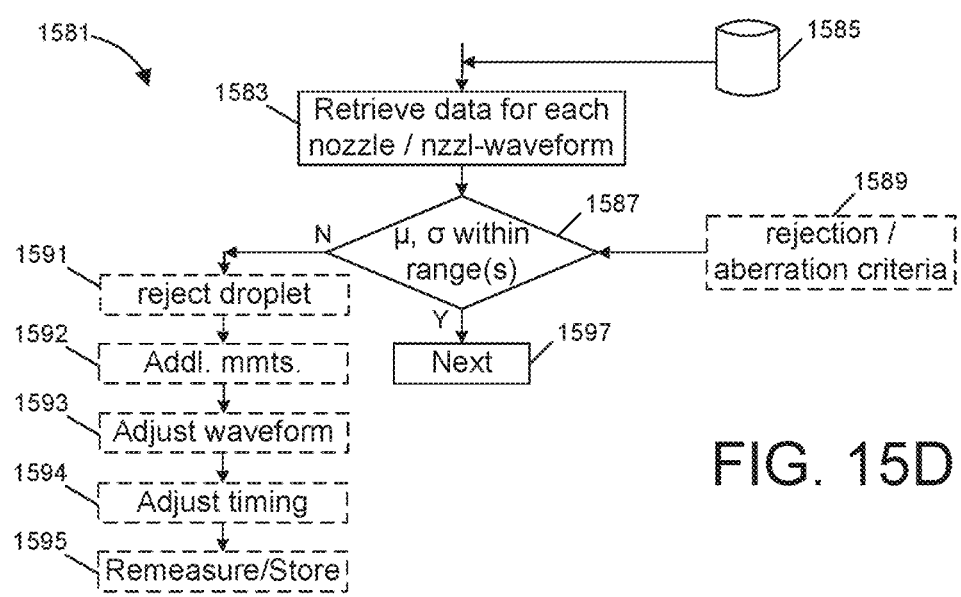
FIG. 15D shows a flow diagram associated with nozzle or nozzle-waveform qualification.

FIG. 15D provides a flow diagram relating to nozzle qualification. In one embodiment, droplet measurement is performed to yield statistical models (e.g., distribution and mean) for each nozzle and for each waveform applied to any given nozzle, for any of and/or each of droplet volume, velocity and trajectory. Thus, for example, if there are two choices of waveforms for each of a dozen nozzles, there are up to 24 waveform-nozzle combinations or pairings; in one embodiment, measurements for each parameter (e.g. volume) are taken for each nozzle or waveform-nozzle pairing sufficient to develop a robust statistical model. Note that despite planning, it is conceptually possible that a given nozzle or nozzle-waveform pairing may yield an exceptionally wide distribution, or a mean which is sufficiently aberrant that it should be specially treated. Such special treatment applied in one embodiment is represented conceptually by FIG. 15D.

More particularly, a general method is denoted using reference numeral 1581. Data generated by the droplet measurement device is stored in memory 1585 for later use. During the application of method 1581, this data is recalled from memory and data for each nozzle or nozzle-waveform pairing is extracted and individually processed (1583). In one embodiment, as mentioned, a normal random distribution is built for each variable to be qualified, as described by a mean, standard deviation and number of droplets measured (n), or using equivalent measures. Note again that other distribution formats (e.g., Student's-T, Poisson, etc.), can be used. Measured parameters are compared to one or more ranges (1587) to determine whether the pertinent droplet can be used in practice. In one embodiment, at least one range is applied to disqualify droplets from use (e.g., if the droplet has a sufficiently large or small volume relative to desired target, then that nozzle or nozzle-waveform pairing can be excluded from short-term use). To provide an example, if 10.00 pL droplets are desired, then a nozzle or nozzle-waveform linked to a droplet mean more than, e.g., 1.5% away from this target (e.g., <9.85 pL or >10.15 pL) can be excluded from use. Range, standard deviation, variance, or another spread measure can also or instead be used. For example, if it is desired to have droplet statistical models with a narrow distribution (e.g., 3σ<1.005% of mean), then droplets with measurements not meeting this criteria can be excluded. It is also possible to use a sophisticated/complex set of criteria which considers multiple factors. For example, an aberrant mean combined with a very narrow spread might be okay, e.g., if spread (e.g., 3σ) away from measured (e.g., aberrant) mean μ is within 1.005%, then an associated droplet can be used. For example, if it is desired to use droplets with 3σ volume within 10.00 pL±0.1 pL, then a nozzle-waveform pairing producing a 9.96 pL mean with ±0.8 pL 3σ value might be excluded, but a nozzle-waveform pairing producing a 9.93 pL mean with ±0.3 pL 3σ value might be acceptable. Clearly many possibilities are possible according to any desired rejection/aberration criteria (1589). Note that this same type of processing can be applied for per-droplet flight angle and velocity, i.e., it is expected that flight angle and velocity per nozzle-waveform pairing will exhibit statistical distribution and, depending on measurements and statistical models derived from the droplet measurement device, some droplets can be excluded. For example, a droplet having a mean velocity or flight trajectory that is outside of 5% of normal, or a variance in velocity outside of a specific target could hypothetically be excluded from use. Different ranges and/or evaluation criteria can be applied to each droplet parameter measured and provided by storage 1585.

Note that depending on the rejection/aberration criteria 1589, droplets (and nozzle-waveform combinations) can be processed and/or treated in different manners. For example, a particular droplet not meeting a desired norm can be rejected (1591), as mentioned. Alternatively, it is possible to selectively perform additional measurements for the next measurement iteration of the particular nozzle-waveform pairing; as an example, if a statistical distribution is too wide, it is possible to specially perform additional measurements for the particular nozzle-waveform pairing so as to improve tightness of a statistical distribution through additional measurement (e.g., variance and standard deviation are dependent on the number of measured data points). Per numeral 1593, it is also possible to adjust a nozzle drive waveform, for example, to use a higher or lower voltage level (e.g., to provide greater or lesser velocity or more consistent flight angle), or to reshape a waveform so as to produce an adjusted nozzle-waveform pairing that meets specified norms. Per numeral 1594, timing of the waveform can also be adjusted (e.g., to compensate for aberrant mean velocity associated with a particular nozzle-waveform pairing). As an example (alluded to earlier), a slow droplet can be fired at an earlier time relative to other nozzles, and a fast droplet can be fired later in time to compensate for faster flight time. Many such alternatives are possible. Finally, per numeral 1595, any adjusted parameters (e.g., firing time, waveform voltage level or shape) can be stored and optionally, if desired, the adjusted parameters can be applied to remeasure one or more associated droplets. After each nozzle-waveform pairing (modified or otherwise) is qualified (passed or rejected), the method then proceeds to the next nozzle-waveform pairing, per numeral 1597.

As should be appreciated, the nozzle drive structure just described provides flexibility in printing droplets of different sizes. The use of precision fill volumes per target region, droplet volumes, droplet velocities and droplet trajectories enable the use of advanced techniques that vary fill volumes and plan for nozzle/waveform and/or droplet use according to defined criteria (within specification). This provides for further quality improvements relative to conventional methods.

FIGS. 16-18B will now be used to provide further detail on two contemplated droplet measurement devices (or systems), namely, predicated on shadowgraphy and interferometry, respectively. FIGS. 16-17 will be used to illustrate one embodiment of a printer having a droplet measurement system, whereas FIGS. 18A and 18B will be used to discuss shadowgraphy and interferometry, respectively.

As noted earlier, the present teachings disclose various embodiments of an industrial inkjet thin film printing system that includes a drop measurement apparatus integrated into the printing system. Various embodiments of an inkjet thin film printing system of the present teachings can utilize imaging techniques, such as shadowgraphy, or non-imaging techniques such as phase Doppler analysis (PDA) (a technique based on interferometry), which can provide a significant advantage for the rapid measurement of a plurality of nozzles of an inkjet printhead, where various embodiments of a printhead assembly used in a thin film inkjet printing system according to the present teachings can have a plurality of printheads. Such rapid measurement can be performed in situ at any time during a printing process and can provide data that can include the volume, velocity and trajectory for each drop from each nozzle of each printhead. The collective data obtained from a drop measurement apparatus integrated into an inkjet thin-film printing system can be utilized to provide uniformity of ink volume delivered to each of millions of pixels on an OLED panel display. Other techniques can also be used to provide relatively rapid measurement of individual droplet parameters, including without limitation pulse displacement measurement techniques, planar Doppler velocimetry, flow field visualization with a charge coupled device, laser Doppler velocimetry, interferometric laser imaging droplet sizing and/or interferometric particle imaging, laser Doppler anemometry, phase Doppler anemometry, or other processes. In some embodiments, these techniques are "imaging" techniques, such that a photograph (or other form of image) is taken of a measurement area; in other embodiments, non-imaging optical techniques are used, e.g., where optical sensors are used to detect an interference pattern based on incident light without generating an image (such as of a droplet's shape). Other techniques can also be used. In the embodiments discussed herein, discussion will focus on use of interferometry-based and shadowgraphy-based techniques (as non-imaging and imaging techniques, respectively), but any suitable droplet measurement technique can be used to measure droplet velocity, volume, flight trajectory, or another desired parameter.

When depositing a film in the manufacture of an OLED panel, it is often desirable to deposit film material having uniform thickness across the panel because the thickness of the deposited film material often impacts panel performance, and good display uniformity is an important attribute of a good OLED panel. When using an inkjet printing method to deposit the film, drops of ink are ejected from the printing apparatus onto the panel substrate, and the thickness of the deposited film in each area of the panel is typically related to the volume of ink dispensed over that area of the panel, which is further related to the volume and placement of drops onto a panel surface. It is therefore often desirable to dispense volumes of ink uniformly, both in terms of the volume and position of the dispensed drops, across an OLED panel display.

As noted earlier, an inkjet printing system can typically have at least one printhead that has multiple inkjet nozzles, each nozzle capable of dispensing drops of ink onto the panel surface. Typically, there is variation across the multiple nozzles of a printhead with respect to the volume, trajectory, and velocity of the drops dispensed. Such variations can arise from a variety of sources, including, but not limited to, variations in nozzle working conditions, variations in intrinsic nozzle actuator behavior including age of a piezoelectric nozzle driver, variations in ink, and variations in intrinsic nozzle size and shape. The impact of such variations can result in non-uniformity in the volume loading across the panel. For example, variations in drop volume can lead directly to variations in the deposited volume, whereas variations in the drop velocity and trajectory can indirectly lead to variations the deposited volume of an ink by causing variation in the placement of the drops on an OLED panel surface. In theory, these variations can be avoided by using only a single nozzle when printing, but printing with a single nozzle is too slow to be practical in real world manufacturing applications. In light of such variations in the ink drops dispensed from different nozzles, and the practical necessity of using multiple nozzles to get reasonable processing speed when using inkjet printing for manufacturing applications, it is desirable to have methods and associated apparatuses to provide for dispensing of uniform volumes of ink across an OLED panel area in spite of such nozzle-to-nozzle drop variations.

A measurement apparatus integrated into a thin film inkjet printing system according to the present teachings can be used to provide the actual measurements of volume, velocity and trajectory for each nozzle of an inkjet printhead at any time during or intermittent to runs of a printing process. Such measurement can provide for mitigation of nozzle-to-nozzle drop variations so as to achieve a more uniform deposition of film material using the inkjet method. In some embodiments, such measurement can be used to tune printhead performance by adjusting the drive waveforms to each of the individual nozzles so as to directly reduce the nozzle-to-nozzle drop variation. In some embodiments, such measurement can be used as an input to a print pattern optimization system that can reduce nozzle-to-nozzle variation by adjusting nozzle selection for drop deposition so as to average out nozzle-to-nozzle drop variation in the deposited film. Various embodiments of a measurement apparatus integrated into a thin film inkjet printing system of the present teaching can utilize various imaging techniques, such as shadowgraphy, or non-imaging techniques, such as POA. POA in particular can provide a significant advantage of rapidly analyzing a plurality of nozzles of an inkjet printhead, especially useful for systems having many nozzles and/or printheads.

In this regard, an inkjet thin film printing system according to various embodiments of the present teachings can be comprised of several devices and apparatuses, which allow the reliable placement of ink drops onto specific locations on a substrate. These devices and apparatuses can include by way of non-limiting example a printhead assembly, ink delivery system, motion system, substrate support apparatus, such as a floatation table or chuck, substrate loading and unloading system, a printhead maintenance system and a printhead measurement apparatus. Additionally, an inkjet thin film printing system can be mounted on a stable support assembly that can include, for example, a granite or metal base. A printhead assembly can consist of at least one inkjet printhead, with at least one orifice capable of ejecting drops of ink at a controlled rate; such ejected drops being further characterized by their volume, velocity, and trajectory.

As printing requires relative motion between the printhead assembly and the substrate, a printing system can include a motion system, such as a gantry or split axis XYZ system. Either the printhead assembly can move over a stationary substrate (gantry style), or both of the printhead and substrate can move, for example, in a split axis configuration. In another embodiment, the print station can be fixed, and the substrate can move in the X and Y axes relative to the printheads, with Z axis motion provided either at the substrate or the printhead. As the printheads move relative to the substrate, drops of ink are ejected at the correct time to be deposited in the desired location on the substrate. The substrate is inserted and removed from the printer using a substrate loading and unloading system. Depending on the printer configuration, this can be accomplished with a mechanical conveyor, a substrate floatation table, or a robot with end effector. A printhead measurement and maintenance system can be comprised of several subsystems that allow for measurements such as drop volume verification, drop volume, velocity, and trajectory measurements, as well as printhead maintenance procedures, such as wiping of the inkjet nozzle surface, priming for ejecting ink into a waste basin. Given the variety of components that can comprise an inkjet thin film printing system, various embodiments of an inkjet thin film printing system according to various embodiments of the present teachings can have a variety of footprints and form factors.

As a non-limiting example, FIG. 16 depicts an inkjet thin film printing system according to various embodiments, which can be used for printing a substrate such as, for example, but not limited by, an OLED panel. In FIG. 16, inkjet thin film printing system 1600 utilizes a split-axis motion system. The inkjet thin film printing system 1600 can be mounted on printing system support assembly 1610, which can include a pan 1612 carried by a support frame 1614. A base 1616 is mounted above the pan, where the base can be optionally constructed from granite or metal. The inkjet thin film printing system can include a motion system 1620, for example, a split axis motion system as indicated.

The motion system 1620 is seen to include a bridge 1622 which supports an X-axis carriage 1624, which in turn mounts a Z-axis mounting plate 1626. The Z-axis mount plate in turn supports a printhead mounting and clamping assembly 1628, used to mount an interchangeable printhead assembly 1640. For the split-axis motion system 1620, a Y-axis track 1623 can be mounted upon the base 1616, so as to provide support for a Y-axis carriage 1625, which in turn carries a substrate support assembly 1630; these various components provide for Y-axis travel of a substrate mounted on substrate support assembly 1630. As shown in FIG.16, for various embodiments of a thin film printing system, the substrate support assembly 1630 can be a chuck. A substrate support assembly can be provided by a floatation table, for example, as described in detail in U.S. Pat. No. 8,383,202, which is incorporated herein by reference. The inkjet thin film printing system 1600 can utilize a system assembly that supports one or more modular inkjet printhead assemblies, such as the various printhead assemblies shown mounted in a tool carousel 1645. Providing for selective interchange of various printhead assemblies can provide an end user with flexibility for the efficient sequential printing of a variety of inks of various formulations on a substrate during a print process, such as during the printing of an OLED panel substrate. Note that this is not required for all embodiments, i.e., other embodiments can feature a single printhead assembly that is not changed in between different printing processes. For example, one contemplated embodiment features an assembly line of multiple printers, each performing a respective print process (for example, using respective inks); techniques described herein can be applied to each such printer.

A printhead assembly can include a fluidic system having an ink reservoir in fluid communication with at least one inkjet printhead for delivering, for example, OLED film-forming material onto substrates. In that regard, as shown in FIG. 16, a printhead assembly 1640 can include at least one printhead 1642. In various embodiments, a printhead assembly can optionally include fluidic and electronic connections to each printhead. Each printhead, in turn, can have a plurality of nozzles or orifices capable of ejecting ink droplets at a controlled rate, with a measurable droplet volume, velocity and trajectory. Various embodiments of printhead assembly 1640 can have between about 1 to about 30 printheads per printhead assembly. A printhead 1642 can have between about 16 to about 2048 nozzles, each of which can expel a drop volume of between about 0.10 pL to about 200.00 pL.

Measuring the performance of each nozzle of a given printhead can include checking for nozzle firing, as well as measuring drop volume, velocity and trajectory. As previously mentioned, having such measurement data can provide for either tuning a head before printing to provide for more uniform performance for each nozzle, or for using the measurement data to provide for printing algorithms that can compensate for the difference during printing, or combinations of such approaches. Clearly, having reliable and up to date sets of measurement data can provide for a variety of approaches that can use the measurement data to compensate for nozzle-to-nozzle drop volume variations and permit planned printing processes that combine droplets of different volumes (from the same nozzle using different drive waveforms or from respective nozzles). As noted earlier, measurement data is advantageously collected to develop a population of measurements representing a distribution for each nozzle, such that an expectation of mean droplet volume, trajectory and velocity can be developed and used in print planning, with a well-formed understanding of expected variation for each such droplet parameter.

In this regard, the depicted inkjet thin film printing system can include a droplet measurement device or system 1650, which can be mounted on a support 1655. It is contemplated that various embodiments of the droplet measurement system 1650 can be based on imaging or non-imaging techniques as mentioned, for example, a shadowgraphy- or interferometry-based method. Embodiments which utilize non-imaging PDA techniques can provide a significant advantage of rapidly analyzing between about 16 to about 2048 nozzles of each printhead, such as printhead 1642 (e.g., which is approximately 50 times more rapid than typical imaging techniques). Recalling that a printhead assembly can include, e.g., thirty printheads (i.e., with the printing system using more than 10,000 nozzles), this permits rapid, in situ, dynamic measurement within a printer of all nozzles (and all alternate drive waveforms if pertinent to the embodiment), with droplet re-calibration every 2-24 hours, or more frequently. Moreover, various embodiments of systems and methods according to the present teachings can utilize a PDA measurement device integrated into a gas enclosure assembly and system that can house a printing apparatus. Such systems and methods utilizing a PDA measurement device integrated into a gas enclosure assembly and system housing a printing apparatus can provide for rapid in situ measurement of a plurality of nozzles in a printhead. This is especially useful for ensuring uniform deposition volumes over a large substrate, for example, having one or more OLED devices, and reducing any Mura effects. As will be discussed further below, note that the droplet measurement system includes at least one measurement device for optically measuring droplet parameters; a second imaging device can be used to obtain more accurate measurements or differential measurement (for example, to compute nozzle position or droplet velocity or flight trajectory), or for purposes of precisely aligning the droplet measurement system, such that each time it is moved to the maintenance bay, system software can precisely locate any individual nozzle to a nearest-micron resolution. This will be discussed further below.

Numeral 1617 is used to designate an area of the ink jet printing apparatus associated with the droplet measurement system 1650. This region is illustrated in enlarged detail in FIG. 17.

As shown in FIG. 17, a printhead assembly 1740 can be held during printing by a printhead mounting and clamping assembly 1728, itself carried once again by a Z-axis mount 1726 of a motion system. In this regard, the motion system is used to position the printhead assembly 1740 for measurement proximate to droplet measurement system 1750, e.g., in a service area or service station. As noted earlier, the droplet measurement system 1750 can be designed for selective engagement and disengagement while the printhead assembly 1740 is in this position. With a large printhead assembly (e.g., having thousands or nozzles), such a structure permits a droplet measurement system to perform tests while the printhead assembly 1740 is "parked," with other tests being concurrently performed by other test or calibration equipment or processes (not shown). For example, a printhead nozzle can be purged, cleaned, or otherwise managed, with the use of concurrent processes applied to help minimize any downtime of the overall ink jet printing system; this helps maximize manufacturing productivity. As noted earlier (and as explained below relative to FIG. 19), droplet measurement (and other servicing) can be performed while substrates are being transported, dried, cured, loaded or unloaded, further minimizing any system downtime by stacking droplet measurement against other, unavoidable tasks associated with the printing/manufacturing operation. Each nozzle of a printhead 1742 of the printhead assembly 1740 can be adjusted to a measurement area 1756 for measurement of drops ejected from each nozzle using droplet measurement system 1750. Note that in this embodiment, individual printheads 1742 can be moved relative to other printheads for analysis, but once again, this is not required for all embodiments. For example, it is also possible to have each printhead statically mounted during measurement, with the droplet measurement system advanced to each printhead location and each nozzle location within a given printhead; as noted earlier, this permits concurrent processing or "stacking" of multiple servicing operations while the printhead assembly is parked. It is also possible to use multiple droplet measurement systems to independently measure different nozzles, for example, of different, spatially-separated printheads.

For purposes of illustration, it should be assumed that the droplet measurement system is a PDA apparatus (i.e., an interferometry-based device), having a light source such as a laser source and light transmission optics a beam splitter and a transmission lens. Additionally, such a PDA apparatus can also have receiving optics including a receiving lens and a plurality of photodetectors. For example, a first optical side 1752 of droplet measurement system 1750 can source one or more light beams for measurement, and focus light on a measurement area 1756, as indicated by the hatched lines, while a second optical side 1754 can pass measurement light which has been scattered from a droplet in the measurement area 1756 to receiving optics and one or more light detectors.

The droplet measurement system 1750 can be interfaced to a computer or computing device (not shown), either directly or remotely. Such a computing device can be configured to receive signals representing measured droplet volume, velocity and trajectory for each droplet produced by a nozzle (or nozzle-waveform combination) from each printhead 1742 of the printhead assembly 1740. Once again, multiple measurements of many droplets from each nozzle/nozzle-waveform pairing are advantageously performed, in order to develop statistical populations representing the various producible droplets.

As noted earlier in connection with FIGS. 11 and 12, various embodiments of a printing system can be housed in a gas enclosure providing an inert, low-particle environment, with droplet measurement preferably occurring in such an environment. In one embodiment, droplet measurement is performed in a common atmosphere used for printing, e.g., in the same general (enclosed) chamber. In a second embodiment, a separate, fluidically isolated chamber is used for measurement, for example, as part of a service station area.

FIG. 18A shows a layout of a droplet measurement system 1801 specifically configured to use shadowgraphy techniques. In particular, a printhead 1803 is seen at a position where it will jet a droplet 1805 into a spittoon (not shown in FIG. 18A). During flight of the droplet 1805, the droplet traverses a measurement area where the droplet is illuminated by a light source; in FIG. 18A, the light source is seen to consist of a strobe light 1807 and optional light source optics 1809, employed for example to direct light from the strobe light 1807 to the measurement area (e.g., from below the measurement plane as exemplified earlier in connection with FIGS. 2A-E or FIGS. 16-17). The optics direct the light to illuminate a relatively large area, represented by focusing or redirection paths 1811, to expose the droplet repeatedly in rapid success at different positions for capture in a single image frame; FIG. 18A therefore shows three different positions of the same droplet, representing different flashes of the strobe, which are collectively imaged together. Thus, for example, an image frame under analysis will show what appears to be multiple droplets at different positions (i.e., per multiple instances of numeral 1805), but these are in reality the same droplet at different positions along a flight trajectory. A second set of optics 1813 provide for light collection and focus, such that a captured image clearly depicts both droplet contour and a variable amount of shadow representing droplet diameter, used by image processing software to compute droplet volume. As should be appreciated, by imaging the same droplet during its flight at multiple positions, the droplet measurement system can use one image from to compute droplet volume, velocity and trajectory;

shadow parameters are used to calculate droplet mass, and thus volume, and relative positions of the droplet are used to calculate both velocity and trajectory. For example, a droplet that increases in apparent diameter at a "lower position" within the captured image frame is traveling toward light receiving optics 1813, and conversely one that decreases in diameter is traveling away. The light receiving optics 1813, in turn, convey captured light to a camera 1815, for example, a high-resolution CCD camera that images droplet contours and shadows as depicted by graphic 1817. The droplet measurement system optionally provides control over zoom/focus (1819) and/or XY position (1821) of the receiving optics, all under the control of a governing computer system 1823 (and instructions stored on non-transitory machine readable media used by one or more processors of the computer system for such control). In one embodiment, as mentioned, the receiving optics and light source are mounted to a common chassis and transported together, providing for a fixed focal path, but this need not be the case for each embodiment. The depicted system captures the travel of each droplet in a few microseconds, while image processing application software 1825 run by the computer system 1823 then calculates droplet parameters. As an example, the computer can provide for display and visualization (1827) of the droplet and/or measured parameters and can calculated values for the various parameters, such as volume, velocity and trajectory (1829, 1831 and 1833), or other parameters. Note that the computer system 1823 can be part of the ink jet printing system, or it can also be remote (for example, connected by a local area network "LAN" or wide area network "WAN," e.g., the Internet, to collect data on a remote basis); similarly, display and visualization 1827 can also be provided at a location remote from the computer system 1823, also via a LAN or WAN. As indicated by numeral 1835, the computer system 1823 compiles the measured parameters to form a statistical population of measurements for a given nozzle that produced the droplet (and for a given nozzle-waveform pairing if alternate drive waveforms are used by the particular embodiment of the printing system). The computer system 1823 optionally stores the individual measurements themselves and/or a statistical summary (e.g., mean and standard deviation or variance in case of a Normal Distribution, and comparable metrics if other distribution types are supported) in a database 1837. With sufficiently robust populations measured, the database can then be applied in planning and/or optimization of the printing process as described above, e.g., using specific combinations of droplet means to obtain composite fills per target region, where the composite fills can be based on different droplet volumes (e.g., from different nozzles and/or drive waveforms).

FIG. 18B shows a layout of a droplet measurement system 1851 specifically configured to use PDA (interferometry) techniques. A printhead is illustrated in position for measurement, as referenced by numeral 1853. The printhead will jet droplets from a specific nozzle (e.g., using a specific drive waveform) downward into a droplet measurement area, as indicated by numeral 1855. As with prior embodiments, the droplet measurement system can be optionally designed for three dimensional transport relative to a parked printhead, such that the droplet measurement area is effectively "brought to" the particular nozzle's droplet flight path. A light source, in this case a laser 1857, generates a beam of light 1859, which is directed to become incident on a beam splitter 1861. The beam splitter produces two or more light beams 1863 and 1864 (only two are illustrated in FIG. 18B), which light optics 1865 then redirects in a convergent manner, i.e., such that the beams intersect as represented by numerals 1866 and 1867 at a position incident with an in-flight droplet. Note that the light optics 1865 optionally provides for the laser 1857 to be mounted below the measurement plane (see the discussion of FIGS. 20 and 2E, above), and optionally redirects the light path 1859 or 1863/1864 so as to arrive at the measurement area (e.g., by redirecting one or more of the light paths around the periphery of a spittoon). Note that numeral 1869 is used to represent the general, continued dimension of the illumination optics (such as light paths 1866 and 1867). As noted earlier, with an interferometry-based technique, a diffraction pattern is captured from a direction angle offset to this continued dimension 1869, as represented by angle measure 1873. This angular deviation is typically ninety degrees, but other directions of capture can also be used. Accordingly, measurement light 1871 is received at this angular deviation from incident light by a second set of optics 1875 (labeled "Optics 2"), and redirected for below deposition-plane-measurement by non-imaging detectors 1877. These detectors produce data representing a diffraction pattern, as illustrated by graphic 1879; as should be appreciated (e.g., by contrasting this graphic 1879 with graphic 1817 from FIG. 18A), the spacing of lines in the diffraction pattern provides a measure of droplet volume, with this spacing much more rapidly processed to measure droplet volume than with the imaging technique represented by FIG. 18A. Note that, while FIG. 18B illustrates the use of one light source 1857 and two incident beams 1866 and 1867, other embodiments use more than one light source and more than two incident beams, e.g., to capture droplet velocity, trajectory and other parameters. As with the embodiment of FIG. 18A, in FIG. 18B, a computer (1881) optionally provides for zoom/focus (1883) and XY transport of the measurement optics, runs suitable application software (1887) to compute various droplet parameters, and provides for display and visualization (1889). Just as before, these various elements can be integrated with a printer or manufacturing device, or can be dispersed across a WAN or LAN, controlled by multiple, separated processors of respective computers or servers. As before, measured parameters can include droplet volume (1891), velocity (1893) and trajectory (1895), with data representing statistical populations (1897) stored in a database (1899) for purposes of scan planning. This scan planning can once again combine droplet parameters from different nozzles and/or waveforms to perform precise fills of target regions which are deliberately based on multiple, different droplet volumes.

It was earlier mentioned that droplet parameters can change over time, for example, according to system parameters, ambient conditions or ink characteristics. An industrial printing system therefore advantageously updates droplet measurement, not just of a single droplet, but of a statistical population for each droplet (and of an expected mean volume/velocity and trajectory of each droplet) on a relatively frequent basis; this helps ensure precise droplet data that is always accurate and up to date, permitting planned droplet combinations that reliably conform to maximum tolerances for composite ink fills. It has been found that droplet parameters in practice change somewhat slowly, for example, with detectable variation every 2 to 12 hours. The use of an in situ droplet measurement makes it possible to repeatedly perform dynamic measurement and construction of new statistical populations of measured parameters within this time range; note that with conventional techniques, it may take many hours to measure a large scale printhead or printhead assembly; through the use of fast techniques, such as PDA as discussed above, it becomes possible to update all statistical measurements on a very rapid basis, e.g., with 30 minutes lead time or less, even where thousands of print nozzles are involved. Systems which utilize some or all of the techniques discussed above therefore facilitate and enable industrial printers having recalibrated droplet measurement parameters based on statistical distributions within the mentioned 2-to-12 hour time frame, and therefore facilitate more accurate printing within maximum tolerances for target region fill variation.

As noted earlier, in one contemplated embodiment, the printer is intermittently or continuously controlled to perform droplet parameter measurement any time the printer is not actively printing. This helps maximize uptime of a manufacturing line. As mentioned, in one embodiment, any time a printhead assembly of the printer is not in use, that printhead assembly can be diverted for droplet parameter measurement. For example, any time a substrate is being loaded or unloaded, advanced between chambers, or dried, cured or otherwise processed, a print carriage can transport the printhead assembly to a service station for droplet measurement and/or other servicing operations. Such operation helps further provide for frequent, dynamic update of droplet statistical populations for each nozzle, as just described; optionally employed with a PDA-based droplet measurement device (e.g., interferometry-based techniques), such a control scheme can render the droplet measurement task transparent to any desired printing operation. Note that in a contemplated system, this control is implemented by control software, running on at least one processor, that manages the printing process; note further that this software can be resident on a printer, one or more computers or servers, or both.

FIG. 19 shows one example 1901 of flow for such a control process. As mentioned, this process can be optionally implemented by instructions stored on non-transitory machine-readable media that, when executed, cause at least one processor to perform/provide the depicted processes.

FIG. 19 is split into three general regions 1903, 1905 and 1907, respectively representing startup and offline initialization processes, online printing, and offline special operations. As a system is powered-on, the system is typically subjected to an initialization process 1909 where new measurements are taken for each nozzle to develop statistical populations, as has been described above. At the same time, a calibration process (not shown) can also be called upon to select multiple nozzle firing waveforms for each nozzle (e.g., using an iterative process as previously described to select 16 waveforms that produce droplet volumes within ±10.0% of a target droplet volume). Statistical populations are thus developed for each such waveform and/or nozzle which include a mean droplet volume as well as desired spread. As noted previously, in one embodiment, a fixed number of measurements are performed for each droplet, whereas in another embodiment, the number can vary from nozzle-to-nozzle (or per nozzle-waveform pairing) to achieve a sufficiently tight statistical spread; also, in one embodiment, a validation or qualification process can be optionally applied where nozzles (or nozzle-waveform pairings) not producing droplets having desired parameters can be disqualified from use in print planning. The measurements and/or statistical measures are then stored (1911) for each nozzle and for each nozzle-waveform pairing, as applicable. Note that this startup calibration can be performed the very first time the system is turned on (e.g. on a one time basis), and in other embodiments, it is performed every time the system is powered-up anew. For example, it can be advantageous (if a production line is only run during a portion of each day) to store previously computed droplet parameters (and then to update these parameters, according to the process discussed below). Alternative, new parameters can be computed anew with each power cycle.

The system also optionally receives parameters defining the print process and substrate parameters (1913) and automatically plans droplet combination and scan processes as previously described (1915). In other contemplated implementations, e.g., where the printer is part of an assembly line for a specific OLED display product, these parameters and planning may be invariant. However, if droplet parameters can change, then so to can print planning, and process 1915 is therefore optionally re-performed any time statistical parameters change, e.g., as an automated background process each time a droplet measurement system is engaged (as indicated by numeral 1917).

With system print parameters and means for droplet parameters available (i.e., for each nozzle or nozzle-waveform pairing), the system may then enter an online mode in which it performs printing as desired, per numeral 1919. That is, a substrate can be loaded or transported into the printer, and printing of one or more OLED device thin film layers can then be performed as desired. However, to minimize device downtime, each time printing is stopped (e.g., to load or unload a substrate), the various printhead nozzles are subjected to renewed droplet measurement to update statistical droplet populations on an intermittent or periodic basis. For example, it is expected that a typical print process for a large HDTV substrate (representing several large size TV screens) can be completed in about 90 seconds, with the completed substrate then being unloaded or advanced to another chamber (1920) during a process that takes, e.g., 15-30 seconds. During this 15-30 second intermission, the printer is not being used to print and, accordingly, droplet measurements can be performed during this time. For example, control software for the printer controls a substrate transport mechanism to move an old substrate out from outside the reach of a print head carriage, and simultaneously, the control software moves the print head assembly to a service station for droplet measurement and/or other servicing functions. As soon as the printhead assembly is parked (1921), the control software selectively engages the droplet measurement system per numeral 1923 to perform droplet measurement. As noted earlier, measurement can develop statistical populations for droplets produced by different nozzles or different nozzle-waveform pairings. To supplement any previously stored measurements, the droplet measurement system is operated in a loop where it takes as many droplet measurements as possible until the next substrate is loaded or it is otherwise time for printing to recommence. For example, per function blocks 1925, 1927, 1929 and 1931, the droplet measurement system (1) measures multiple droplets for a given nozzle or nozzle/waveform pairing, (2) stores or updates results in memory (i.e., either storing the new, additional measurement data as raw data or storing updated means or statistical summaries, or both), (3) identifies a nozzle address (or nozzle-waveform identifier for an ensuing measurement cycle) and (4) then proceeds as appropriate to another nozzle or nozzle-waveform pairing for another set of measurements. The process of loading/unloading a substrate can potentially take a variable amount of time and, therefore, when the system is ready for a new printing cycle, control software issues an interrupt or function call (1933) to disengage service operations (1935) as appropriate (e.g., including the droplet measurement system) and return the printhead assembly to active printing (1919). As mentioned, control software also transparently updates or recomputes droplet combinations which might no longer be valid due to updates in per-nozzle droplet means. Note that because the droplet measurement loop stores an address or location for an ensuing measurement cycle (1930), the system effectively performs droplet measurement for a small window of nozzles/droplets, precessing on a circular basis through the thousands of different nozzles/nozzle-waveform pairings available for use in producing droplets. Printing is then performed until the next substrate iteration is completed, at which time that substrate is unloaded and the measurement/servicing cycle continues. By stacking droplet measurement as described behind other printer operations, these techniques help substantially reduce any system downtime, once again, maximizing manufacturing throughput. Note that while the depicted method engages the droplet measurement system with every load cycle, this need not be the case for all embodiments, i.e., it may be desired to update droplet measurements at a specific rate (e.g., every 8 hours) and thus, if droplet statistical populations are built more quickly using the mentioned stacking operations, it may be desired to instead run different servicing operations during substrate loads and/or transport and/or curing operations. FIG. 19 also shows a special maintenance box 1937, associated with special ad-hoc actions, for example the need to change a printhead, or another offline process. Finally, as noted earlier, nearly any type of print head maintenance or other nozzle-based analysis can be performed as part of an "online" process, e.g., in between successive substrates in a manufacturing line. Per-nozzle and/or per-drive waveform droplet parameter measurement is provided as one example only.

Figure 20:
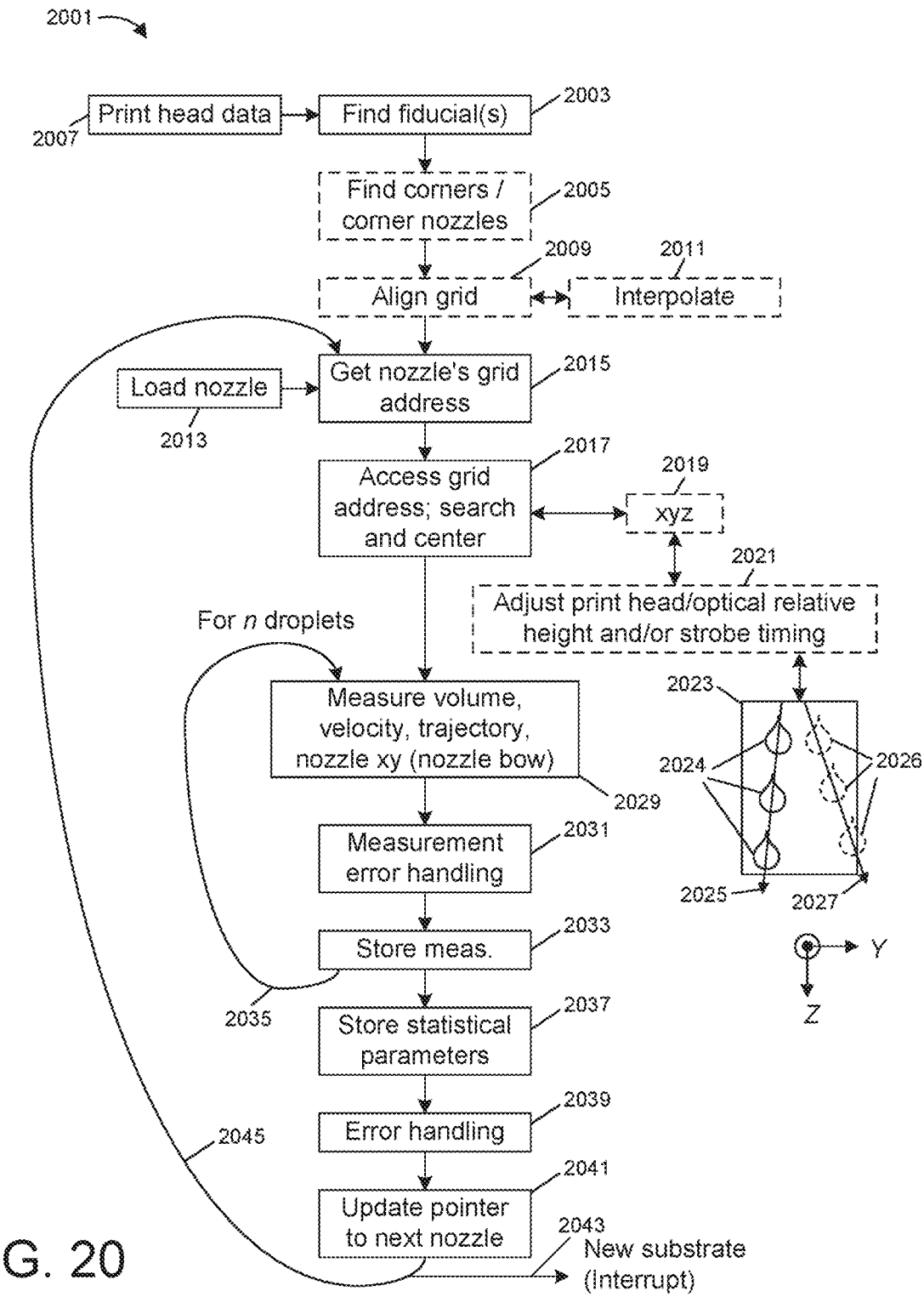
FIG. 20 shows another, more detailed flow diagram, associated with another embodiment of droplet measurement.

FIG. 20 illustrates another embodiment of a method of droplet measurement, generally represented by numeral 2001. When a printhead is mounted or it is otherwise desired to calibrate the droplet measurement system to correct for positional offset, a calibration routine can be run in order to precisely match droplet measurements with a given printhead nozzle. In a typical embodiment, this alignment process is performed with the aid of an "upward facing camera" or other imaging device that takes an image of a printhead from beneath, that is, looking upward from the perspective of a substrate at the nozzle plate to identify one or more fiducials or alignment marks (2003). As noted before, in one embodiment, the camera (imaging system) can be the same device as used for droplet measurement, but it can also be a separate imaging device. For an exemplary printhead having, e.g., 1024 nozzles arranged in four rows of 256 nozzles, the fiducials are used to determine offset, rotation and skew between the nozzle plate and a grid system corresponding to the imaging device. Note that in one embodiment, the fiducials can optionally be specific nozzles (2005), for example, the nozzles closest to the corners of the printhead (e.g., first and fourth rows, nozzles 1 and 256); other mechanisms can also be used. In a typical implementation, printhead configuration data (2007) is loaded into the system by software and used to identify these corner nozzles and used to map address of all nozzles to the imaging system's grid 2009, with interpolation relied upon to initially estimate position of each nozzle (2011). To provide an example, in one embodiment, system software is designed to accommodate different printheads with different nozzle configurations, and to this effect, the system software loads the printhead configuration data to identify number of rows, presence of fiducials (if any), number of nozzles per-row, average vertical and horizontal offset between rows and columns of nozzles, and so forth. This data enables the system software to estimate the position of each nozzle on the printhead, as mentioned. In one contemplated system, this calibration process is performed once a printhead is changed, but not in between print processes; in a different embodiment, this calibration process is performed each time the droplet measurement system is initialized, e.g., with each new measurement run in between two print operations.

It was earlier-mentioned that nozzle (and nozzle-waveform) measurement can be performed on a rolling basis, precessing through a range of nozzles with each break in between substrate print operations. Whether engaged to measure all nozzles anew, or on such a rolling basis, the same basic process of FIG. 20 can be employed for measurement. To this effect, per numerals 2013 and 2015, when the droplet measurement device is engaged for a new measurement (either on the heels of prior measurement or a substrate print operation), the system software loads a pointer which identifies the next nozzle for which measurements are to be taken (e.g., for a second printhead, "nozzle 2,312"). In the case of initial measurement (e.g., responsive to installation of a new printhead, or a recent boot-up, or a periodic process such as a daily measurement process), the pointer would point to a first nozzle for a printhead, e.g., "nozzle 2,001." This nozzle either is associated with a specific imaging grid access or one is looked-up from memory. The system uses the provided address to advance the droplet measurement system (e.g., the spittoon and measurement area referenced earlier) to a position corresponding to the expected nozzle position. Note that in a typical system, the mechanical throws associated with this movement are quite precise, i.e., to approximately micron resolution. The system optionally at this time searches for nozzle position about the expected micron-resolution position, and finds the nozzle and centers on its position (2017) based on image analysis of the printhead within a small micron-distance from the estimated grid position. For example, a zig-zag, spiral or other search pattern can be used to search about the expected position for a nozzle. A typical pitch distance between nozzles might be on the order of 250 microns, whereas nozzle diameter might be on the order of 10-20 microns. Once the nozzle of interest is identified, the software fires a droplet from the nozzle in question and relies on the droplet measurement system to confirm that the nozzle in-question did indeed fire (which then confirms the nozzle's identity). FIG. 20 shows this process as being performed every time a new nozzle is identified for measurement (e.g., every time the droplet measurement system moves), but it is also possible in some embodiments to perform this measurement once (e.g,. in situations where the droplet measurement system grid is very tight) during an off-line configuration, to store the grid position for each nozzle, and then to update this position only when the printhead is changed or in response to error processing. In systems where the mechanics of the droplet measurement system and/or printhead position are not very precise, it can be advantageous to use an estimate and search function for each nozzle anytime there is a change in the nozzle under scrutiny. Note that as implied by numeral 2019, in one embodiment, the estimate and search function aligns the droplet measurement device (and its associated optics) in each of three dimensions (xyz) with the printhead nozzle under scrutiny.

The precise z position of each nozzle (distance relative to droplet measurement area) is then adjusted (2021) in order to ensure consistent droplet measurement and/or image capture. For example, it was mentioned earlier that a droplet measurement system typically determines droplet velocity and flight trajectory by measuring each droplet multiple times, and calculating these parameters based on distance (e.g., relative to a centroid of each droplet image). Various parameters can affect proper droplet measurement, including error in strobe timing (e.g., for a shadowgraphy-based droplet measurement system), uncorrected offset between the droplet imaging system and the nozzle plate, nozzle process corners and other factors. In one embodiment, a variety of statistical processes are used to compensate for such errors, for example, in a manner that normalizes strobe firing relative to droplet measurement locations across all droplets; for example, if a hypothetical printhead has 1,000 nozzles, then the system can normalize z-axis offset from the printhead plate by picking an average offset which produces a minimum of positional error while centering a desired number of droplets (on average across the 1,000 nozzles or subsets thereof) in the measurement area, in terms of average droplet image position. Analogous techniques can be applied to an interferometry-based system or to other droplet measurement systems.

FIG. 20 shows a droplet measurement area 2023 and a hypothetical passage of two droplets 2024 and 2026 through that measurement area, along respective hypothetical trajectories 2025 and 2027. Several things should be noted about the example provided by this FIG. First, velocity and trajectory measurement is seen to be dependent on measuring the same droplet multiple times (three each in the case of droplets 2024 and 2026). This requirement can be used to properly position the measurement area relative to the strobe (or imaging source) firing, by one or more of changing the timing of the strobe (or light source), changing the drive waveform used to launch the associated droplets, changing z-axis position of the droplet measurement system, and/or changing z-axis position of the printhead. For example, if three droplet images are expected for a single droplet as the strobe is repeatedly fired (during a single exposure, in the case of a shadowgraphy-based system), but only two are observed, the measurement area is misaligned in height, and is adjusted to effectively redefine where droplet positions are captured relative to the measurement area until three representations of a droplet are obtained. Naturally, this hypothetical provides an example only and other implementations might measure more than 3 strobed droplet representations or less than three. Note also deviation in trajectory 2025 relative to trajectory 2027 might be due to statistical variation in the way the droplets are produced, and so can be optionally used to build a statistical model representing mean droplet trajectory (in terms of alpha and beta angle) and standard deviation in each of these dimensions. As should be appreciated, while droplet measurement areas 2023 shows a two-dimensional droplet depiction (e.g., a yz plane as per the drawing page), trajectory angle relative to the x axis can be derived from changes in apparent droplet size or focus in a given image frame amongst the multiple strobed droplet representations, indicating that droplet is getting nearer or farther away from the plane of the drawing sheet represented by FIG. 20; analogous interference pattern changes are applied in the case of interferometry-based techniques.

The scheme represented within measurement 2023 can also be used to measure nozzle bow. That is, as an example, if it is assumed that droplets 2024 and 2026 originate from a common exact nozzle position, but the reverse trajectory does not align with the expected y-axis center of the droplet measurement area (i.e., from the left-to-right relative to the drawing page) that the nozzle in question could be offset in its y-axis position relative to other nozzles in the same row or column. As implied by the discussion earlier, such aberration can lead to idealized droplet firing deviations that can be taken into account in planning precise combinations of droplets, i.e., preferably, any such "bow" or individual nozzle offset is stored and used as part of print scan planning, as discussed earlier, with the printing system using the differences of each individual nozzle in a planned manner rather than averaging out those differences. In an optional variation, the same technique can be used to determine non-regular nozzle spacing along the x-axis, although for the depicted embodiment, any such error is subsumed in correction for droplet velocity deviations (e.g., any such spacing error can be corrected for by adjustments to nozzle velocity or per nozzle firing delays). To determine y-axis bow of a nozzle producing droplets 2024 and 2026, the respective trajectories 2025 and 2027 are effectively reverse plotted (or otherwise mathematically applied) with other measurement trajectories for the same nozzle and used to identify a mean y-axis position of the specific nozzle under scrutiny. This position may be offset from an expected location for such a nozzle, which could be evidence of nozzle bow.

As stated before and as implied by this discussion, one embodiment builds a statistical distribution for each nozzle for each parameter being measured, for example, for volume, velocity, trajectory, nozzle bow, and potentially other parameters (2029). As part of these statistical processes, individual measurements can be thrown out or used to identify errors. To cite a few examples, if a droplet measurement is obtained having a value that is so far removed from other measurements of the same nozzle that the measurement could represent a firing error; in one implementation, the system discards this measurement if deviant to a point that exceeds a statistical error parameter. If no droplet is seen at all, this could be evidence that the droplet measurement system is at the wrong nozzle (wrong position), or has a firing waveform error or that a nozzle under scrutiny is inoperative. Measurement handling process 2031 is employed to make appropriate adjustments including taking any new or additional measurements as necessary. Per numeral 2033, each measurement is advantageously stored and used to build the pertinent statistical distributions, with the system then looping to perform measurement for additional droplets from the same nozzle until sufficient robustness to measurement error is obtained. This loop (2035) is seen in FIG. 20 to indicate that this (inner) loop is performed until n droplets are obtained for each nozzle or each nozzle-waveform pairing. When a sufficiently robust distribution has been obtained, the system calculates (stores) the desired statistical parameter(s) (e.g., mean, standard distribution for each measure parameter) for the given nozzle (2037) and executes any appropriate error handling process 2039 (such as validating the nozzle just measured or deeming it or an associated waveform inoperative) and then moves on to the next firing waveform or next nozzle (2041), as appropriate. That is, with a measurement distribution for a given nozzle or nozzle-waveform pairing having been completed, the system software updates an address pointer to the next nozzle to be measured (2041) and then returns per numeral 2045 to move the droplet measurement system and to perform the next measurement, as appropriate. Alternatively, per numeral 2043, if time is up, and the system is being called upon to print another substrate as part of a manufacturing line, the system updates any scanning operations based on newly procured data (if any), stores the "next" nozzle's address, and returns to substrate printing (2043). In one embodiment, after such a printing operation is complete, during a prospective break (or maintenance downtime), the system retrieves the stored nozzle address and particulars of droplet measurement and continues where it left off.

Note that, although not separately called out by FIG. 20, the depicted measurement process would typically be performed for each alternate waveform available for use with each nozzle. For example, if each nozzle had four different piezoelectric drive waveforms that could be selected, the inner process loop 2035 of FIG. 20 would generally be repeated 4*n times; if a particular implementation called for the building of a statistical distribution based on 24 droplets for each waveform, then there might be 96 such measurements for one nozzle (24 for each of four waveforms, with each measurement being used to develop statistical mean and spread measures for each of droplet velocity, trajectory and volume, and for estimated nozzle position (e.g., for purposes of assessing nozzle bow).

Through the use of precision mechanical systems and droplet measurement system alignment techniques, the disclosed methodology permits very high accuracy measurement of individual nozzle characteristics, including mean droplet metrics for each of the mentioned parameters (e.g., volume, velocity, trajectory, nozzle position, and other parameters).

As should be appreciated, the mentioned techniques facilitate a high degree of uniformity in manufacturing processes, especially OLED device manufacture processes, and therefore enhanced reliability. These techniques in some embodiments are at least partially facilitated using droplet measurement techniques that enable precision droplet combinations and Mura suppression through the use of dissimilar nozzle combinations and droplet volume combinations. In addition, by providing for control efficiencies, particularly as to speed of droplet measurement and the stacking of such measurement against other system processes in a manner calculated to reduce overall system downtime, the teachings presented above help provide for a faster, less expensive manufacturing process designed to provide both flexibility and precision in the fabrication process.

While many embodiments described above feature planning of print processes based on combinations of droplets from respective nozzles of a print head or print head assembly, this need not be used for all embodiments; as one non-limiting example, for an embodiment that makes different (alternate) drive waveforms available for use by print head nozzles, droplet combinations used to achieve precise fills can be based on the use of multiple droplets from a single nozzle, where those droplets represent the use of different waveforms, each calibrated in advance, and each associated (for example) with a specific mean droplet volume. Thus, one alternate embodiment provides a method of producing a thin film in target regions of a substrate using an ink jet printer having a print head with nozzles, where the nozzles are to eject respective droplets of ink, the ink carrying a material that will form a permanent part of the desired thin film. A droplet measurement device is used measure multiple droplets from each one of the nozzles of the print head, for each one of a set of preplanned drive waveforms available for use by the specific nozzle. A processor is used to generate printer control data, dependent on a statistical parameter for each drive waveform for each nozzle; based on the available data, some drive waveforms are used, some nozzles are used, and some aren't. The printer control data is of a nature that it can be used by a downstream process (or optionally, a printer) to control printing in a manner that utilizes combinations of droplets created using different waveforms, where the combinations selected dependent on the statistical parameters. Naturally, as with the other embodiment described herein, contemplated implementations also include software operable to perform the described method, an apparatus having related components, or a printer, OLED fabrication system or other machine having related components. These examples are intended to be non-limiting rather than exhaustive.

The foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement.

As indicated, various modifications and changes may be made to the embodiments presented herein without departing from the broader spirit and scope of the disclosure. For example, features or aspects of any of the embodiments may be applied, at least where practical, in combination with any other of the embodiments or in place of counterpart features or aspects thereof. Thus, for example, not all features are shown in each and every drawing and, for example, a feature or technique shown in accordance with the embodiment of one drawing should be assumed to be optionally employable as an element of, or in combination of, features of any other drawing or embodiment, even if not specifically called out in the specification. Accordingly, the specification and drawings are to be regarded in an illustrative rather than a restrictive sense.

What is claimed is:

1. A method of processing a substrate, the method comprising:
   moving a print head of an inkjet printer from a printing region to a region adjacent to a droplet measurement area;
   controlling an atmosphere of the printing region and the droplet measurement area;
   at the droplet measurement area, obtaining a measurement of a characteristic of a droplet of a liquid ejected from a nozzle of the print head during droplet flight by illuminating the droplet with a beam of light and detecting a change in the light;
   adding the measurement to a population of measurements of the characteristic;
   computing a statistic of the population; and
   printing liquid from the nozzle onto the substrate in dependence on the statistic.

2. The method of claim 1, further comprising positioning the beam of light relative to the print head in at least two independent dimensions while the print head is stationary.

3. The method of claim 1, wherein the detecting a change in the light comprises imaging the droplet.

4. The method of claim 1, wherein the detecting a change in the light comprises obtaining an interference pattern of the light.

5. The method of claim 1, wherein the printing region and the droplet measurement area are in the same controlled atmosphere.

6. The method of claim 1, wherein a measurement of the characteristic for the nozzle is obtained for a plurality of waveforms used to eject droplets from the nozzle.

7. The method of claim 6, further comprising illuminating the droplet a plurality of times and obtaining a measurement of the characteristic for each illumination of the droplet.

8. The method of claim 7, further comprising positioning the beam of light relative to the print head in at least two independent dimensions while the print head is stationary.

9. The method of claim 1, wherein the characteristic is volume, velocity, or trajectory.

10. The method of claim 1, further comprising comparing the measurement to the population and detecting malfunction of the nozzle based on the comparison.

11. A method of processing a substrate, the method comprising:
    moving a print head of an inkjet printer from a printing region to a region adjacent to a droplet measurement area;
    controlling an atmosphere of the printing region and the droplet measurement area;
    at the droplet measurement area, obtaining a measurement of a characteristic of a droplet of a liquid ejected from a nozzle of the print head during droplet flight by illuminating the droplet with a beam of light and detecting a change in the light;
    comparing the measurement to a population of measurements of the characteristic;
    determining whether the nozzle is functioning normally based on the comparison;
    upon determining that the nozzle is functioning normally, adding the measurement to a population of measurements of the characteristic;
    computing a statistic of the population; and
    printing liquid from the nozzle onto the substrate in dependence on the statistic.

12. The method of claim 11, wherein the detecting a change in the light comprises imaging the droplet or obtaining an interference pattern of the light.

13. The method of claim 12, wherein the printing region and the droplet measurement area are in the same controlled atmosphere.

14. The method of claim 13, wherein a measurement of the characteristic for the nozzle is obtained for a plurality of waveforms used to eject droplets from the nozzle.

15. The method of claim 14, further comprising illuminating the droplet a plurality of times and obtaining a measurement of the characteristic for each illumination of the droplet.

16. The method of claim 15, further comprising positioning the beam of light relative to the print head in at least two independent dimensions while the print head is stationary.

17. The method of claim 16, wherein the characteristic is volume, velocity, or trajectory.

18. The method of claim 17, wherein one or more measurements of statistics of the population are stored in a digital storage at the time the measurements are obtained or the statistics computed, and the statistic is retrieved from the digital storage at the time a print plan is made.

19. A method of processing a substrate, the method comprising:
    moving a print head of an inkjet printer within a controlled atmosphere from a printing region to a region adjacent to a droplet measurement area;
    at the droplet measurement area, obtaining a measurement of a characteristic of a droplet of a liquid ejected from a nozzle of the print head during droplet flight by illuminating the droplet using a strobed beam of light and detecting a change in the light;
    comparing the measurement to a population of measurements of the characteristic;
    determining whether the nozzle is functioning normally based on the comparison;
    upon determining that the nozzle is functioning normally, adding the measurement to a population of measurements of the characteristic;
    computing a statistic of the population; and
    printing liquid from the nozzle onto the substrate in dependence on the statistic.

20. The method of claim 19, further comprising positioning the beam of light relative to the print head in at least two independent dimensions while the print head is stationary.

* * * * *